US009830983B1

(12) United States Patent
Hara et al.

(10) Patent No.: US 9,830,983 B1
(45) Date of Patent: Nov. 28, 2017

(54) MEMORY SYSTEM AND WRITING METHOD

(71) Applicant: TOSHIBA MEMORY CORPORATION, Tokyo (JP)

(72) Inventors: Tokumasa Hara, Kawasaki Kanagawa (JP); Noboru Shibata, Kawasaki Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/437,371

(22) Filed: Feb. 20, 2017

(30) Foreign Application Priority Data

Jun. 30, 2016 (JP) ................................ 2016-131025

(51) Int. Cl.

*G11C 11/34* (2006.01)
*G11C 11/56* (2006.01)
*G11C 16/10* (2006.01)
*G11C 16/26* (2006.01)

(52) U.S. Cl.

CPC .......... *G11C 11/5628* (2013.01); *G11C 16/10* (2013.01); *G11C 16/26* (2013.01)

(58) Field of Classification Search

CPC ......... G11C 16/10; G11C 16/30; G11C 16/12; G11C 16/26; G11C 16/3418
USPC ....................................... 365/185.15, 185.24
See application file for complete search history.

(56) References Cited

U.S. PATENT DOCUMENTS 7,352,628 B2 * 4/2008 Kamei ................ G11C 11/5628 365/185.03
8,054,684 B2 11/2011 Gorobets et al.
8,385,117 B2 2/2013 Sakurada et al.
9,230,664 B2 1/2016 Hara et al.
9,269,445 B1 2/2016 Abe et al.
2012/0230104 A1 * 9/2012 Kim .................... G11C 11/5642 365/185.03
2015/0269992 A1 9/2015 Hara et al.

* cited by examiner

*Primary Examiner* — Son Dinh

(74) *Attorney, Agent, or Firm* — Patterson & Sheridan, LLP

(57) ABSTRACT

A nonvolatile memory device includes memory cells, bit lines, a word line, and a control unit performing a write operation in first and second stages. During the first stage, the control unit applies voltages to the word line and the bit lines based on first page of data to maintain threshold voltages for a first group of memory cells and shift the threshold voltages for a second group of memory cells above a first threshold. During the second stage, the control unit applies voltages to the word line and the bit lines based on second and third pages of data to shift the threshold voltages of memory cells in the first group to threshold voltages in one of first, second, and third threshold voltage ranges and the threshold voltages of memory cells in the second group to threshold voltages in one of fourth, fifth, sixth, and seventh threshold voltage ranges.

20 Claims, 46 Drawing Sheets

| Page | DATA | | | | | | | |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

FIG. 8A

| WL NUMBER | PROGRAM STAGES | |
|---|---|---|
| | 1st | 2nd |
| 0 | $ST_1$1 | $ST_1$3 |
| 1 | $ST_1$2 | $ST_1$5 |
| 2 | $ST_1$4 | $ST_1$7 |
| 3 | $ST_1$6 | $ST_1$9 |
| 4 | $ST_1$8 | ⋮ |

FIG. 8B

| WL NUMBER | String0 | | String1 | | String2 | | String3 | |
|---|---|---|---|---|---|---|---|---|
| | 1st | 2nd | 1st | 2nd | 1st | 2nd | 1st | 2nd |
| 0 | $ST_2$1 | $ST_2$6 | $ST_2$2 | $ST_2$8 | $ST_2$3 | $ST_2$10 | $ST_2$4 | $ST_2$12 |
| 1 | $ST_2$5 | $ST_2$14 | $ST_2$7 | $ST_2$16 | $ST_2$9 | $ST_2$18 | $ST_2$11 | $ST_2$20 |
| 2 | $ST_2$13 | $ST_2$22 | $ST_2$15 | $ST_2$24 | $ST_2$17 | $ST_2$26 | $ST_2$19 | $ST_2$28 |
| 3 | $ST_2$21 | $ST_2$30 | $ST_2$23 | $ST_2$32 | $ST_2$25 | $ST_2$34 | $ST_2$27 | $ST_2$36 |
| 4 | | | | | | | | |

FIG. 8C

| WL NUMBER | String0 | | String1 | | String2 | | String3 | |
|---|---|---|---|---|---|---|---|---|
| | 1st | 2nd | 1st | 2nd | 1st | 2nd | 1st | 2nd |
| 0 | $ST_3$1 | $ST_3$9 | $ST_3$2 | $ST_3$10 | $ST_3$3 | $ST_3$11 | $ST_3$4 | $ST_3$12 |
| 1 | $ST_3$5 | $ST_3$17 | $ST_3$6 | $ST_3$18 | $ST_3$7 | $ST_3$19 | $ST_3$8 | $ST_3$20 |
| 2 | $ST_3$13 | | $ST_3$14 | | $ST_3$15 | | $ST_3$16 | |
| 3 | | | | | | | | |
| 4 | | | | | | | | |

FIG. 9E

| READ | DATA | | | | | | | | | | | | |
|---|---|---|---|---|---|---|---|---|---|---|---|---|---|
| 1ST | ○ | ○ | ○ | ○ | × | ○ | ○ | ~ | ○ | ○ | × | ○ | ○ |
| 2ND | ○ | × | ○ | ○ | ○ | × | ○ | ~ | ○ | × | ○ | ○ | ○ |
| 3RD | ○ | ○ | ○ | ○ | ○ | × | ○ | ~ | ○ | ○ | ○ | × | ○ |
| MAJORITY DECISION | ○ | ○ | ○ | ○ | ○ | × | ○ | ~ | ○ | ○ | ○ | ○ | ○ |

FIG. 20A

| Page | DATA | | | | | | | |
|---|---|---|---|---|---|---|---|---|
| Upper | 1 | 0 | 0 | 1 | 1 | 1 | 0 | 0 |
| Middle | 1 | 1 | 0 | 0 | 0 | 1 | 1 | 0 |
| Lower | 1 | 1 | 1 | 1 | 0 | 0 | 0 | 0 |

FIG. 20B

| Page | DATA | | | | | | | |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 0 | 0 | 0 | 0 | 1 | 1 | 1 | 1 |

FIG. 20C

| Page | DATA | | | | | | | |
|---|---|---|---|---|---|---|---|---|
| Upper | 1 | 0 | 0 | 1 | 1 | 1 | 0 | 0 |
| Middle | 1 | 1 | 0 | 0 | 0 | 1 | 1 | 0 |
| Lower | 0 | 0 | 0 | 0 | 1 | 1 | 1 | 1 |

FIG. 33

| Stage | Page | Er | A1 | B1 | C1 | D1 | E1 | F1 | G1 | H1 | I1 | J1 | K1 | L1 | M1 | N1 | O1 |
|---|---|---|---|---|---|---|---|---|---|---|---|---|---|---|---|---|---|
| | | DATA | | | | | | | | | | | | | | | |
| 2nd STAGE | Higher | 1 | 1 | 0 | 0 | 1 | 1 | 0 | 0 | 0 | 1 | 1 | 1 | 1 | 0 | 0 | 0 |
| 2nd STAGE | Upper | 1 | 0 | 0 | 0 | 0 | 1 | 1 | 1 | 1 | 1 | 0 | 0 | 1 | 1 | 0 | 0 |
| 1st STAGE | Middle | 1 | 1 | 1 | 0 | 0 | 0 | 0 | 1 | 1 | 1 | 1 | 0 | 0 | 0 | 0 | 1 |
| 1st STAGE | Lower | 1 | 1 | 1 | 1 | 1 | 1 | 1 | 1 | 0 | 0 | 0 | 0 | 0 | 0 | 0 | 0 |
| | REGIONS | Er | A1 | B1 | C1 | D1 | E1 | F1 | G1 | H1 | I1 | J1 | K1 | L1 | M1 | N1 | O1 |

FIG. 35

| | Page | DATA | | | | | | | | | | | | | | | |
|---|---|---|---|---|---|---|---|---|---|---|---|---|---|---|---|---|---|
| 2nd STAGE | Higher | 1 | 0 | 0 | 0 | 0 | 1 | 1 | 1 | 1 | 1 | 0 | 0 | 0 | 0 | 0 | 1 |
| | Upper | 1 | 1 | 1 | 0 | 0 | 0 | 0 | 1 | 1 | 0 | 0 | 0 | 0 | 1 | 1 | 1 |
| 1st STAGE | Middle | 1 | 1 | 0 | 0 | 1 | 1 | 0 | 0 | 0 | 0 | 1 | 1 | 0 | 0 | 1 | 1 |
| | Lower | 1 | 1 | 1 | 1 | 1 | 1 | 1 | 0 | 0 | 0 | 0 | 0 | 0 | 0 | 0 | 0 |
| | REGIONS | Er | A1 | B1 | C1 | D1 | E1 | F1 | G1 | H1 | I1 | J1 | K1 | L1 | M1 | N1 | O1 |

FIG. 37

| | Page | DATA | | | | | | | | | | | | | | | |
|---|---|---|---|---|---|---|---|---|---|---|---|---|---|---|---|---|---|
| 2nd STAGE | Higher | 1 | 0 | 0 | 1 | 1 | 1 | 0 | 0 | 0 | 0 | 1 | 1 | 1 | 0 | 0 | 1 |
| | Upper | 1 | 1 | 0 | 0 | 0 | 1 | 1 | 0 | 0 | 1 | 1 | 0 | 0 | 0 | 1 | 1 |
| 1st STAGE | Middle | 1 | 1 | 1 | 1 | 0 | 0 | 0 | 0 | 0 | 0 | 0 | 0 | 1 | 1 | 1 | 1 |
| | Lower | 1 | 1 | 1 | 1 | 1 | 1 | 1 | 1 | 0 | 0 | 0 | 0 | 0 | 0 | 0 | 0 |
| | REGIONS | Er | A1 | B1 | C1 | D1 | E1 | F1 | G1 | H1 | I1 | J1 | K1 | L1 | M1 | N1 | O1 |

MEMORY SYSTEM AND WRITING METHOD

CROSS-REFERENCE TO RELATED APPLICATION

This application is based upon and claims the benefit of priority from Japanese Patent Application No. 2016-131025, filed Jun. 30, 2016, the entire contents of which are incorporated herein by reference.

FIELD

Embodiments described herein relate generally to a memory system and a writing method.

BACKGROUND

In NAND memories capable of storing 3 bits/cell, in order to avoid interference between cells, a method of simultaneously writing all bits similarly on adjacent cells after simultaneously writing all of the stored bits on first memory cells, and subsequently rewriting all of the bits on the first memory cells again, is generally used. However, when this method is used, it is necessary to retain data on a controller side to execute the rewriting.

As a method of simultaneously programming all bits, 1-3-3 coding is known. This method is coding in which 7 among 8 regions with threshold voltages of 3 bits/cell are divided into 1, 3, and 3 with 3 bits.

However, since recent NAND memories are 3-dimensional memories, the number of required write buffers on the controller side increases, and so the cost of the controller increases. For this reason, in 3-dimensional nonvolatile memories, it is desirable to take countermeasures for reducing the number of required write buffers in the memory controller while suppressing interference between cells and a deviation of bit error ratios between pages.

DESCRIPTION OF THE DRAWINGS

FIG. 8A is a diagram illustrating a first example of a program procedure according to the first embodiment.

FIG. 8B is a diagram illustrating a second example of a program procedure according to the first embodiment.

FIG. 8C is a diagram illustrating a third example of a program procedure according to the first embodiment.

FIG. 9E is a diagram illustrating a majority decision process of read results of a plurality of times.

FIGS. 20A, 20B, and 20C are diagrams illustrating another example of 1-3-3 data coding.

FIG. 33 is a diagram illustrating data coding corresponding to the threshold voltage distributions illustrated in FIG. 32.

FIG. 35 is a diagram illustrating data coding corresponding to the threshold voltage distributions illustrated in FIG. 34.

FIG. 37 is a diagram illustrating data coding corresponding to the threshold voltage distributions illustrated in FIG. 35.

DETAILED DESCRIPTION

Embodiments provide a memory system and a writing method capable of reducing an amount of write buffers in a memory controller while suppressing interference between cells.

According to an embodiment, a nonvolatile memory device includes a memory cell array including first memory cells and second memory cells, a plurality of bit lines, each of which is connected to one of the first memory cells and one of the second memory cells, a first word line connected to gates of the first memory cells, a second word line connected to gates of the second memory cells, and a control unit configured to perform an operation to write first, second, and third pages of data in the first memory cells in first and second stages. During the first stage, the control unit applies voltages to the first word line and the bit lines based on the first page of data to maintain threshold voltages for a first group of the first memory cells and shift the threshold voltages for a second group of the first memory cells above a first threshold. During the second stage, the control unit applies voltages to the first word line and the bit lines based on the second and third pages of data so as to shift the threshold voltages of the first memory cells in the first group to threshold voltages that are in one of first, second, and third threshold voltage ranges and the threshold voltages of the first memory cells in the second group to threshold voltages that are in one of fourth, fifth, sixth, and seventh threshold voltage ranges.

A memory system and writing method according to embodiments will be described in detail with reference to the appended drawings. These embodiments are examples and are not limiting.

First Embodiment

Figure 1:
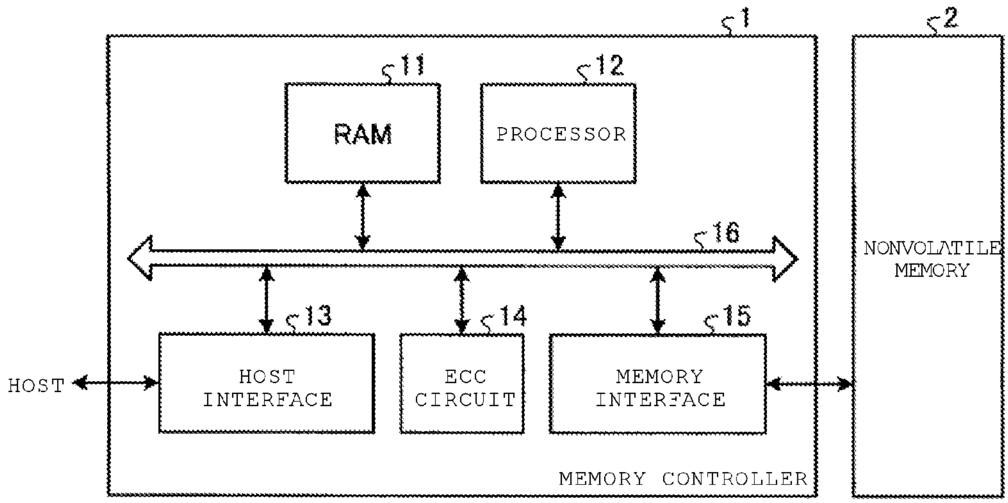
FIG. 1 is a block diagram illustrating an example of the configuration of a storage device according to a first embodiment.

FIG. 1 is a block diagram illustrating an example of the configuration of a storage device according to a first embodiment. A storage device according to the present embodiment includes a memory controller 1 and a nonvolatile memory 2. The storage device can be connected to a host. The host is, for example, an electronic apparatus such as a personal computer or a portable terminal.

The nonvolatile memory 2 is a memory that stores data in a nonvolatile manner and includes, for example, a NAND memory (NAND flash memory). In the present embodiment, the nonvolatile memory 2 is assumed to be a NAND memory that includes memory cells into which 3 bits per memory cell are stored, that is, a NAND memory storing 3 bits/cell (TLC: Triple Level Cell). The nonvolatile memory 2 is also a 3-dimensional memory.

The memory controller 1 controls write of data on the nonvolatile memory 2 in response to a write command from the host. The memory controller 1 controls read of data from the nonvolatile memory 2 in response to a read command from the host. The memory controller 1 includes a random access memory (RAM) 11, a processor 12, a host interface 13, an error check and correction (ECC) circuit 14, and a memory interface 15. The RAM 11, the processor 12, the host interface 13, the ECC circuit 14, and the memory interface 15 are connected to each other by an internal bus 16.

The host interface 13 outputs commands, user data (write data), and the like received from the host to the internal bus 16. The host interface 13 transmits the user data read from the nonvolatile memory 2, a response from the processor 12, and the like to the host.

The memory interface 15 controls a process of writing user data or the like in the nonvolatile memory 2 and a process of reading user data or the like from the nonvolatile memory 2 based on instructions of the processor 12.

The processor 12 controls the memory controller 1. The processor 12 is, for example, a central processing unit (CPU) or a micro processing unit (MPU). When the processor 12 receives a command from the host via the host interface 13, the processor 12 executes control in response to the command. For example, the processor 12 instructs the memory interface 15 to write user data and parity in the nonvolatile memory 2 in response to a command from a host. The processor 12 instructs the memory interface 15 to read user data and parity from the nonvolatile memory 2 in response to a command from the host.

The processor 12 determines a storage region (memory region) in the nonvolatile memory 2 for the user data accumulated in the RAM 11. The user data is stored in the RAM 11 via the internal bus 16. The processor 12 determines a memory region for the user data in unit of pages which are units of writing (page data). In the present specification, user data stored in one page of the nonvolatile memory 2 is defined as unit data. The unit data is generally coded and is stored as a codeword in the nonvolatile memory 2. The coding is optional. The memory controller 1 may store the unit data in the nonvolatile memory 2 without coding the unit data, but a configuration for executing the coding is illustrated as one configuration example in FIG. 1. When the memory controller 1 does not execute coding, the page data is identical to the unit data. One codeword may be generated based on one piece of unit data or one codeword may be generated based on split data obtained by splitting the unit data. One codeword may be generated using a plurality of pieces of unit data.

The processor 12 determines the memory region of the nonvolatile memory 2 of a write destination for each piece of unit data. A physical address is allocated to the memory region of the nonvolatile memory 2. The processor 12 manages the memory region of the write destination of the unit data using the physical address. The processor 12 instructs the memory interface 15 to designate the determined memory region (physical address) and write the user data in the nonvolatile memory 2. The processor 12 manages the mapping between a logical address (a logical address managed by the host) and a physical address of the user data. When the processor 12 receives a read command including the logical address from the host, the processor 12 determines the physical address corresponding to the logical address and instructs the memory interface 15 to output a command to read the user data from the physical address.

In the present specification, memory cells commonly connected to one word line are defined as a memory cell group MG. In the present embodiment, the nonvolatile memory 2 is a NAND memory with TLC memory cells and one memory cell group MG corresponds to 3 pages. Here, each of the 3 bits of the memory cells in a memory cell group corresponds to one of the 3 pages. In the present embodiment, the 3 pages are referred to as a lower page (first page), a middle page (second page), and an upper page (third page).

The ECC circuit 14 codes the user data stored in the RAM 11 to generate a codeword. The ECC circuit 14 decodes the codeword read from the nonvolatile memory 2.

The RAM 11 temporarily stores the user data received from the host until the user data is stored in the nonvolatile memory 2 or temporarily stores data read from the nonvolatile memory 2 until the data is transmitted to the host. The RAM 11 is, for example, a general volatile memory such as a static random access memory (SRAM) and a dynamic random access memory (DRAM).

FIG. 1 illustrates an example of the configuration in which the memory controller 1 includes the ECC circuit 14 and the memory interface 15. However, the ECC circuit 14 may be contained in the memory interface 15. The ECC circuit 14 may be contained in the nonvolatile memory 2.

When a write request is received from the host, the storage device (memory system) operates as follows. The processor 12 temporarily stores write data in the RAM 11. The processor 12 reads data stored in the RAM 11 and inputs the data to the ECC circuit 14. The ECC circuit 14 codes the input data and inputs the codeword to the memory interface 15. The memory interface 15 writes the input codeword on the nonvolatile memory 2.

When a read request is received from the host, the storage device operates as follows. The memory interface 15 inputs the codeword read from the nonvolatile memory 2 to the ECC circuit 14. The ECC circuit 14 decodes the input codeword and stores the decoded data in the RAM 11. The processor 12 transmits the data stored in the RAM 11 to the host via the host interface 13. In the nonvolatile memory 2, a plurality of chips are connected in some cases, and the nonvolatile memory 2 and the memory interface 15 can also be connected via a through-silicon-via (TSV).

Figure 2:
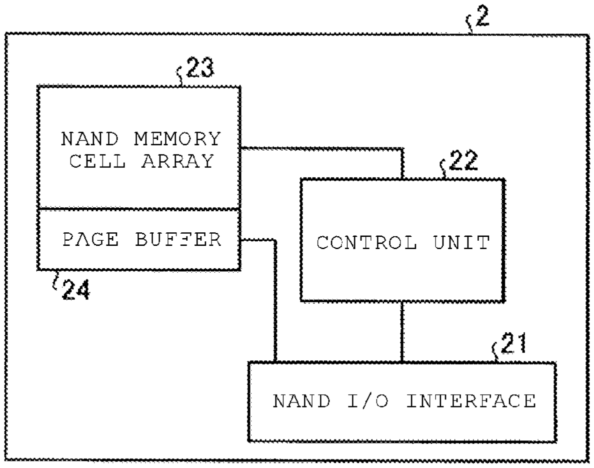
FIG. 2 is a block diagram illustrating an example of the configuration of a nonvolatile memory according to the first embodiment.

FIG. 2 is a block diagram illustrating an example of the configuration of a nonvolatile memory according to the present embodiment. The nonvolatile memory 2 includes a NAND I/O interface 21, a control unit 22, a NAND memory cell array (memory cell unit) 23, and a page buffer 24. The nonvolatile memory 2 is formed from, for example, a semiconductor substrate (for example, a silicon substrate).

The control unit 22 controls an operation of the nonvolatile memory 2 based on a command or the like input from the memory controller 1 via the NAND I/O interface 21. Specifically, when a write request is input, the control unit 22 executes control such that data requested to be written is written to a designated address on the NAND memory cell array 23. When a read request is input, the control unit 22 executes control such that data request to be read is read from the NAND memory cell array 23 and is output to the memory controller 1 via the NAND I/O interface 21. The page buffer 24 temporarily stores data input from the memory controller 1 at the time of writing of the NAND memory cell array 23 or temporarily stores data read from the NAND memory cell array 23.

Figure 3:
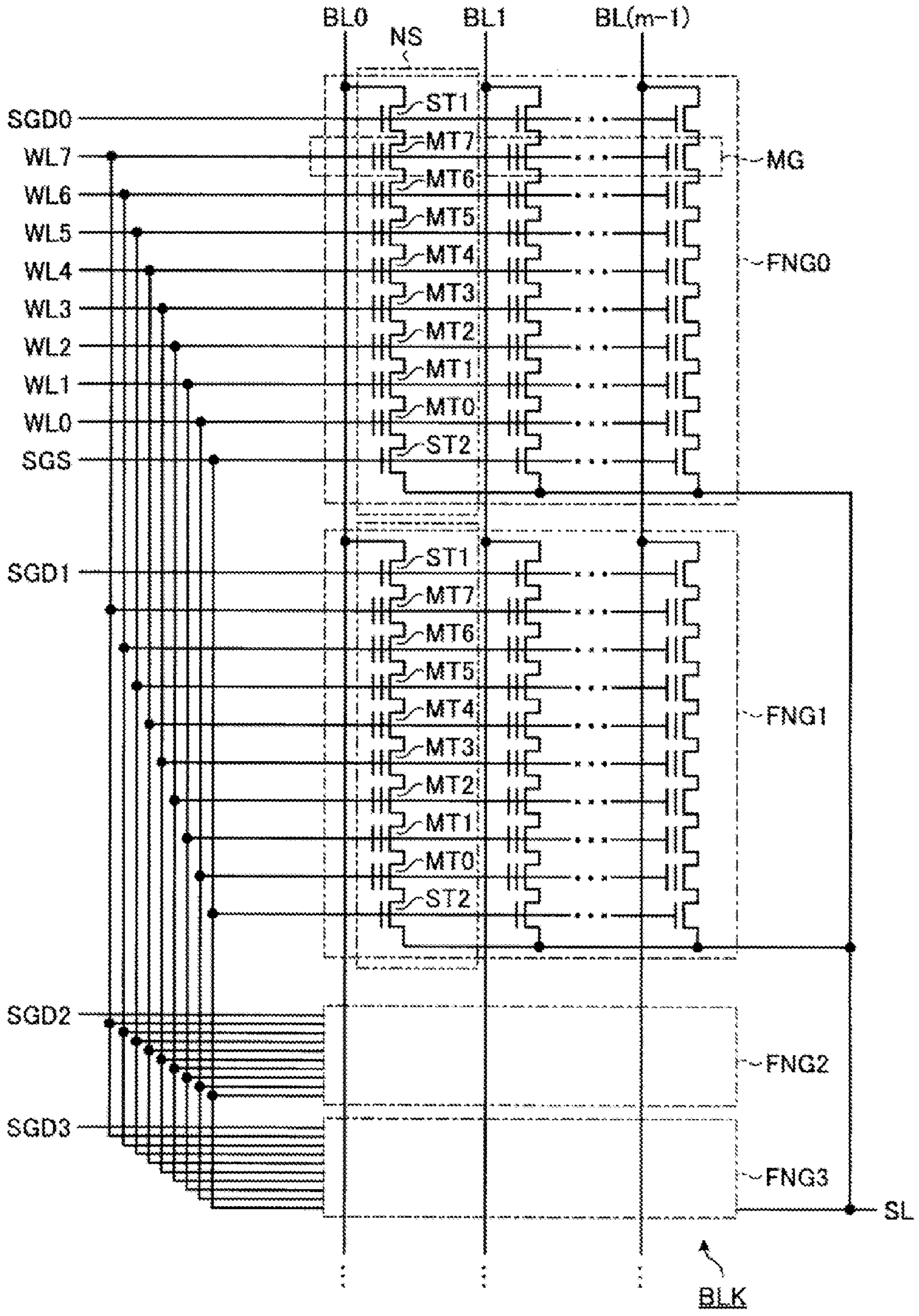
FIG. 3 is a diagram illustrating an example of the configuration of a block of a memory cell array with a 3-dimensional structure.

FIG. 3 is a diagram illustrating an example of the configuration of a block of a memory cell array with a 3-dimensional structure. FIG. 3 illustrates one block BLK among a plurality of blocks included in a memory cell array with a 3-dimensional structure. The other blocks of the memory cell array have the same configuration of that in FIG. 3. The present embodiment can also be applied to a memory cell with a 2-dimensional structure.

As illustrated in the drawing, the block BLK includes, for example, 4 fingers FNG (FNG0 to FNG3). Each of the fingers FNG includes a plurality of NAND strings NS. Each of the NAND strings NS includes, for example, 8 memory cell transistors MT (MT0 to MT7) and select transistors ST1 and ST2. The number of memory cell transistors MT is not limited to 8. The memory cell transistors MT are arranged between the select transistors ST1 and ST2 so that current paths are connected in series. The current path of the memory cell transistor MT7 on one end side of the series connection is connected to one end of the current path of the select transistors ST1 and the current path of the memory cell transistors MT0 the other end side is connected to one end of the current path of the select transistor ST2.

Gates of the select transistors ST1 of the fingers FNG0 to FNG3 are commonly connected to select gate line SGD0 to SGD3. On the other hand, the gates of the select transistors ST2 are commonly connected to the same select gate line SGS across the plurality of fingers FNG. Control gates of the memory cell transistors MT0 to MT7 in the same block BLK are commonly connected to word lines WL0 to WL7. That is, the word lines WL0 to WL7 and the select gate lines SGS are commonly connected across the plurality of fingers FNG0 to FNG3 in the same block BLK, and the select gate lines SGD are independent from each other among the fingers FNG0 to FNG3 even in the same block BLK.

The word lines WL0 to WL7 are connected to control gate electrodes of the memory cell transistors MT0 to MT7 included in the NAND string NS, and the memory cell transistors MTi (where i=0 to n) in each NAND string NS are commonly connected by the same word lines WLi (where i=0 to n). That is, the control gate electrode of the memory cell transistor MTi in the same row in the block BLK is connected to the same word line WLi. In the following description, the NAND string NS is referred to as a string in some cases.

Each memory cell is connected to the word line WLi and is also connected to a bit line. Each memory cell can be identified by addresses that identify the word line WLi and the select gate lines SGD0 to SGD3 and an address that identifies the bit line. As described above, data of memory cells (the memory cell transistors MT) in the same block BLK is erased collectively. On the other hand, reading and writing of data are executed in units of physical sectors MS. One physical sector MS is connected to one word line WLi and includes a plurality of memory cells belonging to one finger FNG.

At the time of a read operation and a program operation, one word line WLi and one select gate line SGD are selected and the physical sector MS is selected according to a physical address.

Figure 4:
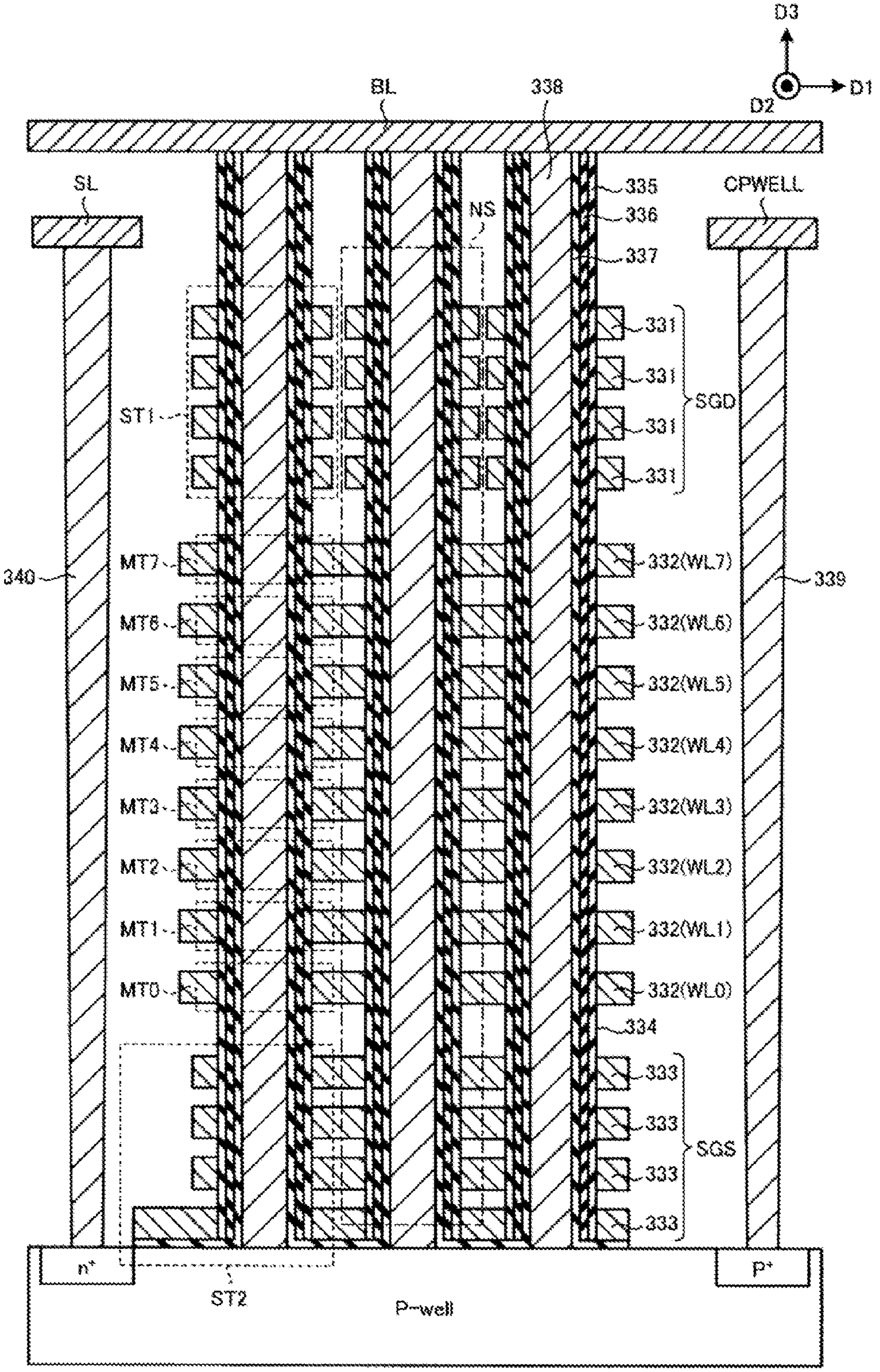
FIG. 4 is a sectional view illustrating a partial region of the memory cell array of a NAND memory with a 3-dimensional structure.

FIG. 4 is a sectional view illustrating a partial region of the memory cell array of a NAND memory with a 3-dimensional structure. As illustrated in FIG. 4, a plurality of NAND strings NS are formed on a p-type well region (P-well). That is, a plurality of wiring layers 333 functioning as the select gate lines SGS, a plurality of wiring layers 332 functioning as word lines WLi, and a plurality of wiring layers 331 functioning as the select gate lines SGD are formed on the p-type well region.

Then, memory holes 334 penetrating through these wiring layers 333, 332, and 331 and reaching the p-type well region are formed. Block insulation films 335, charge accumulation layers 336, and gate insulation films 337 are sequentially formed on side surfaces of the memory holes 334, and additional conductive films 338 (e.g., polysilicon films) are embedded in the memory holes 334. The conductive film 338 functions as the current path of the NAND string NS and is a region in which channels are formed at the time of operation of the memory cell transistors MT and the select transistors ST1 and ST2.

In each NAND string NS, the select transistor ST2, the plurality of memory cell transistors MT, and the select transistor ST1 are sequentially stacked on the p-type well region. A wiring layer functioning as a bit line BL is formed at the upper end of the conductive film 338.

Further, an n+ type impurity diffusion layer and a p+ type impurity diffusion layer are formed on an upper surface of the p-type well region. A contact plug 340 is formed on the n+ type impurity diffusion layer and a wiring layer functioning as a source line SL is formed on the contact plug 340. A contact plug 339 is formed on the p+ type impurity diffusion layer and a wiring layer functioning as well wiring CPWELL is formed on the contact plug 339.

The plurality of foregoing configurations illustrated in FIG. 4 are arrayed in a depth direction of the sheet surface in FIG. 4 and one finger FNG is formed by a set of the plurality of NAND strings aligned in the depth direction.

Figures 5, 6:
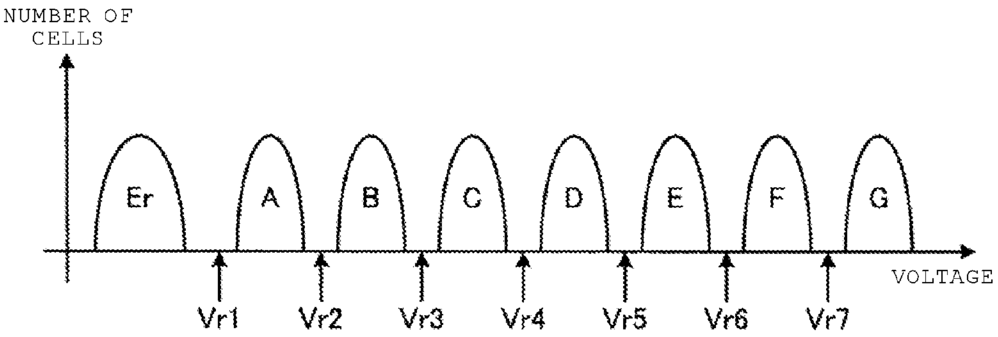
FIG. 5 is a diagram illustrating examples of threshold voltage regions according to the first embodiment.
FIG. 6 is a diagram illustrating data coding according to the first embodiment.

FIG. 5 is a diagram illustrating examples of threshold voltage regions according to the first embodiment. FIG. 5 illustrates an example of a threshold distribution for a memory cell containing 3 bits/cell. In the nonvolatile memory 2, information is stored by the amount of charge accumulated in a floating gate of the memory cell. Each memory cell has a threshold voltage in accordance with the amount of charge. Then, a plurality of data values stored in the memory cell corresponds to a plurality of regions (threshold voltage regions) of the threshold voltages.

In FIG. 5, 8 distributions denoted by Er, A, B, C, D, E, F, and G are threshold voltage distributions in the 8 threshold voltage regions. In this way, the 8 threshold voltage distributions are separated by 7 boundaries. The horizontal axis in FIG. 5 represents the threshold voltage and the vertical axis indicates a distribution of the number of memory cells (the number of cells).

In the present embodiment, a region of which a threshold voltage is equal to or lower than Vr1 is referred to as a region Er, a region of which a threshold voltage is equal to or higher than Vr1 and equal to or lower than Vr2 is referred to as a region A, a region of which a threshold voltage is equal to or higher than Vr2 and equal to or lower than Vr3 is referred to as a region B, and a region of which a threshold voltage is equal to or higher than Vr3 and equal to or lower than Vr4 is referred to as a region C. In the present embodiment, a region of which a threshold voltage is equal to or higher than Vr4 and equal to or lower than Vr5 is referred to as a region D, a region of which a threshold voltage is equal to or higher than Vr5 and equal to or lower than Vr6 is referred to as a region E, a region of which a threshold voltage is equal to or higher than Vr6 and equal to or lower than Vr7 is referred to as a region F, and a region of which a threshold voltage is equal to or higher than Vr7 is referred to as a region G.

The threshold voltage distributions corresponding to the regions Er, A, B, C, D, E, F, and G are referred to as distributions Er, A, B, C, D, E, F, and G (first to eighth distributions). Vr1 to Vr7 are threshold voltages at the boundaries of the regions.

In the nonvolatile memory 2, a plurality of data values correspond to the plurality of threshold voltage regions (that is, the threshold voltage distributions) of the memory cells. This correspondence is referred to as data coding. The data coding is determined in advance, and charges are injected into the memory cells in the threshold regions in accordance with the data values stored according to the data coding at the time of writing (program) of data. Then, at the time of reading, a read voltage is applied to the memory cell and data is determined depending on whether the threshold voltage of the memory cell is lower or higher than the read voltage. When the threshold voltage is lower than the read voltage, a data value in an "erased" state is defined as "1". When the threshold voltage is higher than the read voltage, a "programmed" state is determined and data is defined as "0".

At the time of reading of data, data is determined depending on whether the threshold voltage is lower or higher than a read level of a reading target boundary. When the threshold voltage is the lowest, an "erased" state is defined and the pieces of data of all bits are determined as "1". When the threshold voltage is higher than in the "erased" state, a "programmed" state is determined and data is defined as "1" or "0" according to the coding.

FIG. 6 is a diagram illustrating data coding according to the first embodiment. In the present embodiment, 8 threshold voltage distributions (threshold voltage regions) illustrated in FIG. 5 correspond to 8 data values of 3 bits. A relation between the threshold voltages and data values of bits corresponding to the upper, middle, and lower pages is as follows:

- a memory cell of which the threshold voltage is within the Er region is in a state in which "111" is stored;
- a memory cell of which the threshold voltage is within the A region is in a state in which "101" is stored;
- a memory cell of which the threshold voltage is within the B region is in a state in which "001" is stored;
- a memory cell of which the threshold voltage is within the C region is in a state in which "011" is stored;
- a memory cell of which the threshold voltage is within the D region is in a state in which "010" is stored;
- a memory cell of which the threshold voltage is within the E region is in a state in which "110" is stored;
- a memory cell of which the threshold voltage is within the F region is in a state in which "100" is stored; and a memory cell of which the threshold voltage is within the G region is in a state in which "000" is stored.

In this way, data of 3 bits can be indicated for each region with the threshold voltage. When the memory cell is in an unwritten state ("erased" state), the threshold voltage of the memory cell is within the Er region. For codes described here, data of only 1 bit is changed between 2 arbitrary adjacent states in such a manner that data of "111" is stored in the Er (erased) state and data of "101" is stored in the A state. In this way, the coding illustrated in FIG. 6 is gray coding in which data is changed by only 1 bit between 2 arbitrary adjacent regions.

In the coding according to the present embodiment illustrated in FIG. 6, threshold voltages serving as boundaries for determining bit values of pages are as follows:

a threshold voltage serving as a boundary for determining a bit value of the upper page is Vr4;

threshold voltages serving as boundaries for determining a bit value of the middle page are Vr2, Vr5, and Vr7; and threshold voltages serving as boundaries for determining a bit value of the lower page are Vr1, Vr3, and Vr6.

In this way, the number of threshold voltages serving as the boundaries for determining bit values (hereinafter referred to as the number of boundaries) are 1, 3, and 3 for the lower page, the middle page, and the upper page, respectively. Hereinafter, such coding is referred to as 1-3-3 coding using the numbers of boundaries of the lower page, the middle page, and the upper page. The matter to be noticed herein is that the maximum number of boundaries changed between pieces of adjacent data for each page is 3. The reason why the maximum of number of boundaries 3 is that when 8 states are expressed with 3 bits, the maximum number of boundaries is minimum and a deviation of a bit error is small.

The control unit 22 of the nonvolatile memory 2 controls program to the NAND memory cell array 23 and read from the NAND memory cell array 23 based on the coding illustrated in FIG. 6.

For a 3-dimensional memory cell, the size of the memory cell is larger than that of a 2-dimensional NAND memory of a generation in which microfabrication is recently achieved and interference between cells is small. In this case, a method of simultaneously programming all bits (simultaneously programming all pages when bits are allocated to different pages) is generally used.

When all bits are simultaneously programmed, 1-2-4 coding or 2-3-2 coding is used as data coding. In the 1-2-4 coding, when 7 boundaries among 8 threshold voltage distributions are divided into 3 pages, the boundaries are divided in such a manner that 1 is divided to the lower page, 2 are divided to the middle page, and 4 are divided to the upper page. In the 2-3-2 coding, when 7 boundaries among 8 threshold voltage distributions are divided to 3 pages, the boundaries are divided in such a manner that 2 is divided to the upper page, 3 are divided to the middle page, and 2 are divided to the lower page.

Incidentally, in the case of the 1-2-4 coding, since the number of boundaries is biased considerably to each page, a deviation of a bit error ratio among the pages consequently increases as a result. This is because most of the causes of bit errors occur due to movement of the threshold voltages to adjacent distributions, and the number of bit errors increases in proportion to the pages having a larger number of boundaries. This requires an increase in the correction capability of ECC necessary to correct errors of page data even when error ratios are identical between memory cells, and thus the speed, cost, and power consumption of a storage device may deteriorate. Further, the deviation in the number of boundaries also causes a deviation in a read speed.

In a NAND memory storing 3 bits/cell, interference between cells is greater than that of a NAND memory storing 1 bit/cell or a NAND memory storing 2 bits/cell. Therefore, to generally suppress interface between cells in a NAND memory of a generation in which microfabrication is recently achieved, there is a program method (LM-foggy-fine program or foggy-fine program) of gradually injecting charges to floating gates of memory cells using 3 or 2 stages. In the LM-foggy-fine program, writing is executed with 3 program stages in such a manner that writing on an adjacent cell is executed after writing on a first stage (LM state), a return to the previous cell is executed, writing on further adjacent cell is executed again after writing on a second stage (foggy state), a return to the previous memory cell is executed again, and writing on a third stage (fine stage) is executed.

In the foggy-fine program, writing is executed with 2 program stages in such a manner that writing on an adjacent cell is executed after writing on a first stage (foggy state), a return to a previous memory cell after the adjacent cell is executed, and writing on a second stage (fine stage) is executed. In this case, each program stage is a program execution unit and program of 1 word line WLi is completed by executing 3 program stages.

In program of the LM stage which is a first stage, input data may be only lower page data. In program of the foggy stage which is a second stage, program is executed using 8 threshold voltage distributions. At this time, the threshold voltage distributions (threshold voltage regions) have larger widths than the threshold voltage distributions in final data coding. That is, in the foggy stage, foggy (rough) writing is executed. In the program of the foggy stage, 3 pages are all required as input data. Since the threshold voltage distributions after the program of the foggy stage are an intermediate state in which adjacent distributions overlap each other, reading data may not be executed. In the program of the fine stage which is a third state, the threshold voltage distribution after the program of the foggy stage are moved to threshold voltage distributions in the final data coding. That is, in the fine stage, fine writing is executed. In the program of the fine stage, 3 pages are all required as input data. Since the threshold voltage distributions after the program of the fine stage are in the final state in which adjacent distributions are separated, data can be read after the program of the fine stage.

In the case of the 2-3-2 coding, a deviation in the number of boundaries is small. However, in data input of the LM-foggy-fine program, data input corresponding to 3 pages is required in all the stages. In the data input of the foggy-fine program, data input corresponding to 2 pages is required in all the stages. This increases a time necessary for the data input and deteriorates the speed of a storage device. In the storage device, an amount of write buffer (a write buffer amount) for retaining data in order to input the data to a NAND memory may increase. In one embodiment and also in general the write buffer is a buffer to which some of regions of the RAM 11 included in the storage device is allocated.

As countermeasures for this, there is a method of executing the LM-foggy-fine program adopting the 1-3-3 coding. In this method, interference between cells can be suppressed since the LM-foggy-fine program is adopted. Since it is better to input data corresponding to 1 page to the LM stage, a reduction in the write buffer amount is compatible with suppression in a deviation of a bit error ratio caused due to a deviation in the number of boundaries between pages.

However, when the NAND memory of the nonvolatile memory 2 has a 3-dimensional structure, the write buffer amount is large despite application of the LM-foggy-fine program or the foggy-fine program in which the 1-3-3 coding is adopted, and thus the cost of the memory controller 1 increases.

Accordingly, in the present embodiment, in the storage device, the 1-3-3 coding is adopted for the nonvolatile memory 2 having the 3-dimensional structure and writing in a page unit (page by page) is further executed in two stages. Thus, in the present embodiment, even in the nonvolatile memory 2 having the 3-dimensional structure, the write buffer amount of the memory controller 1 is reduced while suppressing interference between cells or a deviation in a bit error ratio between pages.

Here, interference between adjacent memory cells will be described. Charges accumulated in a floating gate of one certain memory cell disturb an electric field of an adjacent memory cell and consequently causes noise varying a threshold voltage of reading of the adjacent memory cell. Read precision deteriorates because verifying is executed with program under a certain electric field condition and the adjacent memory cell is programmed with different charges after completion of the program. The interference between adjacent memory cells becomes worse as a memory cell interval is reduced by a manufacturing technology for microfabrication of a memory device. Then, the interference between adjacent memory cells increases due to an adjacent memory cell of a different bit line on the same word line WLi and an adjacent memory cell of a different word line WLi on the same bit line.

The interference between adjacent memory cells can be alleviated by reducing a difference between electric field conditions of the memory cells between the time of program and verifying and the time of reading after the adjacent memory cells are programmed. As one method of reducing the interference between adjacent memory cells between adjacent memory cells of different bit lines on the same word line WLi, there is a method of splitting the program into a plurality of stages and executing the program of multi-stages at which a large change in charges between the stages is avoided.

In a program sequence according to the present embodiment, 3 bits on one word line WLi are programmed with 2 program stages, that is, a first stage and a second stage. Each program stage is a program execution unit and the storage device according to the present embodiment completes program of the word line WLi by executing the 2 program stages. In the present embodiment, any page of 3 bits can be allocated to each of the 2 program stages. Specifically, data of the lower page is allocated to the program of the first stage, and data of the middle and upper pages is allocated to the program of the second stage.

Figure 7:
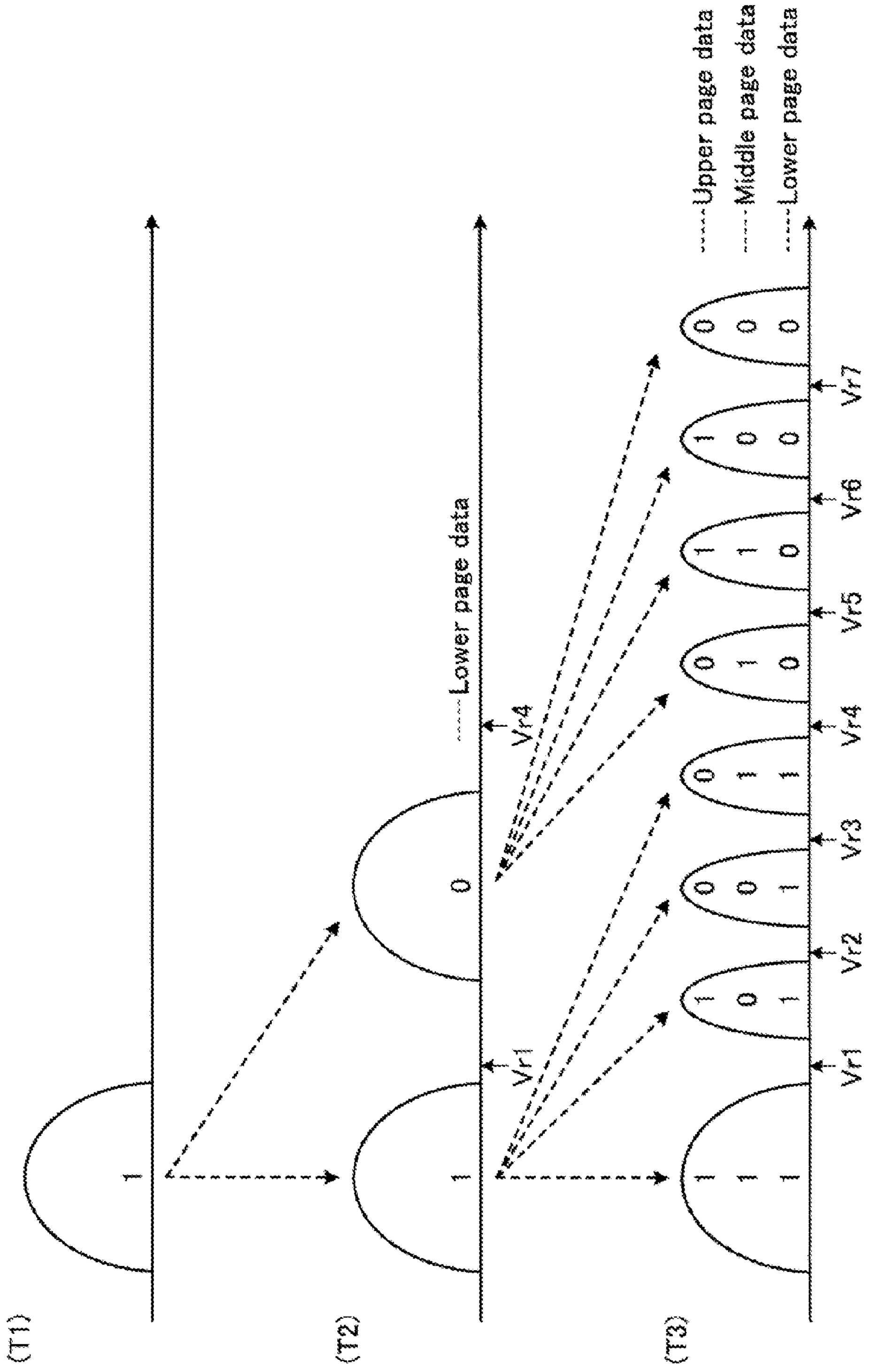
FIG. 7 is a diagram illustrating threshold voltage distributions after program according to the first embodiment.

FIG. 7 is a diagram illustrating threshold voltage distributions after program according to the first embodiment. FIG. 7 illustrates the threshold voltage distributions after the program of each stage on the memory cell. (T1) in FIG. 7 illustrates a threshold voltage distribution in an erased state which is an initial state before the program. (T2) in FIG. 7 illustrates a threshold voltage distribution after the program of the first stage. (T3) in FIG. 7 illustrates a threshold voltage distribution after the program of the second stage.

As illustrated in (T1) in FIG. 7, all the memory cells of the NAND memory cell array 23 are in a distribution Er state which is an unwritten state (the "erased" state). The control unit 22 of the nonvolatile memory 2 causes the distribution to remain in the distribution Er for each memory cell or injects charges and moves the distribution state to a distribution higher than the distribution Er according to a bit value written (stored) on the lower page in the program of the first stage, as illustrated in (T2) in FIG. 7. Specifically, when the bit value written on the lower page is "1", the control unit 22 does not inject charges. When the bit value written on the lower page is "0", the control unit 22 injects charges and executes program so that the threshold voltage is moved to a higher voltage.

Thus, the memory cells are programmed to 2-value levels by lower page data. The matter to be noticed herein is that a function in the program (first program) of the first stage is a function for only the lower page data. Page data necessary for this execution may be only the lower page. Further, since the threshold voltage distribution after the program of the first stage is finally programmed again through subsequent program (second program) of the second stage, it is not necessary to thinly shape the distribution and high-speed program can be executed. Then, since data after the program of the first stage is binary, the lower page data can be read. Accordingly, in consideration of the fact that a level of the threshold voltage at the time of the program of the first stage is allocated to transition to D or higher through the program of the second stage, the level of the threshold voltage is controlled to be entered between Vr1 and Vr4.

As illustrated in (T3) in FIG. 7, two pages, the middle and upper pages, are necessary for write data in the program of the second stage. Then, the control unit 22 of the nonvolatile memory 2 programs the threshold voltage distribution after the program of the second stage so that adjacent distributions become 8-value levels in the finally separated state. In this case, all pieces of page data can be read.

Generally, program is executed by applying a program voltage pulse once or a plurality of times. After each program voltage pulse, reading is executed to confirm whether the memory cells are moved over a threshold voltage boundary level. By repeating the application and the reading, it is possible to move the threshold voltage of the memory cell within a range of a predetermined threshold voltage distribution.

The control unit 22 may continuously execute the program of the first stage and the program of the second stage on one word line WLi. The control unit 22 may also execute the program across a plurality of word lines WLi in a non-continuous procedure in order to reduce the influence of the interference between adjacent memory cells.

FIG. 8A is a diagram illustrating a first example of a program procedure according to the first embodiment. FIG. 8B is a diagram illustrating a second example of the program procedure according to the first embodiment. FIG. 8C is a diagram illustrating a third example of the program procedure according to the first embodiment. FIGS. 8A to 8C illustrate a sequence (a program method of two stages) in which an influence of interference between adjacent memory cells is reduced. FIG. 8A illustrates an example of the program procedure in the case of the NAND memory in which there is one string in a block. FIGS. 8B and 8C illustrate examples of the program procedure in the case of the NAND memory in which there are four strings in a block.

When writing starts, the control unit 22 proceeds to each program stage across the word lines WLi in a predetermined non-continuous procedure. That is, two different program stages are not continuously executed in the same word lines WLi.

For example, a change amount of the threshold voltage increases when the program of the first stage and the program of the second stage are executed in an adjacent word line WLi after completion of the program in the word lines WLi up to the second stage. Then, when the change amount of the threshold voltage of the adjacent word line WLi is large, the interference between the adjacent memory cells between the word lines WLi increases. Accordingly, in order to decrease the interference between the adjacent memory cells between the word lines WLi, it is effective to decrease the change amount of the threshold voltage values of the adjacent word lines WLi after the completion of the program in the word lines WLi up to the second stage. In such a sequence, the program stage of the adjacent word lines WLi after the completion of the program in the word lines WLi up to the second stage is only the second stage.

When writing starts in the case of the NAND memory illustrated in FIG. 8A (when the NAND memory of the nonvolatile memory 2 has the 3-dimensional structure), the control unit 22 executes program in the order of the following (1) to (9) based on an instruction from the processor 12. In the following processes, an operation of the program of the control unit 22 is based on an instruction from the processor 12. To facilitate the description, however, the description that the operation is based on an instruction from the processor 12 will not be made.

(1) First, the control unit 22 executes program $ST_1$1 of the first stage of the word line WL0.

(2) Next, the control unit 22 executes program $ST_1$2 of the first stage of the word line WL1.

(3) Next, the control unit 22 executes program $ST_1$3 of the second stage of the word line WL0.

(4) Next, the control unit 22 executes program $ST_1$4 of the first stage of the word line WL2.

(5) Next, the control unit 22 executes program $ST_1$5 of the second stage of the word line WL1.

(6) Next, the control unit 22 executes program $ST_1$6 of the first stage of the word line WL3.

(7) Next, the control unit 22 executes program $ST_1$7 of the second stage of the word line WL2.

(8) Next, the control unit 22 executes program $ST_1$8 of the first stage of the word line WL4.

(9) Next, the control unit 22 executes program $ST_1$9 of the second stage of the word line WL3.

In this way, the control unit 22 progresses the process in the order indicated by arrows oriented right obliquely upward in the table illustrated in FIG. 8A.

When writing starts in the case of the NAND memory illustrated in FIG. 8B (when the NAND memory of the nonvolatile memory 2 has the 3-dimensional structure), the control unit 22 executes program in the order of the following (11) to (24).

(11) First, the control unit 22 executes program $ST_2$1 of the first stage of stringSt0_word line WL0.

(12) Next, the control unit 22 executes program $ST_2$2 of the first stage of stringSt1_word line WL0.

(13) Next, the control unit 22 executes program $ST_2$3 of the first stage of stringSt2_word line WL0.

(14) Next, the control unit 22 executes program $ST_2$4 of the first stage of stringSt3_word line WL0.

(15) Next, the control unit 22 executes program $ST_2$5 of the first stage of stringSt0_word line WL1.

(16) Next, the control unit 22 executes program $ST_2$6 of the second stage of stringSt0_word line WL0.

(17) Next, the control unit 22 executes program $ST_2$7 of the first stage of stringSt1_word line WL1.

(18) Next, the control unit 22 executes program $ST_2$8 of the second stage of stringSt1_word line WL0.

(19) Next, the control unit 22 executes program $ST_2$9 of the first stage of stringSt2_word line WL1.

(20) Next, the control unit 22 executes program $ST_2$10 of the second stage of stringSt2_word line WL0.

(21) Next, the control unit 22 executes program $ST_2$11 of the first stage of stringSt3_word line WL1.

(22) Next, the control unit 22 executes program $ST_2$12 of the second stage of stringSt3_word line WL0.

(23) Next, the control unit 22 executes program $ST_2$13 of the first stage of stringSt0_word line WL2.

(24) Next, the control unit 22 executes program $ST_2$14 of the second stage of stringSt0_word line WL1.

In this way, the control unit 22 progresses the process in the order indicated by arrows oriented right obliquely upward in the table illustrated in FIG. 8B. In FIG. 8B, there are 4 strings in the block, as described above. However, there may be 3 or less strings or 5 or more strings in the block.

When writing starts in the case of the NAND memory illustrated in FIG. 8C (when the NAND memory of the nonvolatile memory 2 has the 3-dimensional structure), the control unit 22 executes program in the order of the following (31) to (50).

(31) First, the control unit 22 executes program $ST_3$1 of the first stage of stringSt0_word line WL0.

(32) Next, the control unit 22 executes program $ST_3$2 of the first stage of stringSt1_word line WL0.

(33) Next, the control unit 22 executes program $ST_3$3 of the first stage of stringSt2_word line WL0.

(34) Next, the control unit 22 executes program $ST_3$4 of the first stage of stringSt3_word line WL0.

(35) Next, the control unit 22 executes program $ST_3$5 of the first stage of stringSt0_word line WL1.

(36) Next, the control unit 22 executes program $ST_3$6 of the first stage of stringSt1_word line WL1.

(37) Next, the control unit 22 executes program $ST_3$7 of the first stage of stringSt2_word line WL1.

(38) Next, the control unit 22 executes program $ST_3$8 of the first stage of stringSt3_word line WL1.

(39) Next, the control unit 22 executes program $ST_3$9 of the second stage of stringSt0_word line WL0.

(40) Next, the control unit 22 executes program $ST_3$10 of the second stage of stringSt1_word line WL0.

(41) Next, the control unit 22 executes program $ST_3$11 of the second stage of stringSt2_word line WL0.

(42) Next, the control unit 22 executes program $ST_3$12 of the second stage of stringSt3_word line WL0.

(43) Next, the control unit 22 executes program $ST_3$13 of the first stage of stringSt0_word line WL2.

(44) Next, the control unit 22 executes program $ST_3$14 of the first stage of stringSt1_word line WL2.

(45) Next, the control unit 22 executes program $ST_3$15 of the first stage of stringSt2_word line WL2.

(46) Next, the control unit 22 executes program $ST_3$16 of the first stage of stringSt3_word line WL2.

(47) Next, the control unit 22 executes program $ST_3$17 of the second stage of stringSt0_word line WL1.

(48) Next, the control unit 22 executes program $ST_3$18 of the second stage of stringSt1_word line WL1.

(49) Next, the control unit 22 executes program $ST_3$19 of the second stage of stringSt2_word line WL1.

(50) Next, the control unit 22 executes program $ST_3$20 of the second stage of stringSt3_word line WL1.

In FIG. 8C, there are 4 strings in the block, as described above. However, there may be 3 or less strings or 5 or more strings in the block.

In this way, even when there is a plurality of strings, the order of the program of the program stages of the word lines WLi in one string is the same as the order when there is one string. In the case of the nonvolatile memory 2 that has the 3-dimensional structure in which there are plurality of strings in the block, program of combination positions of the word lines WLi and the strings is progressed in such a general manner that the same word line number in different strings is first programmed and a subsequent word line number is progressed. When the program follows such an order and the number of strings in FIG. 8A is combined, the same order as the order in FIG. 8B or 8C is achieved.

Figure 9A:
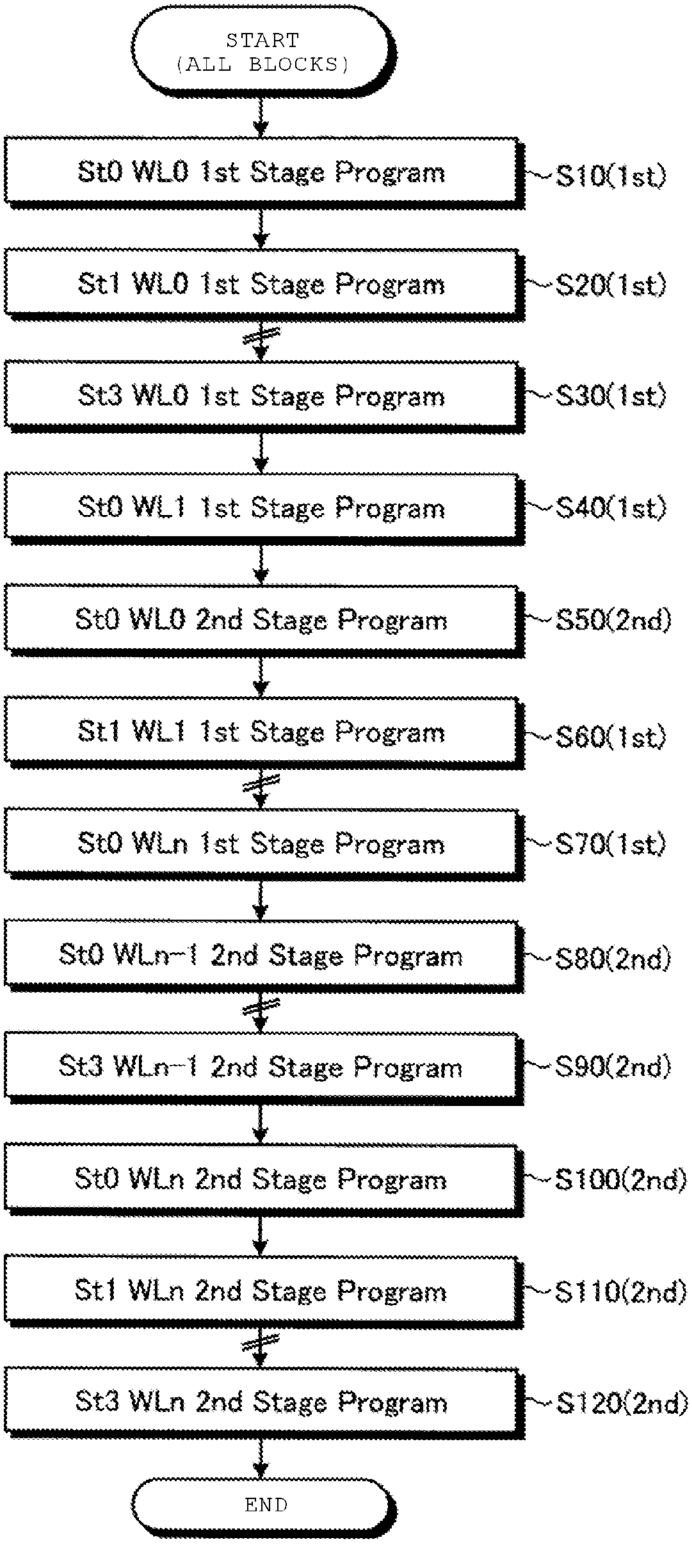
FIG. 9A is a flowchart illustrating an example of a write procedure corresponding one entire block according to the first embodiment.
Figure 9B:
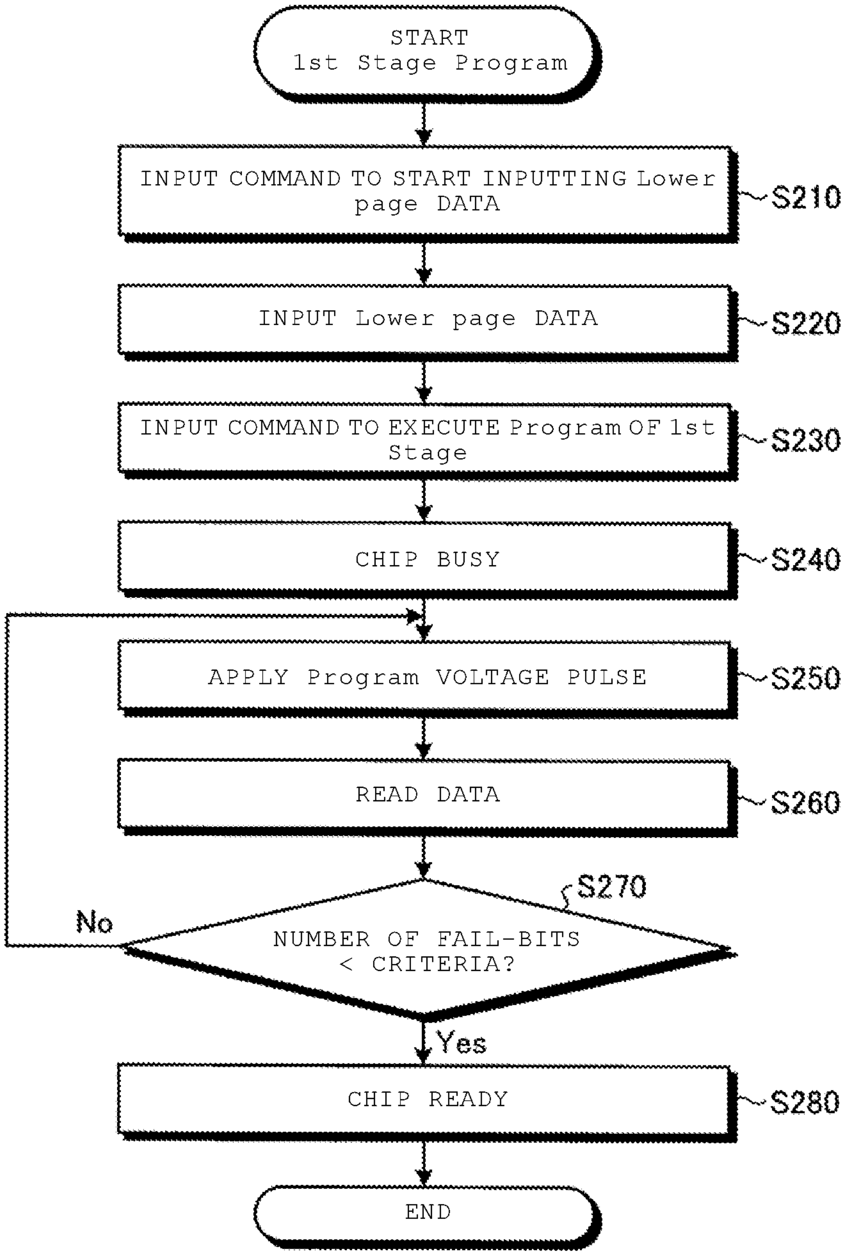
FIG. 9B is a sub-flowchart illustrating a write procedure in a first stage according to the first embodiment.
Figure 9C:
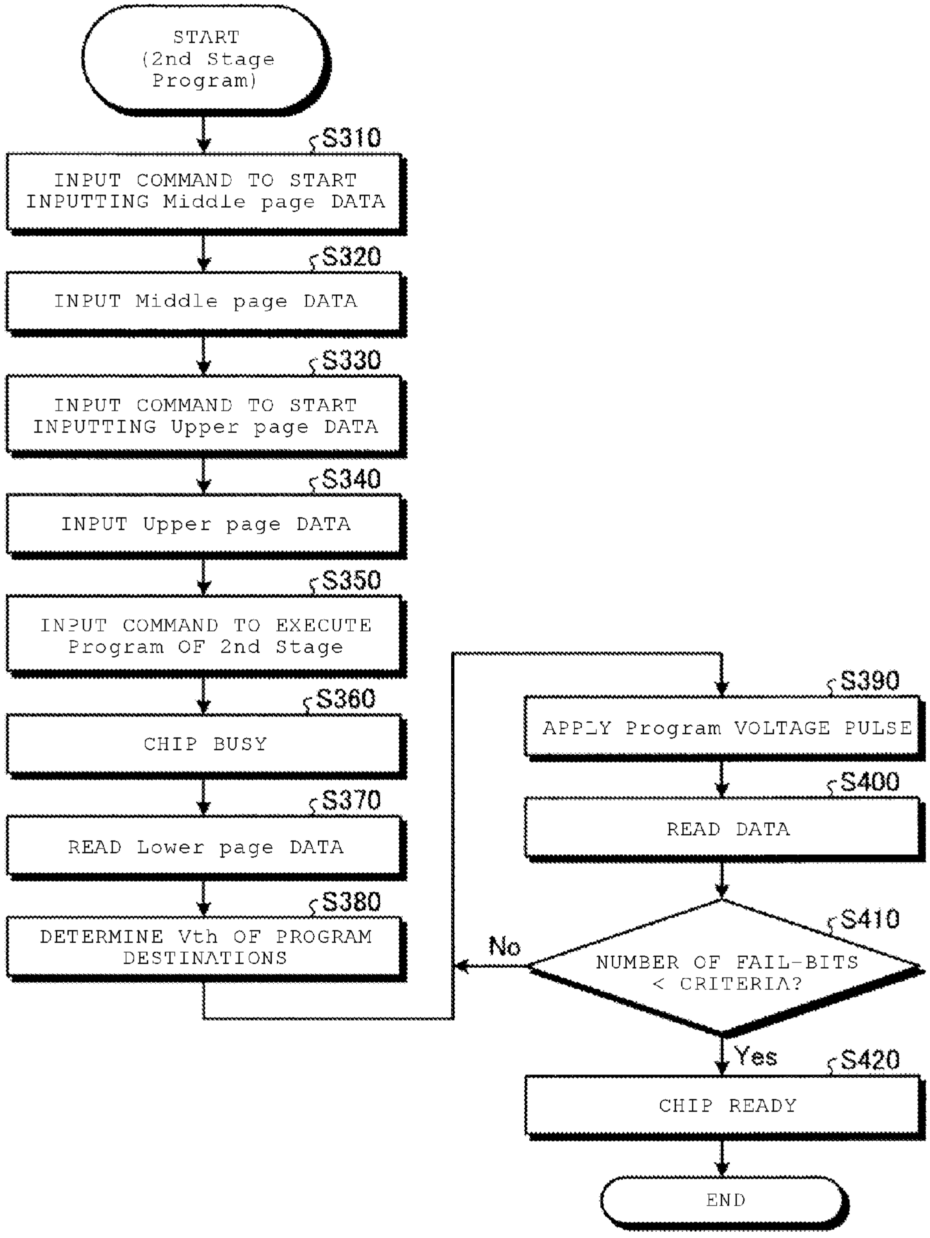
FIG. 9C is a sub-flowchart illustrating a write procedure in a second stage according to the first embodiment.

Here, an example of a write procedure following the program procedure according to the first embodiment will be described with reference to FIGS. 9A to 9C. FIGS. 9A to 9C illustrate the write procedure when write procedure follows the program procedure illustrated in FIG. 8B or 8C. As described above, the memory controller 1 progresses the program stages across the word lines WLi in the non-continuous procedure, and therefore executes program by setting a collection (here, a block) of certain word lines WLi as a collection of program sequences.

FIG. 9A is a flowchart illustrating a first example of a write procedure corresponding one entire block according to the first embodiment. Here, one block is assumed to have n+1 word lines WLi, word lines WL0 to WLn (where n is a natural number). FIG. 9B is a sub-flowchart illustrating a write procedure in the first stage according to the first embodiment. FIG. 9C is a sub-flowchart illustrating a write procedure in the second stage according to the first embodiment. (1st) illustrated to the right of each step in FIG. 9A corresponds to the first stage illustrated in FIG. 9B and (2nd) corresponds to the second stage illustrated in FIG. 9C.

As illustrated in FIG. 9A, when writing starts, the control unit 22 executes the program of the first stage of string St0_word line WL0 (step S10). Next, the control unit 22 executes the program of the first stage of string St1_word line WL0 (step S20). Thereafter, the control unit 22 executes the same processes as steps S10 and S20 on each string. Then, the control unit 22 executes the program of the first stage of string St3_word line WL0 (step S30).

Further, the control unit 22 executes the program of the first stage of string St0_word line WL1 (step S40). Next, the control unit 22 executes the program of the second stage of string St0_word line WL0 (step S50). Next, the control unit 22 executes the program of the first stage of string St1_word line WL1 (step S60). Thereafter, the control unit 22 repeats the same processes as steps S40, S50, and S60 on each word line WLi of each string.

Then, the control unit 22 executes the program of the first stage of string St0_word line WLn (step S70). Next, the control unit 22 executes the program of the second stage of string St0_word line WLn−1 (step S80). Thereafter, the control unit 22 repeats the same processes as steps S70 and S80 on each word line WLi of each string.

Then, the control unit 22 executes the program of the second stage of string St3_word line WLn−1 (step S90). Next, the control unit 22 executes the program of the second stage of string St0_word line WLn (step S100). Next, the control unit 22 executes the program of the second stage of string St1_word line WLn (step S110). Therefore, the control unit 22 executes the same processes as steps S100 and S110 on each string. Then, the control unit 22 executes the program of the second stage of string St3_word line WLn (step S120).

As illustrated in FIG. 9B, in the program of the first stage, a command to start inputting the lower page data is first input from the memory controller 1 to the nonvolatile memory 2 (step S210). Then, the lower page data is input from the memory controller 1 to the nonvolatile memory 2 (step S220). Further, a command to execute the program of the first stage is input from the memory controller 1 to the nonvolatile memory 2 (step S230), and thus the chip becomes busy (step S240).

When data is written, a program voltage pulse is applied once to a plurality of times (step S250). Then, reading of the data is executed to confirm whether the memory cells are moved over the threshold voltage boundary level (step S260).

Further, it is confirmed whether the number of fail-bits of the data in the lower page is less than criteria (determination standard) (step S270). When the number of fail-bits of the data is equal to or greater than the criteria (No in step S270), the processes of steps S250 to S270 are repeated. Conversely, when the number of fail-bits of the data is less than the criteria (Yes in step S270), the chip becomes ready (step S280). In this way, by repeating the application, the reading, and the confirmation, it is possible to move the threshold voltage s of the memory cells within the range of the predetermined threshold voltage distribution.

As illustrated in FIG. 9C, a command to start inputting the data of the middle page is first input from the memory controller 1 to the nonvolatile memory 2 in the program of the second stage (step S310). Then, the data of the middle page is input from the memory controller 1 to the nonvolatile memory 2 (step S320).

Next, a command to start inputting the data of the upper page is input from the memory controller 1 to the nonvolatile memory 2 (step S330). Then, the data of the upper page is input from the memory controller 1 to the nonvolatile memory 2 (step S340). Next, a command to execute the program of the second stage is input from the memory controller 1 to the nonvolatile memory 2 (step S350), and thus the chip becomes busy (step S360).

Thereafter, the control unit 22 executes reading of the lower page data as part of an internal data load (IDL) operation (step S370). Then, the threshold voltages (hereinafter referred to as "Vth") of program destinations of the middle and upper pages is determined based on the lower page data (step S380). Thereafter, the data is written on the middle and upper pages using the determined Vth.

Further, in order to improve reliability of the read data of the IDL, the control unit 22 can also execute reading a plurality of times, makes a majority decision of the read results with the page buffer 24 in the chip, and uses the result of the majority decision as subsequent write data. Of course, at the time of a normal reading operation, the control unit 22 can also execute reading a plurality of times, makes a majority decision of the read result in the chip, and use the result of the majority decision as read data to the outside.

FIG. 9E is a diagram illustrating a majority decision process of read results of a plurality of times. In FIG. 9E, a correct bit is indicated with a circle (○) and an error bit is indicated by a cross (x). FIG. 9E illustrates results of the majority decision when the reading is executed three times.

When the results of (a) three times are all erroneous and (b) the results of two times are all erroneous, the result of the majority decision is determined to be erroneous on each bit. When p is assumed to be settlement in which each bit is erroneous, (a) a three-time erroneous probability is p×p×p=0.2×0.2×0.2 and (b) a two-time erroneous probability is (1−p)×p×p=(1−0.2)×0.2×0.2 in the case of p=0.2. Accordingly, a probability at which the results of the majority decision of three times are determined to be erroneous is (p×p×p)+3×(1−p)×p×p=0.104. In this way, the control unit 22 can improve reliability of read data by executing a majority decision process of the read results of a plurality of times with the page buffer 24 in the chip.

When the data is written on the middle and upper pages, the program voltage pulse is applied once to a plurality of times (step S390). Then, in order to confirm whether the memory cells are moved over the threshold voltage boundary level, reading of data of the middle and upper pages is executed (step S400).

Further, it is confirmed whether the number of fail-bits of the data in the middle and upper pages is less than the criteria (step S410). When the number of fail-bits of the data in the middle and upper pages is equal to or greater than the criteria (No in step S410), the processes of steps S390 to S410 are repeated. Conversely, when the number of fail-bits of the data is less than the criteria (Yes in step S410), the chip becomes ready (step S420).

Figure 9D:
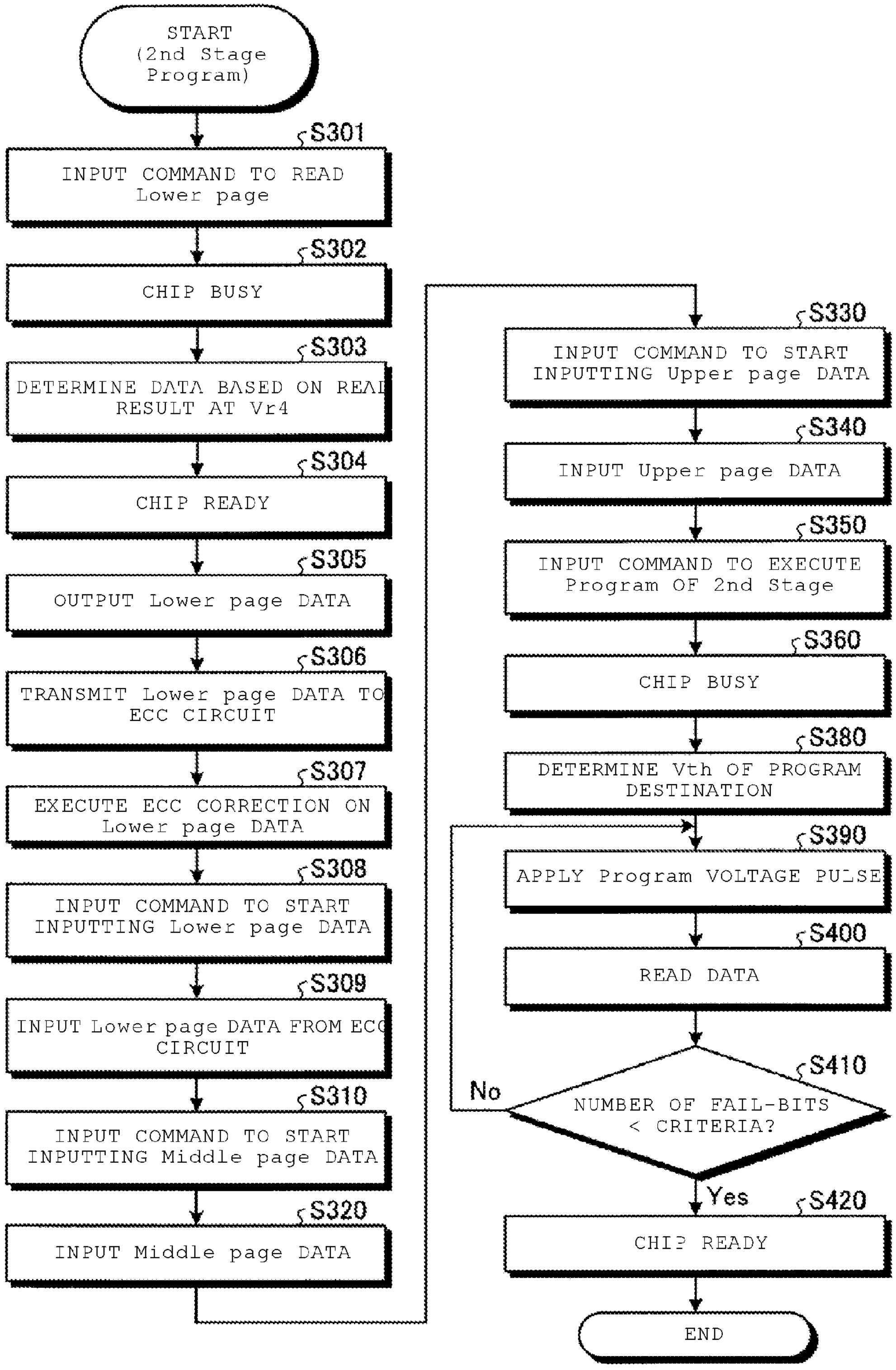
FIG. 9D is a sub-flowchart illustrating a modification example of a write procedure in the second stage according to the first embodiment.
Figure 9E:
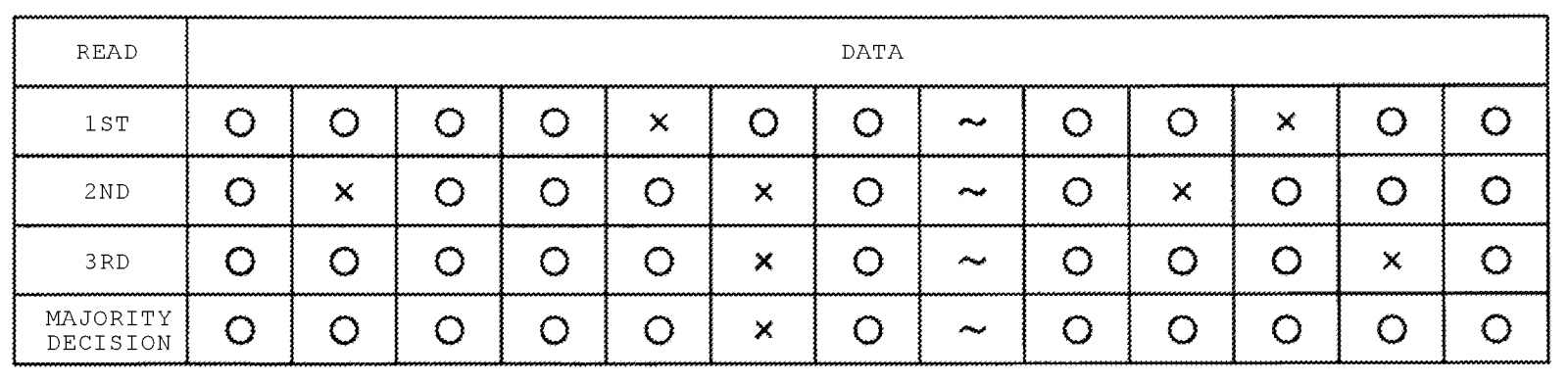

Here, a modification example of the write procedure illustrated in FIG. 9C will be described. FIG. 9D is a sub-flowchart illustrating a modification example of the write procedure in the second stage according to the first embodiment. The process procedure illustrated in FIG. 9D is the same as the process procedure of steps S310 to S420 in FIG. 9C except that the process of step S370 described in FIG. 9C is not executed.

In the case of the process procedure illustrated in FIG. 9D, the processes of steps S301 to S309 are executed before step S310. Specifically, a command to read the lower page is first input from the memory controller 1 to the nonvolatile memory 2 (step S301), and thus the chip becomes busy (step S302).

Thereafter, the control unit 22 executes the reading of the lower page data which is the IDL at the threshold voltage of Vr4. Then, the control unit 22 determines the value of the read data to "0" or "1" based on the read result at the threshold voltage of Vr4 (step S303). Thereafter, the chip becomes ready (step S304).

When the lower page data read by the control unit 22 is output (step S305), the lower page data is transmitted to the ECC circuit 14 (step S306). Thus, the ECC circuit 14 executes ECC correction on the lower page data (step S307).

Then, a command to start inputting the lower page data is input from the memory controller 1 to the nonvolatile memory 2 (step S308). Thus, the ECC circuit 14 inputs the data of the lower page to the nonvolatile memory 2 (step S309).

Thereafter, the processes of steps S310 to S420 are executed. In step S380, Vth of the program destinations of the middle and upper pages is determined based on the lower page data from the ECC circuit 14.

In the above-described program of the second stage, the data of only two pages, the middle and upper pages, is input to the nonvolatile memory 2. However, in the second stage, data corresponding to 3 pages also including the lower page (Vth before start of the second stage) is necessary at Vth of the program destinations of the memory cells. Therefore, in the program of this stage, the control unit 22 first executes an operation of reading the lower page data as preprocessing, combining the lower page data with the data of the input middle and upper pages, and deciding Vth of the program destinations.

The reason for reading the lower page data is that the 1-3-3 coding in which the number of boundaries of the lower page is 1 is adopted. The lower page data is read at the second stage, and thus it is not necessary to input the lower page data at the second stage. That is, since Vth of the program destination is determined based on the lower page data adopting the 1-3-3 coding, the interference between adjacent memory cells between the word lines WLi can be decreased, and thus one piece of page data is completely input by one-time data input.

Thus, when the LM-foggy-fine program is executed at 3 stages adopting the 1-3-3 coding, a memory amount necessary in the write buffer of the memory controller 1 is a plurality of word lines (a maximum of 7 pages). In the present embodiment, however, a memory amount necessary in the write buffer of the memory controller 1 is merely a maximum of 2 pages.

Figure 10A:
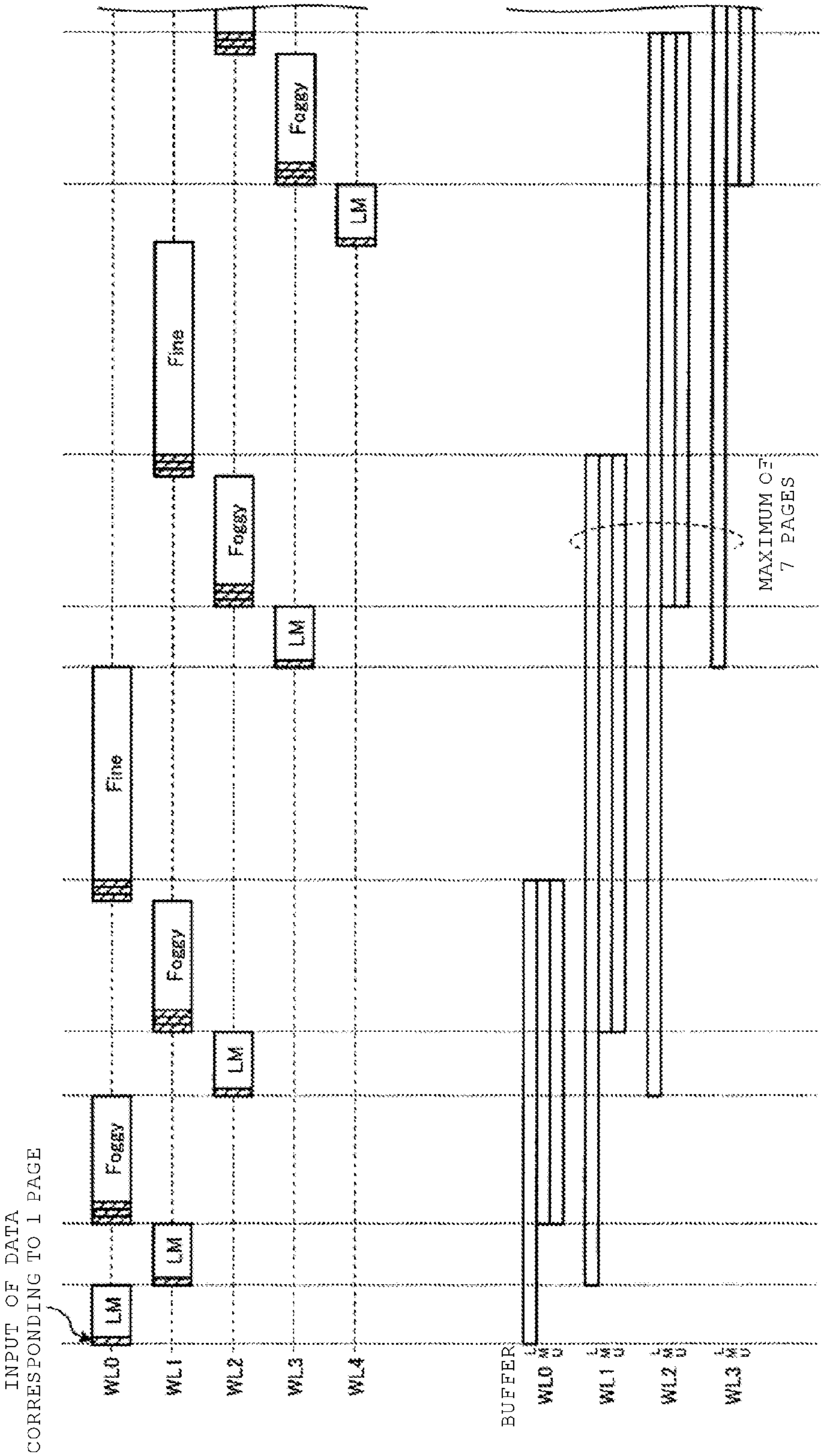
FIG. 10A is a diagram illustrating the amount of data of a buffer in LM-foggy-fine program in which 1-3-3 coding is adopted.
Figure 10B:
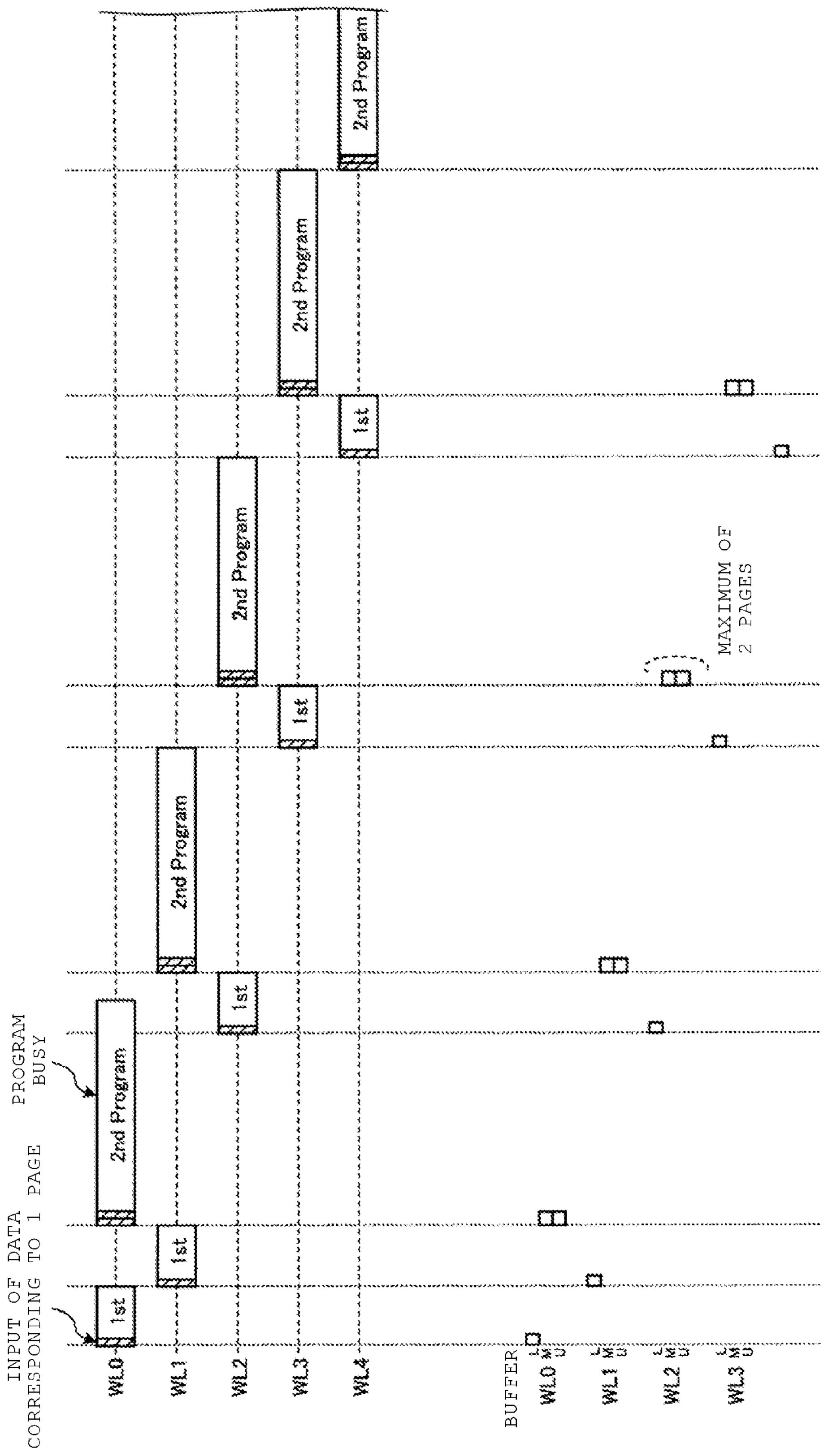
FIG. 10B is a diagram illustrating the amount of data of a buffer in the program according to the first embodiment.

Here, comparison between the process procedure of the LM-foggy-fine program in which the 1-3-3 coding is adopted and a program process procedure of the present embodiment will be described. FIG. 10A is a diagram illustrating the amount of data of a write buffer in the LM-foggy-fine program in which 1-3-3 coding is adopted. FIG. 10A and FIG. 10B to be described below illustrate time charts of input of write data of a block and execution of the program on the upper side and illustrate time charts of a period necessary to retain data in the write buffer on the lower side. To facilitate the description, FIG. 10A and FIG. 10B to be described below illustrate cases in which the number of strings in one block is 1. When the number of strings is plural, a memory amount corresponding to a multiple of the number of strings is necessary.

In the case of the LM-foggy-fine program of the 1-3-3 coding, input of data corresponding to 1 page and program (the program of the LM stage) corresponding to 1 page are executed at the LM stage which is the first stage. In the case of the LM-foggy-fine program of the 1-3-3 coding, input of data corresponding to 3 pages and program (the program of the foggy stage) corresponding to 3 pages are executed at the foggy stage which is the second stage. In the case of the LM-foggy-fine program of the 1-3-3 coding, input of data corresponding to pages and program (the program of the fine stage) corresponding to 3 pages are executed at the fine stage which is the third stage.

Then, until the program starts at the fine stage in the word lines WL0, WL1, WL2, and the like, it is necessary to store the data corresponding to 1 page written on the LM stage and the data corresponding to 3 pages written on the foggy stage in the write buffer.

In the LM-foggy-fine program, the data corresponding to the 3 lower, middle, and upper pages is not continuously written to decrease the interference between the adjacent memory cells. For example, after the LM stage to the word line WL0 is executed and before the foggy stage to the word line WL0 is executed, the LM stage to the word line WL1 adjacent to the word line WL0 is executed. Further, after the foggy stage to the word line WL0 is executed and before the fine stage to the word line WL0 is executed, the foggy stage to the word line WL1 adjacent to the word line WL0 is executed. Similarly, after the LM stage to the word line WL1 is executed and before the foggy stage to the word line WL1 is executed, the LM stage to the word line WL2 adjacent to the word line WL1 is executed. Further, after the foggy stage to the word line WL1 is executed and before the fine stage to the word line WL1 is executed, the foggy stage to the word line WL2 adjacent to the word line WL1 is executed.

In this way, in the LM-foggy-fine program, it takes a long time to execute the LM stage to the fine state in each word line WLi. For example, the program of the following (P1) to (P5) stages is executed between the LM stage and the fine stage in the word line WL1:

(P1) the LM stage in regard to the word line WL2;

(P2) the foggy stage in regard to the word line WL1;

(P3) the fine stage in regard to the word line WL0;

(P4) the LM stage in regard to the word line WL3; and (P5) the foggy stage in regard to the word line WL2.

In this way, in the case of the LM-foggy-fine program of the 1-3-3 coding, input data is only the data of the lower page in the first LM stage. Incidentally, in the case of this method, it is necessary to retain the data of the 3 lower, middle, and upper pages in the write buffer until the data input of the final third fine stage is completed. To decrease the interference between the adjacent memory cells, it is necessary to retain the data in the plurality of word lines WLi in the write buffer. For example, when the foggy stage is executed in the word line WL2, it is necessary to retain the data corresponding to 3 pages in regard to the word line WL1, the data of 3 pages in regard to the word line WL2, and the data of 1 page in regard to the word line WL3 in the write buffer. In this way, in the case of the LM-foggy-fine program of the 1-3-3 coding, it is necessary to retain the data corresponding to a maximum of 7 pages in the write buffer.

FIG. 10B is a diagram illustrating the amount of data of a write buffer (a buffer data amount) in the program according to the first embodiment. In the program according to the present embodiment, the program of two stages is used with the 1-3-3 coding. In the program according to the present embodiment, input of the data corresponding to 1 page (the lower page) and the program (the first program) corresponding to 1 page are executed at the first stage. In the program according to the present embodiment, input of the data corresponding to 2 pages (the middle and upper pages) and the program (the second program) corresponding to 2 pages are executed at the second stage.

When the data of each stage is input in the word lines WL0, WL1, WL2, and the like, the data may be stored in the write buffer. When the program starts, the data may be deleted from the write buffer. For example, when the data at the first stage is input, the data is stored in the write buffer. When the program at the first stage starts, the data stored in the write buffer may be deleted. Similarly, when the data at the second stage is input, the data is stored in the write buffer. When the program at the second stage starts, the data stored in the write buffer may be deleted.

Even in the program according to the present embodiment, the data corresponding to the 3 lower, middle, and upper pages is not continuously written to decrease the interference between the adjacent memory cells. For example, after the first stage to the word line WL0 is executed and before the second stage to the word line WL0 is executed, the first stage to the word line WL1 adjacent to the word line WL0 is executed. Similarly, after the first stage to the word line WL1 is executed and before the second stage to the word line WL1 is executed, the first stage to the word line WL2 adjacent to the word line WL1 is executed.

In this way, since the program according to the present embodiment is the program of two stages, it takes a short time to execute the processes from the first stage to the second stage in each word line WLi. For example, the program of the stage of the following (P11) is executed between the first stage and the second stage in the word line WL1:

(P11) the first stage in regard to the word line WL2.

In the case of the present embodiment, the data may be retained in the write buffer only between the start of the input of the data and the end of the input of the data. When the program starts, the data may be deleted from the write buffer. Therefore, in the case of the program according to the present embodiment, the data necessarily retained in the write buffer is data corresponding to a maximum of 2 pages.

In this way, in the present embodiment, the data of all the pages is necessary in only the program of one-time stage. Thus, when the input of the data is completed, the data in the write buffer can be discarded. Therefore, the present embodiment, the number of pages necessarily retained simultaneously in the write buffer may be small.

The page data programmed to the nonvolatile memory 2 is temporarily retained in the write buffer of the RAM 11, and then is input to the nonvolatile memory 2 at the time of program. In the present embodiment, cost is reduced since the necessary capacity of the RAM 11 can be decreased.

When the LM-foggy-fine program or the foggy-fine program is used, the data of all the pages has to be transmitted twice or three times. Therefore, it takes some time to transmit the data and extra power consumption is necessary at the time of transmission. In the present embodiment, since the data of all the pages is completely transmitted through one-time data transmission of each page, the transmission time and the power consumption can be suppressed to about ½ to ⅓.

Figure 11A:
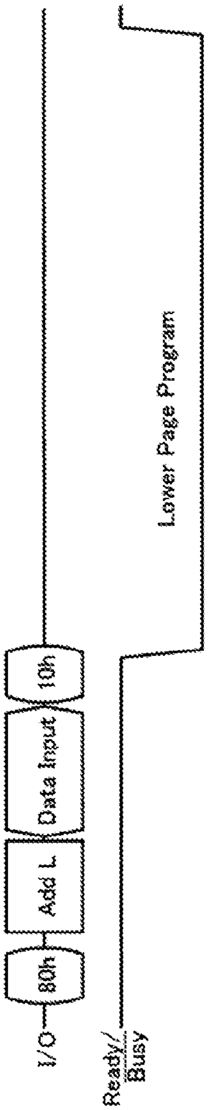
FIGS. 11A and 11B illustrate examples of sequences of external program commands according to the first embodiment.
Figure 11B:
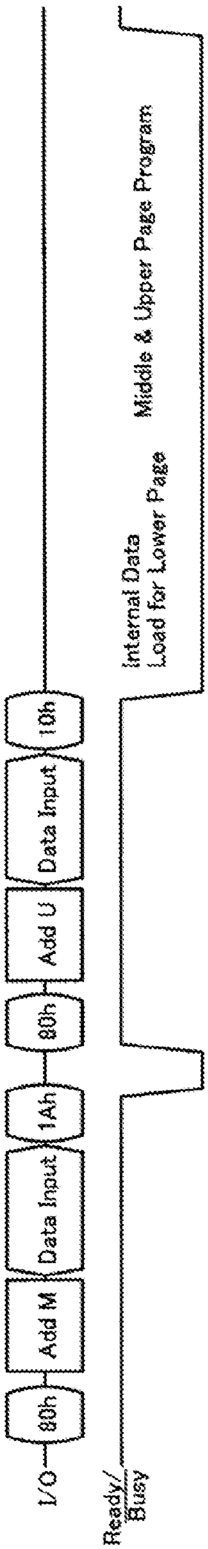

FIGS. 11A and 11B are diagrams illustrating examples of sequences of external program commands according to the first embodiment. FIG. 11A illustrates a sequence of external program commands at the first stage according to the first embodiment. FIG. 11B illustrates a sequence of an external program command at the second stage according to the first embodiment.

As illustrated in FIG. 11A, at the first stage, a program start command (80*h*) is input, the address of a program target block page (the address of the lower page) is subsequently input, and the program data of the lower page is subsequently input. Then, when a program execution command (10*h*) is finally input, the chip become busy and an operation of the program starts inside the memory chip. By inputting these program commands, the lower page is programmed.

As illustrated in FIG. 11B, at the second stage, the program start command (80*h*) is input, the address of a program target block page (the address of the middle page) is subsequently input, and the program data of the middle page is subsequently input. Thereafter, a connection command (1Ah) of the program command is input and the program data of the upper page is presently input in the same sequence. Then, when the program execution command (10*h*) is finally input, the chip become busy and an operation of the program starts inside the memory chip. By inputting these program commands, the reading of the lower page is executed and the middle and upper pages are further programmed. Either the program data of the middle page or the program data of the upper page may be input earlier.

Here, a page reading process will be described. A page reading method is different according to before the program in regard to the word lines WLi including a reading target page is written on the second stage and after the program is completely written on the second stage.

Before the writing of the second stage, the written data is valid for only the lower page. Therefore, the control unit 22 reads the data from the memory cells only when the read data is the lower page. Then, when the read data is the other pages, the control unit 22 forcibly executes control such that all "1s" are output as the read data without executing an operation of reading the memory cells.

On the other hand, in the case of the word lines WLi completed up to the second stage, the control unit 22 reads the memory cells of the read page which is any of the upper, middle, and lower pages. In this case, since a necessary read voltage is different according to which page is read, the control unit 22 executes only reading necessary according to the selected page.

According to the coding illustrated in FIG. 6, the number of boundaries between the threshold voltage states in which the lower page data is changed is only 1, the control unit 22 determines data according to in which range the threshold voltage is located between 2 ranges separated by this boundary. For example, when the threshold voltage is lower than Vr4, the control unit 22 executes control such that "1" is output as data of the memory cell. Conversely, when the threshold voltage is higher than Vr4, the control unit 22 executes control such that "0" is output as data of the memory cell.

Since the number of boundaries between the threshold voltage states in which the data of the middle or upper page is changed is 3, the control unit 22 determines data according to in which range the threshold voltage is located among 4 ranges separated by these boundaries.

Figure 12A:
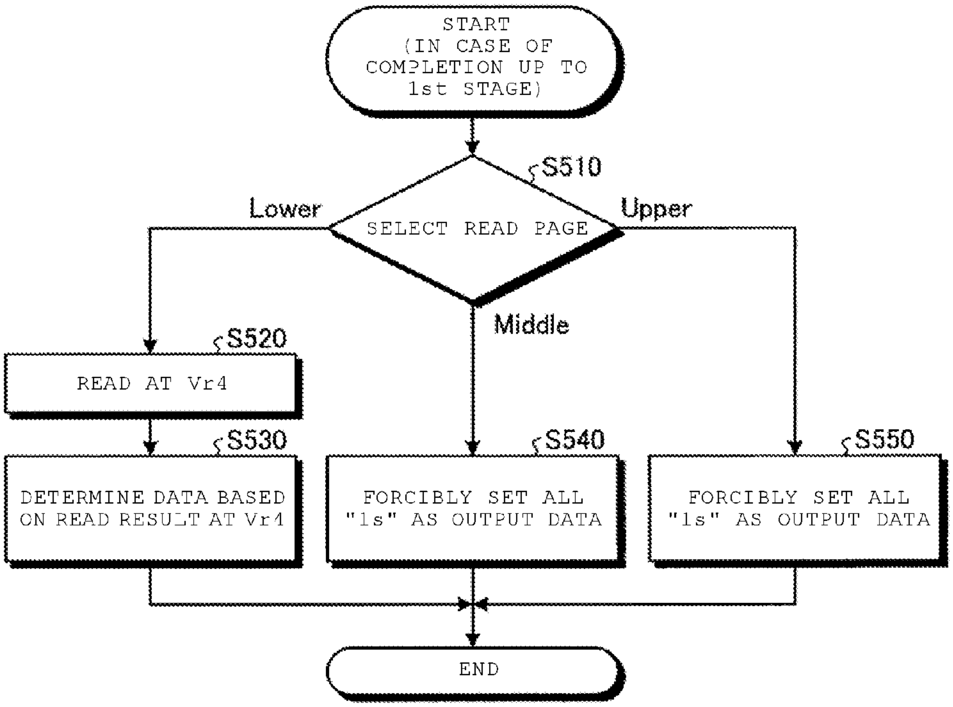
FIG. 12A is a flowchart illustrating a process procedure of page reading in a word line in which program is completed up to the first stage in the storage device according to the first embodiment.
Figure 12B:
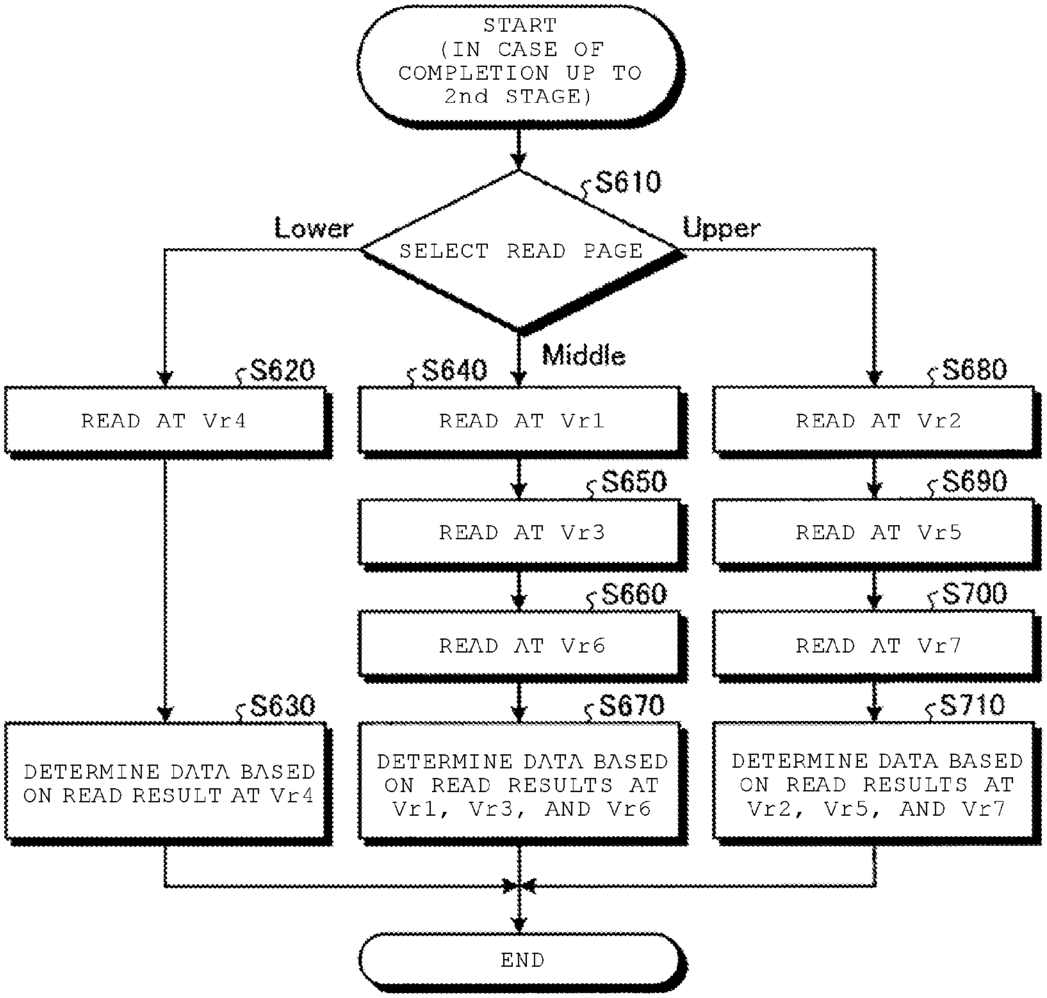
FIG. 12B is a flowchart illustrating a process procedure of page reading in a word line in which program is completed up to the second stage in a storage device according to the first embodiment.

Hereinafter, a specific process procedure of page reading will be described. FIG. 12A is a flowchart illustrating a process procedure of page reading in the word line before writing of the second stage in the storage device according to the first embodiment. FIG. 12B is a flowchart illustrating a process procedure of page reading in the word line in which program is completed up to the second stage in the storage device according to the first embodiment.

As illustrated in FIG. 12A, in the case of the word line WLi before writing of the second stage, the control unit 22 selects a read page (step S510). When the read page is the lower page (lower in step S510), the control unit 22 executes reading at the threshold voltage of Vr4 (step S520). Then, the control unit 22 determines the value of the read data to "0" or "1" based on a read result at the threshold voltage of Vr4 (step S530).

When the read page is the middle page (middle in step S510), the control unit 22 forcibly executes control such that all "1s" are output as the output data of the memory cells (step S540).

When the read page is the upper page (upper in step S510), the control unit 22 forcibly executes control such that all "1s" are output as the output data of the memory cells (step S550).

As illustrated in FIG. 12B, in the case of the word line WLi in which the program is completed up to the second stage, the control unit 22 selects a read page (step S610). When the read page is the lower page (lower in step S610), the control unit 22 executes reading at the threshold voltage of Vr4 (step S620). Then, the control unit 22 determines the value of the read data to "0" or "1" based on a read result at the threshold voltage of Vr4 (step S630).

When the read page is the middle page (middle in step S610), the control unit 22 executes the reading at the threshold voltages of Vr1, Vr3, and Vr6 (steps S640, S650, and S660). Then, the control unit 22 determines the value of the read data to "0" or "1" based on read results at the threshold voltages of Vr1, Vr3, and Vr6 (step S670).

When the read page is the upper page (upper in step S610), the control unit 22 executes the reading at the threshold voltages of Vr2, Vr5, and Vr7 (steps S680, S690, and S700). Then, the control unit 22 determines the value of the read data to "0" or "1" based on read results at the threshold voltages of Vr2, Vr5, and Vr7 (step S710).

The memory controller 1 can manage and identify whether before or after the program in regard to the word lines WLi is completely written on the second stage. The memory controller 1 executes the control of the program. Therefore, when the memory controller 1 records a progress status, the memory controller 1 can easily refer to the address of the nonvolatile memory 2 and the state of the program at the address. In this case, when the memory controller 1 executes reading from the nonvolatile memory 2, the memory controller 1 identifies a program state of the word line WLi including a target page address and issues a read command according to the identified state.

Figure 13A:
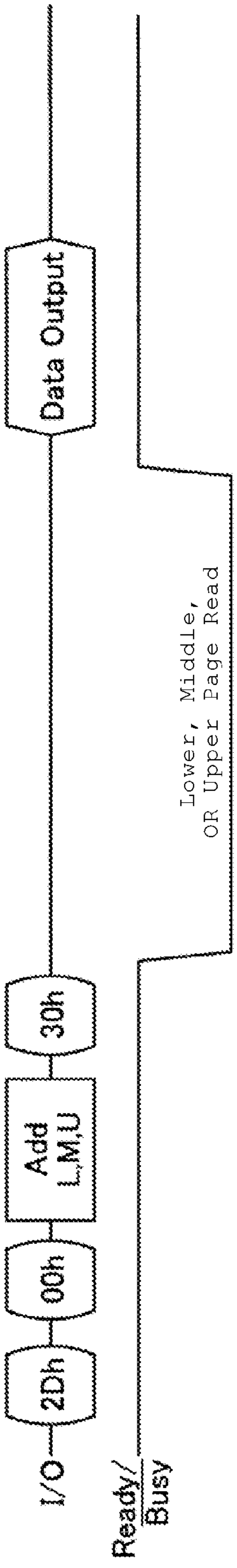
FIGS. 13A and 13B illustrate examples of sequences of an external read command according to the first embodiment.
Figure 13B:
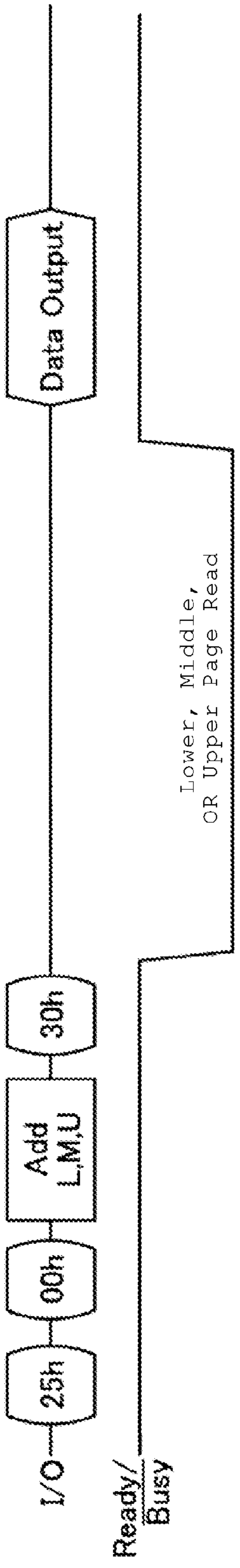

FIGS. 13A and 13B are diagrams illustrating an example of a sequence of external read commands according to the first embodiment. FIG. 13A illustrates a sequence of external read commands in the word lines WLi in which the program is completed up to the first stage in the storage device according to the first embodiment. FIG. 13B illustrates a sequence of external read commands in the word lines WLi in which the program is completed up to the second stage in the storage device according to the first embodiment.

As illustrated in FIG. 13A, in the case of the word lines WLi before the writing of the second stage, a command (2Dh) indicating a state before the writing of the second stage is first input as a command to execute a read operation. Thereafter, a read start command (00*h*) is input, and the address of a read target block page (the address of the lower page, the middle page, or the upper page) is subsequently input. Then, when a read execution command (30*h*) is finally input, the chip become busy and a reading operation inside the memory chip starts. By inputting these program commands, the data is read from the lower page, the middle page, or the upper page. Thereafter, the chip enters a ready state and the read data is output.

On the other hand, as illustrated in FIG. 13B, in the case of the word lines WLi in which the program is completed up to the second stage, a command (25*h*) indicating a completion state up to the second stage is first input as a command to execute a read operation. Thereafter, the read start command (00*h*) is input, and the address of a read target block page (the address of the lower page, the middle page, or the upper page) is subsequently input. Then, when the read execution command (30*h*) is finally input, the chip becomes busy and a reading operation inside the memory chip starts. By inputting these program commands, the data is read from the lower page, the middle page, or the upper page. Thereafter, the chip enters a ready state and the read data is output.

In this way, in the first embodiment, when the nonvolatile memory 2 (a NAND memory storing 3 bits/cell having a 3-dimensional structure or a 2-dimensional structure) is programmed, the 1-3-3 data coding is adopted and the stages of the program is set to 2 stages. In this way, since the nonvolatile memory 2 is programmed with 2 stages, the amount of data input at the time of programming the data can be reduced and the amount of a write buffer necessary for the memory controller 1 can be suppressed. A deviation of a bit error ratio between the pages of the nonvolatile memory 2 can be reduced and cost of ECC can be lowered. Since the data is transmitted once for each page, a transmission time and power consumption can be suppressed.

Since each program stage is executed stepping the word line WLi, the amount of interference between adjacent cells with the adjacent word lines WLi can be reduced. Since the 1-3-3 data coding is used, an IDL margin before the second stage can be expanded, and thus reliability of the write sequence can be improved. Since the 1-3-3 data coding is used, the program of the first stage, that is, the program of the lower page, can be accelerated by setting the number of threshold voltage boundaries in the lower page as 1. The acceleration of the program of the first stage can be achieved by gradually stepping up the write voltage at the time of repeating the writing and verifying of the writing and setting a step voltage at the time of writing to be higher than the step voltage at the time of programming the second stage.

Second Embodiment

Next, a second embodiment will be described with reference to FIGS. 14A, 14B, and 15. In the second embodiment, the program of the second stage of the word line WLn−1 and the program of the first stage of the word line WLn are executed collectively. In the present embodiment, the same data coding as the data coding described in FIG. 6 in the first embodiment is used in the description.

In the flowchart of the program illustrated in FIG. 9A, the program of the first stage and the program of the second stage are both separated one by one, and each program command and each piece of program data are input at the time of each program. In the present embodiment, the program command and the program data are input collectively as soon as possible.

For example, as illustrated in FIG. 8B, program of the first stage of the word line WLn and program of the second stage of the word line WLn−1 are inevitably continued except for end portions of the head and the final of the block. Accordingly, in the present embodiment, this portion is input with a mass of commands. That is, pieces of program data of the lower page of the word line WLn and the middle and upper page of the word line WLn−1 are collectively input by inputting the commands once. The same amount of data as the amount of data input by 3 pages is input collectively in regard to the data of the lower, middle, and the upper pages (here, in this case the pages in the same word line WLi) with a one-time program command even when the LM-foggy-fine program is adopted.

In this way, by collectively inputting the program commands and the program data, the input of the command and the frequency of polling (it is periodically checked whether the state of the busy chip returns to the ready state) in the control executed by the memory controller 1 are reduced, and thus acceleration and simplicity of the storage device can be achieved.

Here, an example of a write procedure following the program procedure according to the second embodiment will be described with reference to FIGS. 14A and 14B. FIGS. 14A and 14B illustrate the write procedure when the write procedure follows the program procedure illustrated in FIG. 8B. The same processes as the processes described in FIGS. 9A to 9C among the processes illustrated in FIG. 14A or 14B will not be described.

Figure 14A:
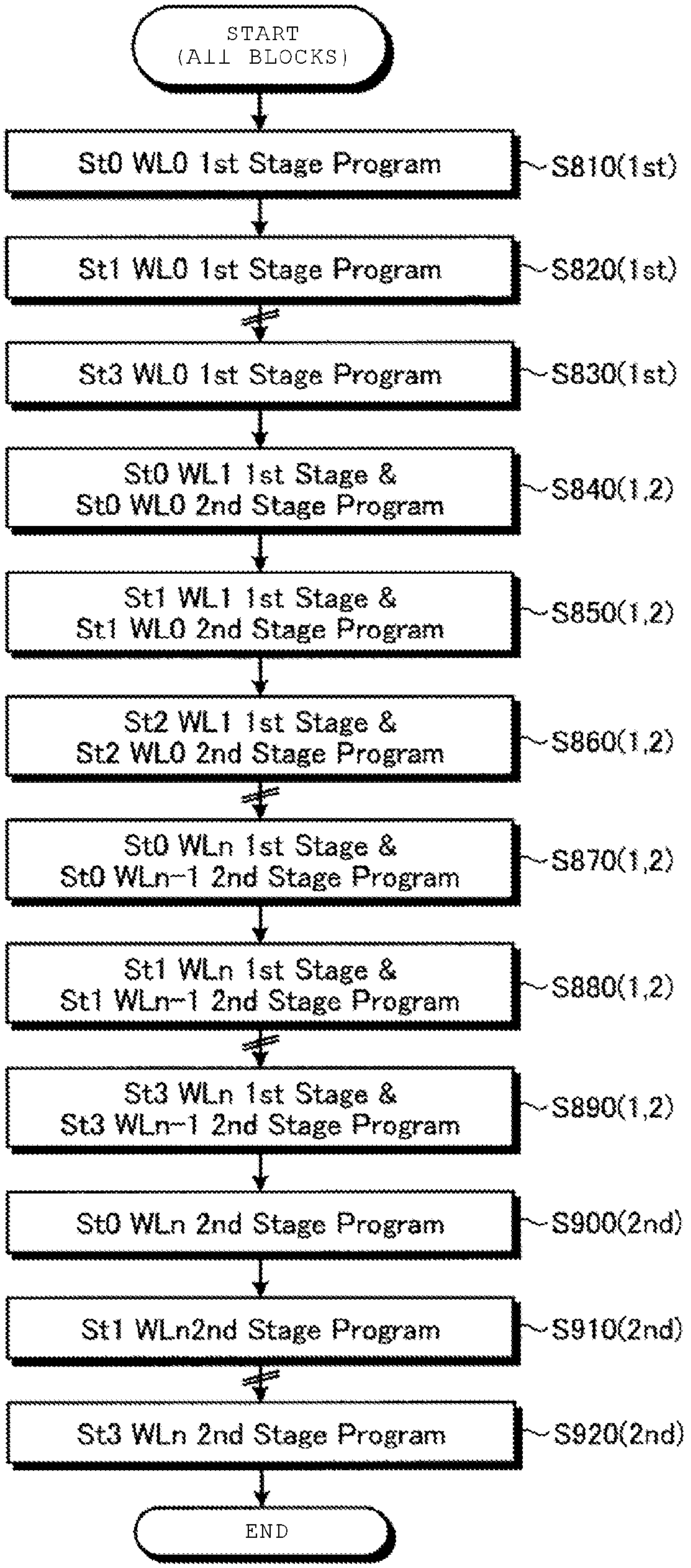
FIG. 14A is a flowchart illustrating a write procedure corresponding one entire block according to a second embodiment.

FIG. 14A is a flowchart illustrating an example of a write procedure corresponding one entire block according to a second embodiment. Here, one block is assumed to include n+1 word lines WLi, the word lines WL0 to WLn (where n is a natural number). FIG. 14B is a sub-flowchart illustrating a write procedure of the first stage and the second stage according to the second embodiment. (1st) illustrated to the right of each step in FIG. 14A corresponds to the first stage illustrated in FIG. 9B, (2nd) corresponds to the second stage illustrated in FIG. 9C, and (1, 2) corresponds to the first stage and the second stage illustrated in FIG. 14B.

As illustrated in FIG. 14A, the control unit 22 executes the processes of steps S810 to S830 which are the same processes of steps S10 to S30 when writing starts. Thus, the program of the first stage of the word line WL0 in the strings St0 to St3 is executed.

Further, the control unit 22 executes the program of the first stage of stringSt0_word line WL1 and the program of the second stage of stringSt0_word line WL0 (step S840). Next, the control unit 22 executes the program of the first stage of stringSt1_word line WL1 and the program of the second stage of stringSt1_word line WL0 (step S850). Next, the control unit 22 executes the program of the first stage of stringSt2_word line WL1 and the program of the second stage of stringSt2_word line WL0 (step S860). Thereafter, the control unit 22 repeats the same processes as those of steps S840, S850, and S860 in regard to each word line WLi of each string.

Then, the control unit 22 executes the program of the first stage of stringSt0_word line WLn and the program of the second stage of stringSt0_word line WLn−1 (step S870). Next, the control unit 22 executes the program of the first stage of stringSt1_word line WLn and the program of the second stage of stringSt1_word line WLn−1 (step S880). Thereafter, the control unit 22 repeats the same processes as those of steps S870 and S880 in regard to each word line WLi of each string.

Then, the control unit 22 executes the program of the first stage of string St3_word line WLn and the program of the second stage of string St3_word line WLn−1 (step S890). Next, the control unit 22 executes the processes of steps S900 to S920 which are the same processes as those of steps S100 to S120. Thus, the program of the second stage of the word lines WLn of the strings St0 to St3 is executed.

In this way, the program of only the first stage is executed in the head of the block as in the first embodiment, and the program of only the second stage is executed in the final of the block as in the first embodiment. In this case, the program of only the first stage is executed in the procedure illustrated in FIG. 9B and the program of only the second stage is executed in the procedure illustrated in FIG. 9C.

Figure 14B:
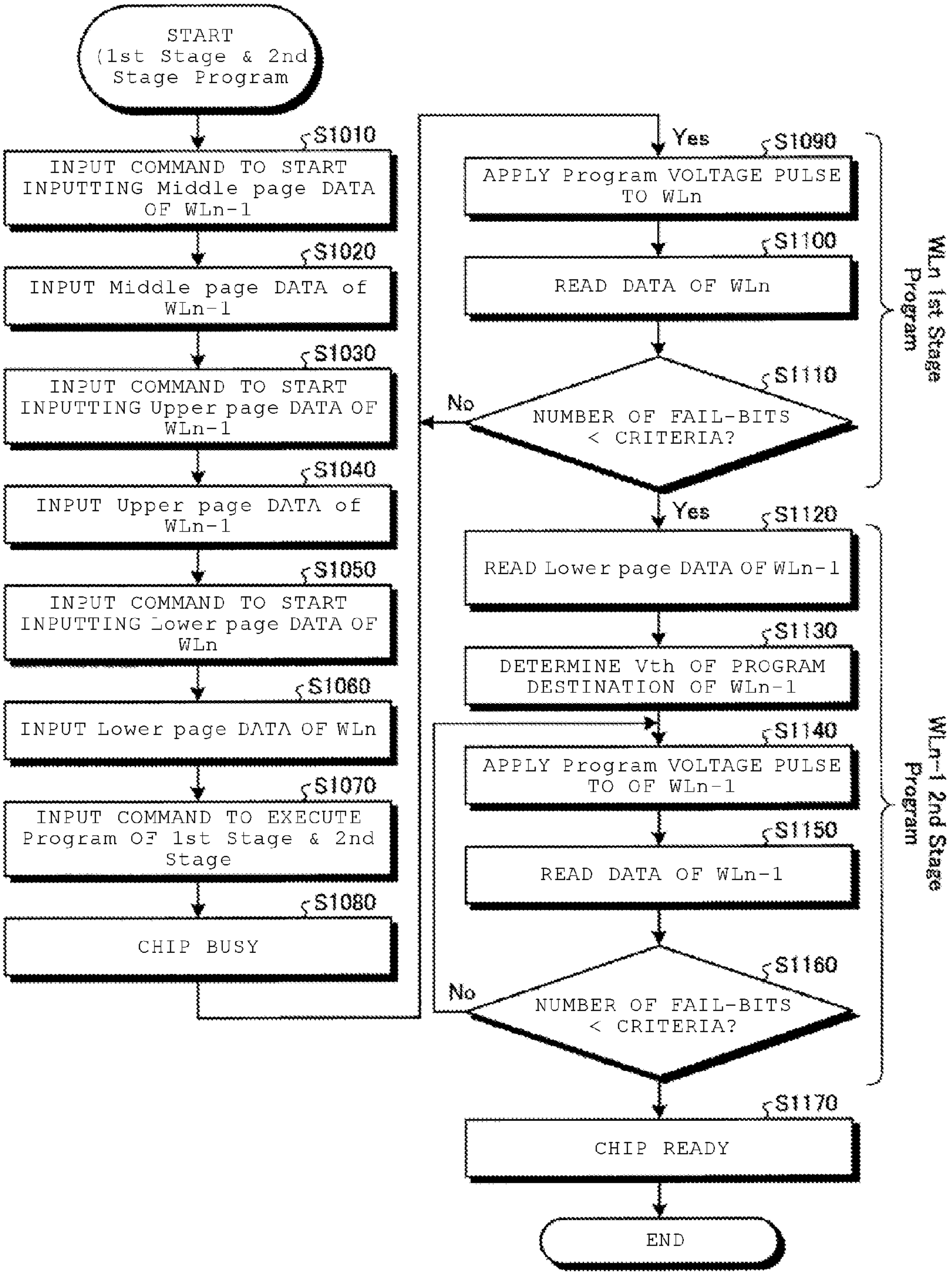
FIG. 14B is a sub-flowchart illustrating a write procedure of a first stage and a second stage according to the second embodiment.

As illustrated in FIG. 14B, for the program of the first stage and the program of the second stage, the program of the first stage is executed continuously after the program of the second stage is executed. Specifically, a command to start inputting the data of the middle page of the word line WLn−1 is input from the memory controller 1 to the nonvolatile memory 2 (step S1010). Then, the data of the middle page of the word line WLn−1 is input from the memory controller 1 to the nonvolatile memory 2 (step S1020).

Next, a command to start inputting the data of the upper page of the word line WLn−1 is input from the memory controller 1 to the nonvolatile memory 2 (step S1030). Then, the data of the upper page of the word line WLn−1 is input from the memory controller 1 to the nonvolatile memory 2 (step S1040).

Next, a command to start inputting the data of the lower page of the word line WLn is input from the memory controller 1 to the nonvolatile memory 2 (step S1050). Then, the data of the lower page of the word line WLn is input from the memory controller 1 to the nonvolatile memory 2 (step S1060).

Next, a command to execute the program of the first stage and the program of the second stage is input from the memory controller 1 to the nonvolatile memory 2 (step S1070), and thus the chip becomes busy (step S1080).

Thereafter, the program voltage pulse is applied to the lower page of the word line WLn once to a plurality of times (step S1090). Then, reading of the data of the lower page of the word line WLn is executed to confirm whether the memory cells are moved over the threshold voltage boundary level (step S1100).

Further, it is confirmed whether the number of fail-bits of the data in the lower page is less than the criteria (step S1110). When the number of fail-bits of the data in the lower page is equal to or greater than the criteria (No in step S1110), the processes of steps S1140 to S1160 are repeated. Conversely, when the number of fail-bits of the data is less than the criteria (Yes in step S1110), the lower page data of the word line WLn−1 is read (step S1120).

Then, Vth (threshold voltages) of program destinations of the middle and upper pages is determined based on the lower page data of the word line WLn−1 (step S1130). Thereafter, data is written on the middle and upper pages of the word line WLn−1 using the determined Vth.

When the data is written on the middle and upper pages, the program voltage pulse is applied to the middle and upper pages of the word line WLn−1 once to a plurality of times (step S1140). Then, reading of the data of the middle and upper pages of the word line WLn−1 is executed to confirm whether the memory cells are moved over the threshold voltage boundary level (step S1150).

Further, it is confirmed whether the number of fail-bits of the data in the middle and upper pages is less than the criteria (step S1160). When the number of fail-bits of the data in the middle and upper pages is equal to or greater than the criteria (No in step S1160), the processes of steps S1140 to S1160 are repeated. Conversely, when the number of fail-bits of the data is less than the criteria (Yes in step S1160), the chip becomes ready (step S1170).

Any of the processes of steps S1010, S1030, and S1050 may be executed earlier. Any of the processes of the steps S1020, S1040, and S1060 may be executed earlier. However, the process of step S1020 is executed later than the process of step S1010, the process of step S1040 is executed later than the process of step S1030, and the process of step S1060 is executed later than the process of step S1050.

The processes of steps S1120 to S1160 illustrated in FIG. 14B correspond to the program of the second stage of the word line WLn−1. The processes of steps S1090 to S1110 correspond to the program of the first stage of the word line WLn.

In this way, the program of the first stage of the word line WLn is executed earlier than the program of the second stage of the word line WLn−1, as described above with reference to FIG. 14B. This is because the program of the first stage of the word line WLn is executed earlier so that there is no influence of the adjacent cells on the cells of the word line WLn−1 on which 8-value Vth is written.

In this way, in the present embodiment, the pieces of data corresponding to 3 pages, the data of the middle and upper pages of the word line WLn−1 and the data of the lower page of the word line WLn are continuously input.

Figure 15:
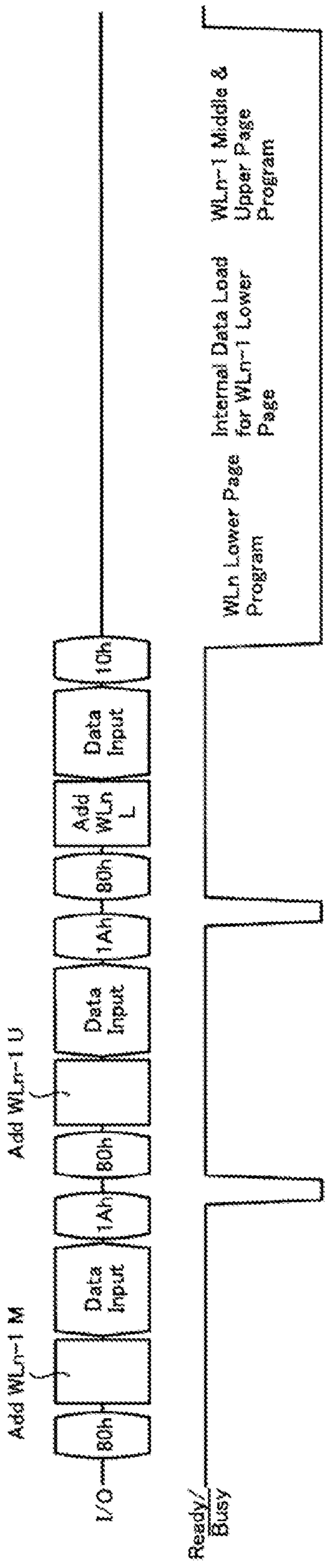
FIG. 15 is a diagram illustrating an example of a sequence of external program commands according to the second embodiment.

FIG. 15 is a diagram illustrating an example of a sequence of external program commands according to the second embodiment. The sequence of the external program commands in the first stage is the same as the sequence illustrated in FIG. 11A. The sequence of the external program commands in the second stage is the same as the sequence illustrated in FIG. 11B. Accordingly, a sequence of external program commands at the time of continuously programming the second stage and the first stage will be described here. When the first stage and the second stage are continuously programmed, commands of the second stage and commands of the first stage are continuously input.

Specifically, as illustrated in FIG. 15, after a program start command (80*h*) is input, the address of a program target block page (the address of the middle page of the word line WLn−1) is input, and the program data of the middle page of the word line WLn−1 is subsequently input. Thereafter, a connection command (1Ah) of the program command is input and the program data of the upper page of the word line WLn−1 is now input in the same sequence. Then, the connection command (1Ah) of the program command is input and the program data of the lower page of the word line WLn is now input in the same sequence. Then, when a program execution command (10*h*) is finally input, the chip becomes busy and an operation of the program starts inside the memory chip.

By inputting these program commands, the lower page of the word line WLn is programmed. Reading of the lower page data of the word line WLn−1 is executed as the IDL. Then, Vth of the program destinations of the middle and upper pages is determined based on the lower page data, and the middle and upper pages of the word line WLn−1 are programmed at the determined Vth.

As another modification example, after the program command is input, the reading of the lower page data of the word line WLn−1 is executed earlier as the IDL and the lower page of the word line WLn is subsequently programmed. Next, Vth of the program destinations of the middle and upper pages is determined and the program of the middle page and the program of the upper page of the word line WLn can also be executed at the determined Vth. In this way, before the interference between adjacent cells due to writing of the word line WLn is received, the lower page data of the word line WLn−1 of the IDL can be read.

In the present embodiment, the actual execution order of the program with the mass of commands of the first stage of the word line WLn and the second stage of the word line WLn−1 can be modified. That is, either the program of the lower page of the word line WLn or the reading of the lower page data of the word line WLn−1 as the IDL, as illustrated in FIG. 15, may be executed earlier or the program and the reading may be switched. When the IDL (the reading of the lower page data of the word line WLn−1) is executed earlier than the program of the lower page of the word line WLn, the IDL can be executed without receiving the influence of the program of the lower page of the word line WLn.

In this way, in the second embodiment, since the program of the second stage of the word line WLn−1 and the program of the first stage of the word line WLn are executed together, the input of the commands or the polling frequency is reduced. Accordingly, acceleration and simplicity of the storage device can be achieved.

Third Embodiment

Next, a third embodiment will be described with reference to FIGS. 16 to 19. In the third embodiment, when the program of the second stage is executed, program is first executed on the memory cells in which a Vth distribution state is scheduled to be equal to or higher than a region D and program is subsequently executed on the memory cells in which a Vth distribution state is scheduled to be equal to or lower than a region C. In the present embodiment, the same data coding as the data coding described in FIG. 6 in the first embodiment is used in the description.

During the program of multi-bits/cell, when power shutdown occurs abruptly during the execution of the program, data is destructed. In this case, information of target program data of the program executed at the time of occurrence of power shutdown is lost from memory cells. In this case, program has been already completed and previous program data is also lost in some cases just as the data is discarded from the write buffer of the memory controller 1. As a result, data recovery may not be possible.

Figure 16:
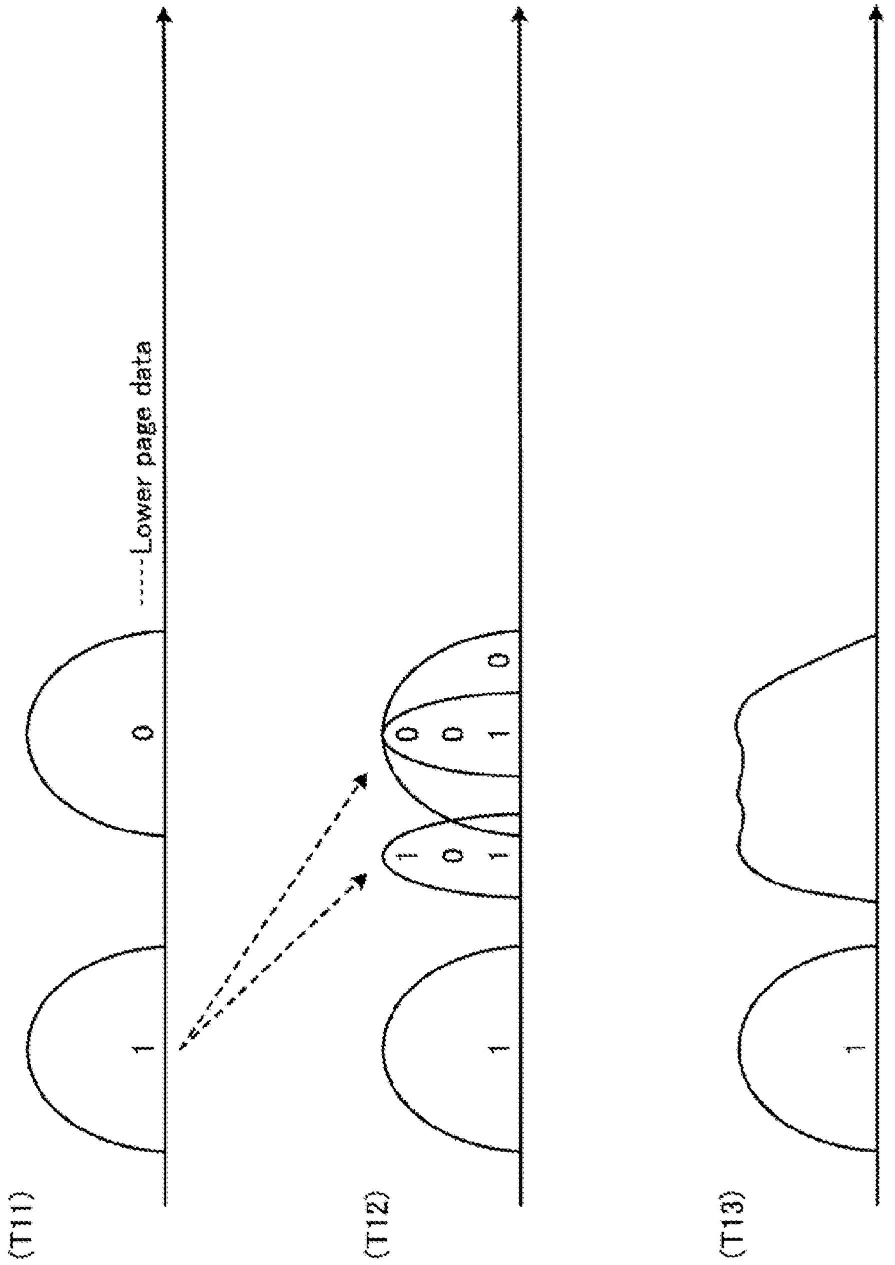
FIG. 16 is a diagram illustrating data destruction caused due to power shutdown.

Such an event arises when power shutdown occurs during the program of the middle and upper pages of the second stage. This situation will be described. FIG. 16 is a diagram illustrating data destruction caused due to power shutdown. (T11) in FIG. 16 illustrates a Vth distribution state (data state) after the program of the first stage is completed. (T12) in FIG. 16 illustrates a Vth distribution state in the middle of the program of the second stage. (T13) in FIG. 16 illustrates a Vth distribution state after power shutdown.

After the program of the first stage is completed, as illustrated in (T11) in FIG. 16, the program of the second stage starts and the Vth distribution state illustrated in (T12) in FIG. 16 is achieved. Then, when power shutdown occurs in the Vth distribution state during writing, as illustrated in (T12) in FIG. 16, the Vth distribution state illustrated in (T13) in FIG. 16 is achieved.

Here, the program of the second stage is considered to start from the completion state of the first stage. In general, inside a NAND memory, program is executed sequentially from low Vth to high Vth. Therefore, as illustrated in (T12) in FIG. 16, when the program of the second stage is progressed halfway and power shutdown occurs, the Vth distribution state illustrated in (T13) in FIG. 16 is achieved.

Here, the memory cells included in a positive distribution is in a state in which the memory cell in which the lower page data is “1” and the memory cell in which the lower page data is “0” are commingled. Therefore, even when the lower page data on which the program has been already completed in this state is read, correct read data may not be obtainable. Even when a read voltage after completion of the program of the second stage is used, correct lower page data may not be obtainable.

Figure 17:
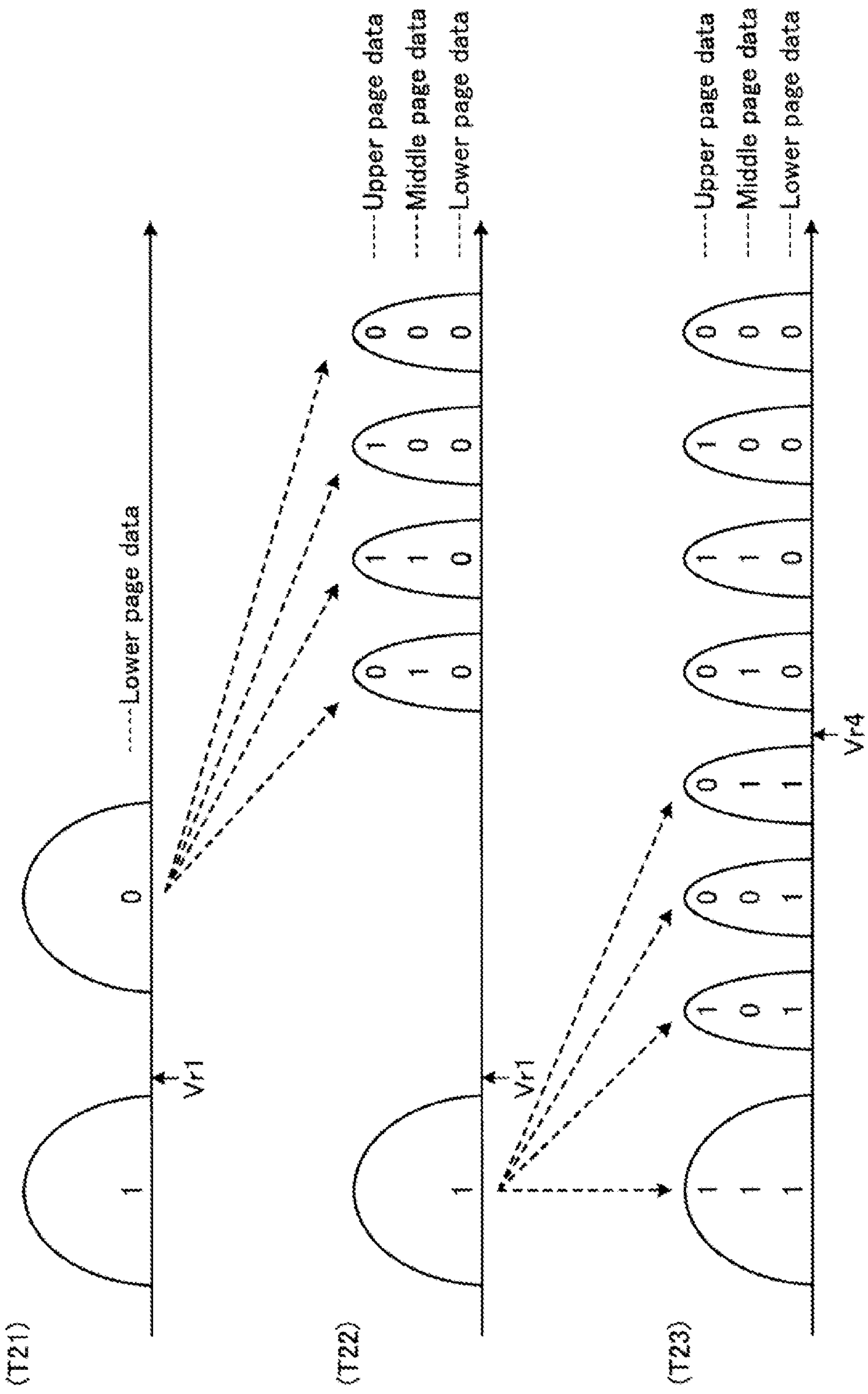
FIG. 17 is a diagram illustrating program of a second stage according to a third embodiment.

Accordingly, in the present embodiment, a Vth procedure of the program of the middle and upper pages of the second stage is changed. FIG. 17 is a diagram illustrating the program of the second stage according to a third embodiment. FIG. 17 illustrates a transition method of the Vth state in the second stage. (T21) in FIG. 17 illustrates a Vth distribution state after the program of the first stage is completed. (T22) in FIG. 17 illustrates a Vth distribution state at a time point at which the program of the first half of the second stage is completed. (T23) in FIG. 17 illustrates a Vth distribution state at a time point at which the program of the second half of the second stage is completed.

When the first stage illustrated in (T21) in FIG. 17 is completed, the control unit 22 according to the present embodiment first executes program (D-first program) on the memory cell in which the Vth distribution state of a writing destination is equal to or higher than the region D, as illustrated in (T22) in FIG. 17. Then, the control unit 22 completes the program in the Vth distribution state up to regions D to G and subsequently executes the program in the Vth distribution state of regions A to C, as illustrated in (T23) in FIG. 17.

In this way, the control unit 22 according to the present embodiment starts the program on the memory cell in which the Vth distribution state of the writing destination is allowed to be equal to or higher than the region D earlier than the program on the memory cell in which the Vth distribution state is allowed to be equal to or lower than the region C. Then, the control unit 22 completes the program on the memory cell in which the Vth distribution state of the writing destination is allowed to be equal to or higher than the region D and subsequently completes the program on the memory cell in which the Vth distribution state is allowed to be equal to or lower than the region C.

Thus, a timing at which the memory cells enter a state in which the memory cell in which the lower page data is “1” and the memory cell in which the lower page data is “0” are commingled does not occur. Accordingly, even when power shutdown occurs in the second stage, the control unit 22 can read the lower page data by using either read voltage of Vr1 and Vr4.

Figure 18:
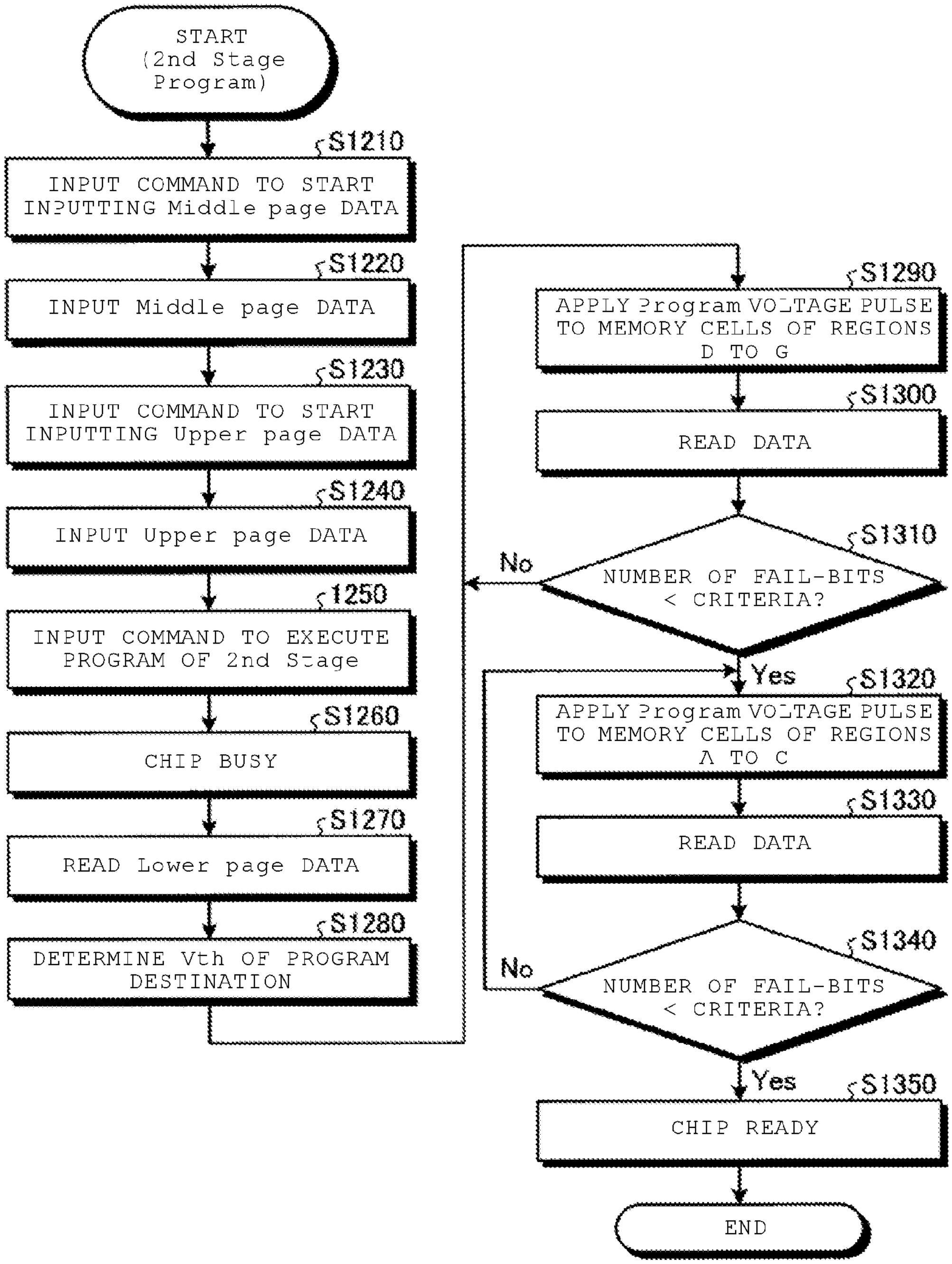
FIG. 18 is a flowchart illustrating a write procedure in the second stage according to the third embodiment.

FIG. 18 is a flowchart illustrating a write procedure in the second stage according to the third embodiment. The same processes as the processes described in FIG. 9C will not be described. Steps S1210 to S1280 of the second stage according to the third embodiment are the same as steps S310 to S380 of the second stage illustrated in FIG. 9C according to the first embodiment.

After Vth of program destinations of the middle and upper pages is determined (step S1280), writing of the data on the middle and upper pages is executed using the determined Vth.

In the second stage according to the third embodiment, a program voltage pulse is applied to the memory cells in which the Vth distribution state is allowed to be the regions D to G once to a plurality of times when the data is written on the middle and upper pages (step S1290). Then, to confirm whether the memory cells are moved over the threshold voltage boundary level, reading of the data is executed on the regions D to G of the middle and upper pages (step S1300).

Further, it is confirmed whether the number of fail-bits of the data of the regions D to G in the middle and upper pages is less than the criteria (step S1310). When the number of fail-bits of the data of the regions D to G in the middle and upper pages is equal to or greater than the criteria (No in step S1310), the processes of steps S1290 to S1310 are repeated.

Conversely, when the number of fail-bits of the data of the regions D to G in the middle and upper pages is equal to or less than the criteria (Yes in step S1310), writing on the regions A to C in the middle and upper pages is executed. Specifically, when the data is written on the middle and upper pages, a program voltage pulse is applied to the memory cells to be the regions A to C once to a plurality of times (step S1320). Then, to confirm whether the memory cells are moved over the threshold voltage boundary level, reading of the data is executed on the regions A to C of the middle and upper pages (step S1330).

Further, it is confirmed whether the number of fail-bits of the data of the regions A to C in the middle and upper pages is less than the criteria (step S1340). When the number of fail-bits of the data of the regions A to C in the middle and upper pages is equal to or greater than the criteria (Yes in step S1340), the processes of steps S1320 to S1340 are repeated.

Conversely, when the number of fail-bits of the data of the regions A to C in the middle and upper pages is less than the criteria (No in step S1350), the chip becomes ready (step S1350).

In the present embodiment, the program of the Vth distribution state up to the regions D to G is completed in the first half of the program of the second stage, but it does not completely terminate the program of the memory cells in the Vth distribution state up to the destinations of the regions D to G. In this case, the control unit 22 temporarily stops the program up to the Vth distribution state of about the region D. Thereafter, the control unit 22 sequentially executes the program of the regions A to C and the program of the regions D to G which is being executed.

Figure 19:
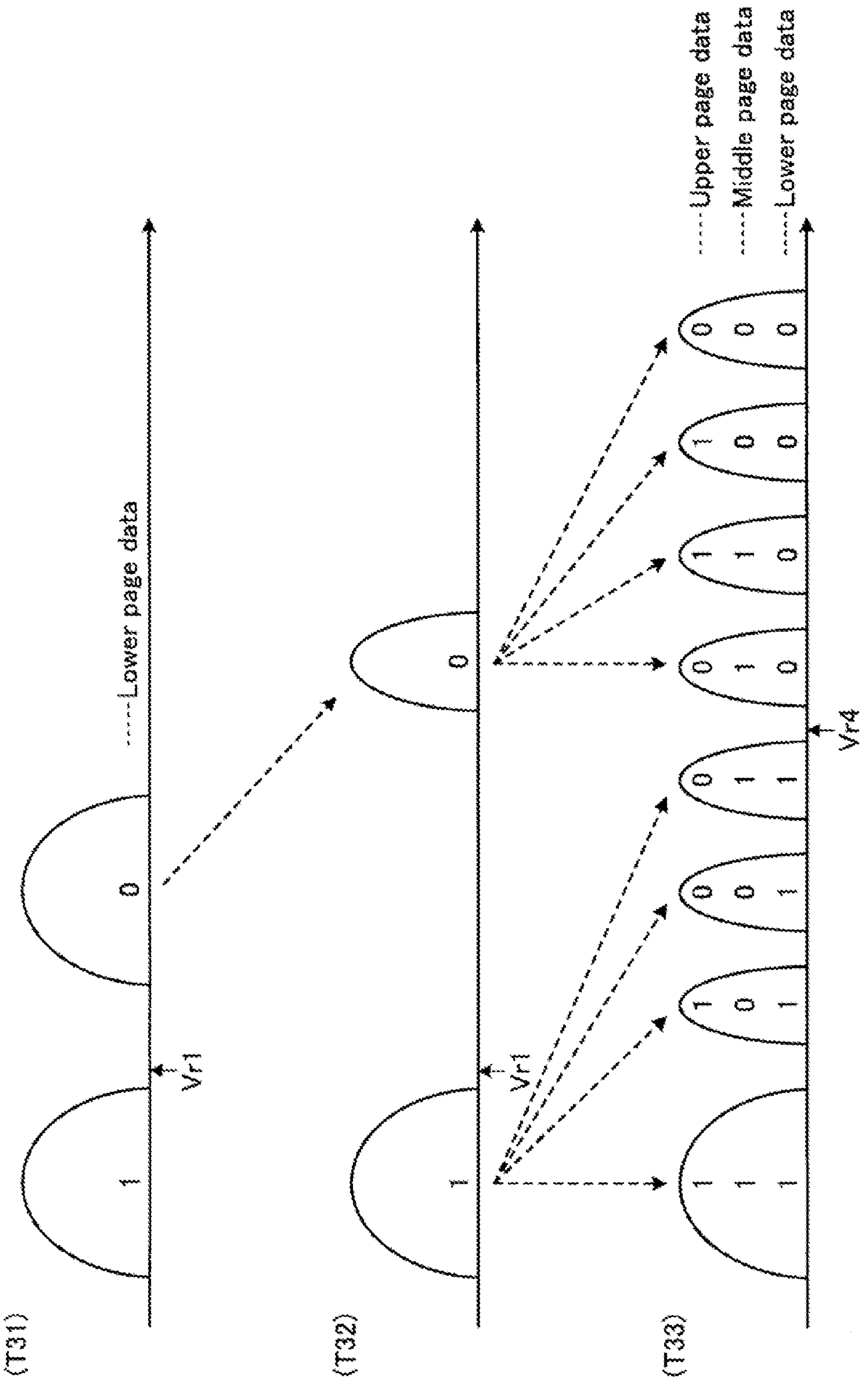
FIG. 19 is a diagram illustrating a modification example of the program of the second stage according to the third embodiment.

FIG. 19 is a diagram illustrating a modification example of the program of the second stage according to the third embodiment. FIG. 19 illustrates a transition method (modification example) of the Vth state in the second stage. (T31) in FIG. 19 illustrates a Vth distribution state after the program of the first stage is completed. (T32) in FIG. 19 illustrates a Vth distribution state at a time point at which the program of the first half of the second stage is completed. (T33) in FIG. 19 illustrates a Vth distribution state at a time point at which the program of the second half of the second stage is completed.

When the first stage illustrated in (T31) in FIG. 19 is completed, the control unit 22 according to the present embodiment executes the program up to the Vth distribution state of about the region D, as illustrated in (T32) in FIG. 19. Thereafter, the control unit 22 executes the program of the regions A to C using the Vth distribution state of the region Er. Further, the control unit 22 executes the program of the regions D to G using the Vth distribution state (the Vth distribution state during the program) of about the region D.

In the case of the method illustrated in FIG. 19, as in the case of the method illustrated in FIG. 17, a timing at which the memory cells enter a state in which the memory cell in which the lower page data is "1" and the memory cell in which the lower page data is "0" are commingled does not occur. Accordingly, even when power shutdown occurs in the second stage, the control unit 22 can read the lower page data by using either read voltage of Vr1 and Vr4.

In this way, the control unit 22 moves the threshold voltage distributions to the memory cells in which the Vth distribution state of the writing destination is allowed to be equal to or higher than the region D up to positions at which the threshold voltage regions do not overlap up to the regions Er to C, and subsequently completes the program to the memory cells to the regions Er to G.

In this way, in the third embodiment, at the time of the program of the second stage, the high-order Vth distributions are programmed earlier. Therefore, it is possible to prevent collateral destruction of the written data caused due to wrong power shutdown. Consequently, it is possible to improve reliability of the storage device.

In the first to third embodiments, the 1-3-3 data coding described in FIG. 6 is used in the above description. Another 1-3-3 data coding may be used. In the 1-3-3 data coding, there is a condition that the number of boundaries of the lower page data is 1.

FIGS. 20A to 20C are diagrams illustrating another example of the 1-3-3 data coding. In Modification Example 1 of the 1-3-3 data coding illustrated in FIG. 20A, a relation between threshold voltages and data values is as follows:

- a memory cell of which the threshold voltage is within the Er region is in a state in which "111" is stored;
- a memory cell of which the threshold voltage is within the A region is in a state in which "011" is stored;
- a memory cell of which the threshold voltage is within the B region is in a state in which "001" is stored;
- a memory cell of which the threshold voltage is within the C region is in a state in which "101" is stored;
- a memory cell of which the threshold voltage is within the D region is in a state in which "100" is stored;
- a memory cell of which the threshold voltage is within the E region is in a state in which "110" is stored;
- a memory cell of which the threshold voltage is within the F region is in a state in which "010" is stored; and
- a memory cell of which the threshold voltage is within the G region is in a state in which "000" is stored.

In Modification Example 2 of the 1-3-3 data coding illustrated in FIG. 20B, a relation between threshold voltages and data values is as follows:

- a memory cell of which the threshold voltage is within the Er region is in a state in which "110" is stored;
- a memory cell of which the threshold voltage is within the A region is in a state in which "100" is stored;
- a memory cell of which the threshold voltage is within the B region is in a state in which "000" is stored;
- a memory cell of which the threshold voltage is within the C region is in a state in which "010" is stored;
- a memory cell of which the threshold voltage is within the D region is in a state in which "011" is stored;
- a memory cell of which the threshold voltage is within the E region is in a state in which "111" is stored;
- a memory cell of which the threshold voltage is within the F region is in a state in which "101" is stored; and
- a memory cell of which the threshold voltage is within the G region is in a state in which "001" is stored.

In Modification Example 3 of the 1-3-3 data coding illustrated in FIG. 20C, a relation between threshold voltages and data values is as follows:

- a memory cell of which the threshold voltage is within the Er region is in a state in which "110" is stored;
- a memory cell of which the threshold voltage is within the A region is in a state in which "010" is stored;
- a memory cell of which the threshold voltage is within the B region is in a state in which "000" is stored;
- a memory cell of which the threshold voltage is within the C region is in a state in which "100" is stored;
- a memory cell of which the threshold voltage is within the D region is in a state in which "101" is stored;
- a memory cell of which the threshold voltage is within the E region is in a state in which "111" is stored;
- a memory cell of which the threshold voltage is within the F region is in a state in which "011" is stored; and
- a memory cell of which the threshold voltage is within the G region is in a state in which "001" is stored.

Fourth Embodiment

Next, a fourth embodiment will be described with reference to FIG. 21. In the fourth embodiment, the program of the lower and middle page is assumed to be executed for the first stage and the program of the upper page is assumed to be executed for the second stage.

Figure 21:
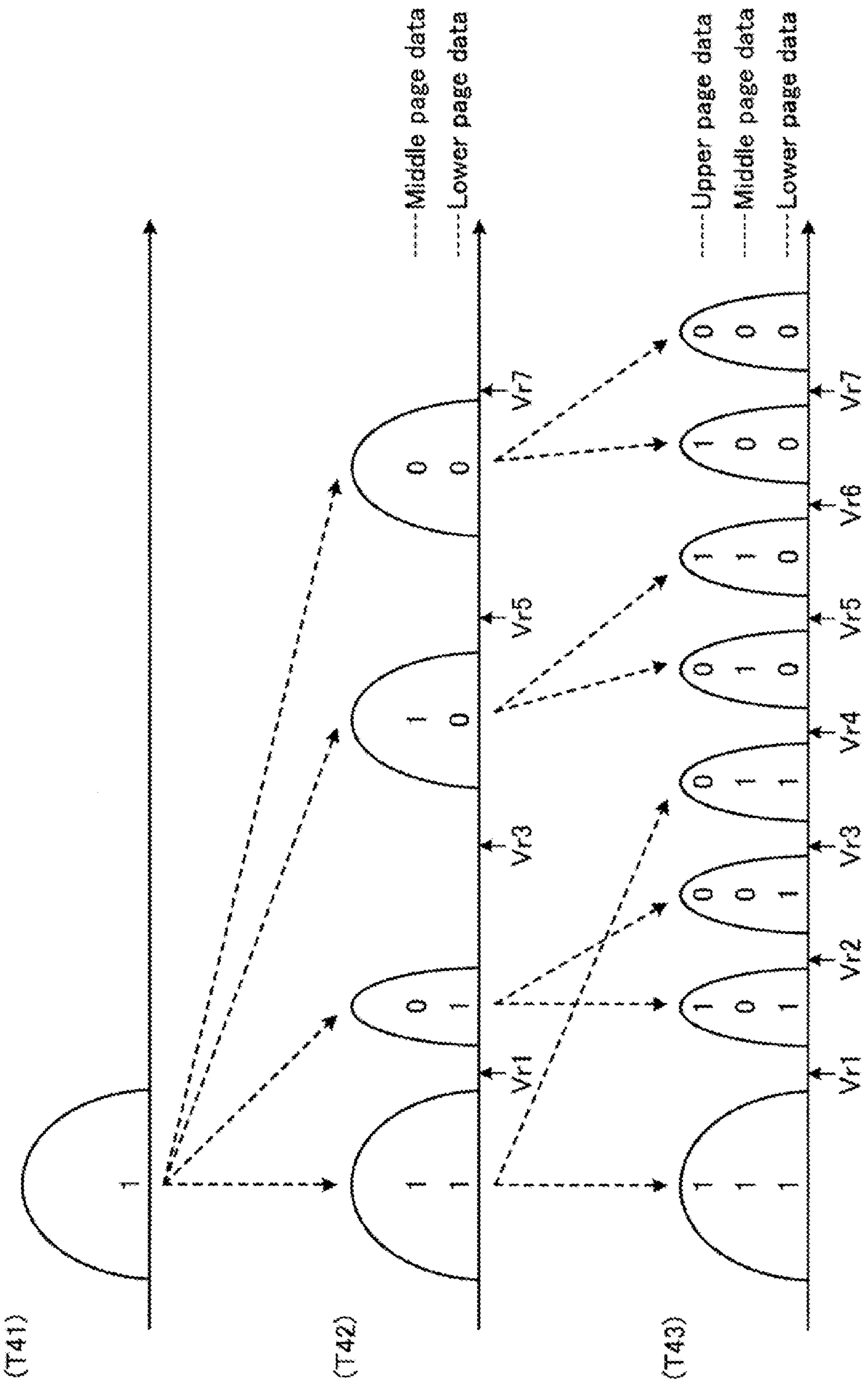
FIG. 21 is a diagram illustrating threshold voltage distributions after program according to a fourth embodiment.

FIG. 21 is a diagram illustrating threshold voltage distributions after program according to the fourth embodiment. FIG. 21 illustrates the threshold voltage distributions after each program stage on the memory cells. (T41) in FIG. 21 illustrates the threshold voltage distributions in an erased state which is an initial state before the program. (T42) in FIG. 21 illustrates a threshold voltage distribution after the program of the first stage. (T43) in FIG. 21 illustrates a threshold voltage distribution after the program of the second stage.

As illustrated in (T41) in FIG. 21, for all the memory cells of the NAND memory cell array 23, an unwritten state is a distribution Er state. As illustrated in (T42) in FIG. 21, the control unit 22 of the nonvolatile memory 2 remains in the distribution Er in each memory cell or injects charges and moves the memory cells to a distribution higher than the distribution Er according to a bit value written on the lower and middle pages in the program of the first stage. Thus, the memory cells are programmed at 4-value levels in accordance with the lower page data and the middle page data.

As illustrated in (T43) in FIG. 21, for the program of the second stage, one page of the upper page is necessary at the time of writing the data. The control unit 22 of the nonvolatile memory 2 adds the data of the upper page as the second stage to the data of the first stage. In this way, the control unit 22 executes program so that the threshold voltage distributions after the program of the second stage become 8-value levels in a final state in which the adjacent distributions are separated.

The levels of the threshold voltages at the time of program at 4-value levels of the first stage are as follows, for example. The control unit 22 executes control in the same distribution as the region A in view of the fact that the second threshold voltage level from the lowest level is allocated to transition to the regions A and B through the program of the second stage. The control unit 22 executes control such that the third threshold voltage level from the lowest level is between Vr3 and Vr5 in view of the fact that the third threshold voltage level from the lowest level is allocated to transition to the regions D and E through the program of the second stage. The control unit 22 executes control such that the highest threshold voltage level is between Vr5 and Vr7 in view of the fact that the highest threshold voltage level is allocated to transition to the regions E and F through the program of the second stage. Thereafter, the control unit 22 executes the program at 8-value levels of the second stage using 4-values of the first stage.

To reduce the influence of the interference between adjacent memory cells, the program is executed in the same order as the order illustrated in FIG. 8B. That is, two different program stages are not continuously executed in the same word line WLi. To reduce the interference between adjacent memory cells between the word lines WLi, it is effective to decrease a change amount of the threshold voltage of the adjacent word lines WLi after the program up to the second stage of the word line WLi is completed. In the sequence illustrated in FIG. 8B, the program stage of the adjacent word lines WLi after completion of the program up to the second stage of the word lines WLi is the second stage. Therefore, it is possible to reduce the influence of the adjacent memory cells.

Here, a write procedure according to the fourth embodiment will be described. Since the entire write procedure of one block according to the fourth embodiment is the same as the entire write procedure (FIG. 9A) of one block according to the first embodiment, the description thereof will not be made. Even in the present embodiment, as in the first embodiment, the program stage is progressed over the word lines WLi in a non-continuous procedure, and therefore program is executed by setting a collection (here, a block) of certain word lines WLi as a collection of program sequences.

Figure 22A:
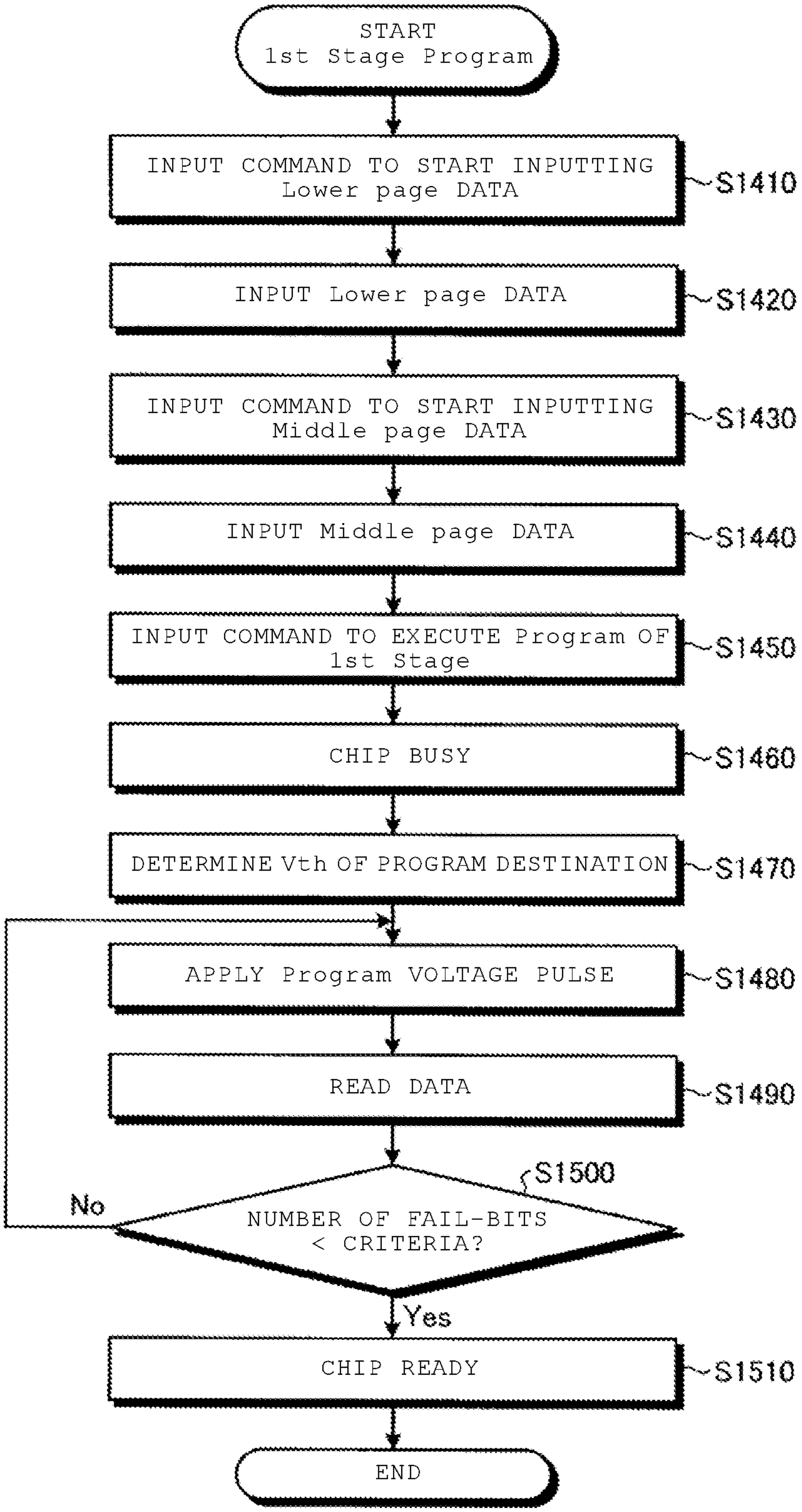
FIG. 22A is a sub-flowchart illustrating a write procedure in a first stage according to the fourth embodiment.
Figure 22B:
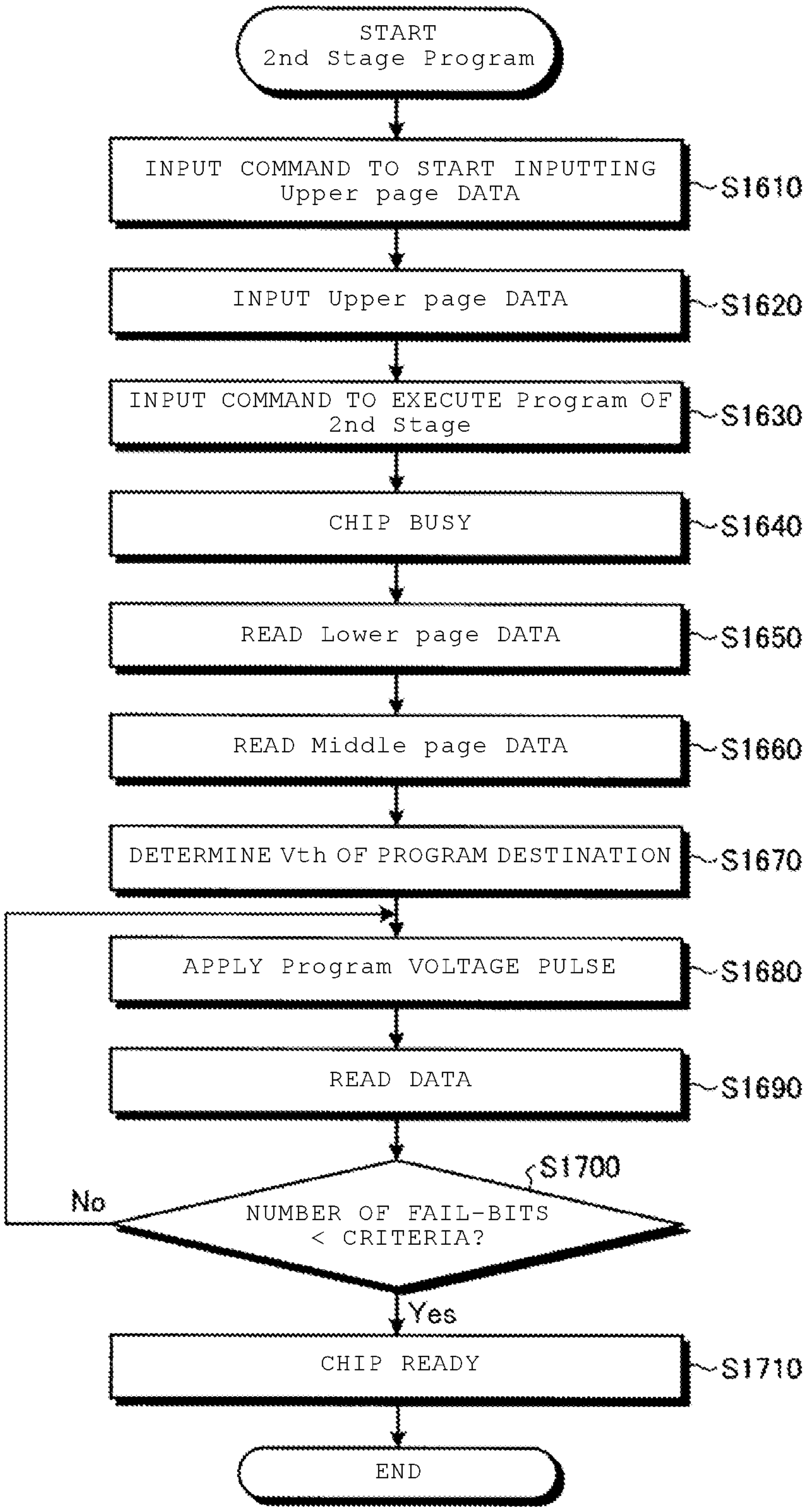
FIG. 22B is a sub-flowchart illustrating a write procedure in a second stage according to the fourth embodiment.

FIG. 22A is a sub-flowchart illustrating a write procedure the first stage according to the fourth embodiment. FIG. 22B is a sub-flowchart illustrating a write procedure in the second stage according to the fourth embodiment. The same processes as the processes illustrated in FIG. 9B among the processes illustrated in FIG. 22A will not be described. The same processes as the processes illustrated in FIG. 9C among the processes illustrated in FIG. 22B will not be described.

As illustrated in FIG. 22A, in the program of the first stage, a command to start inputting the lower page data is first input from the memory controller 1 to the nonvolatile memory 2 (step S1410). Then, the lower page data is input from the memory controller 1 to the nonvolatile memory 2 (step S1420).

Then, a command to start inputting the middle page data is first input from the memory controller 1 to the nonvolatile memory 2 (step S1430). Then, the middle page data is input from the memory controller 1 to the nonvolatile memory 2 (step S1440).

Then, a command to execute the program of the first stage is input from the memory controller 1 to the nonvolatile memory 2 (step S1450), and thus the chip becomes busy (step S1460).

Thereafter, Vth of the program destination of the second stage is determined based on the lower page data and the middle page data (step S1470). Thereafter, the data is written on the lower and middle pages using the determined Vth.

When the data is written on the lower and middle pages, the program voltage pulse is applied once to a plurality of times (step S1480). Then, in order to confirm whether the memory cells are moved over the threshold voltage boundary level, reading is executed (step S1490). Further, it is confirmed whether the number of fail-bits of the data in the lower and middle pages is less than the criteria (step S1500). When the number of fail-bits of the data is equal to or greater than the criteria (determination standard) (No in step S1500), the processes of steps S1480 to S1500 are repeated. Conversely, when the number of fail-bits of the data is less than the criteria (Yes in step S1500), the chip becomes ready (step S1510).

As illustrated in FIG. 22B, in the program of the second stage, a command to start inputting the upper page data is first input from the memory controller 1 to the nonvolatile memory 2 (step S1610). Then, the upper page data is input from the memory controller 1 to the nonvolatile memory 2 (step S1620). Then, a command to execute the program of the second stage is input from the memory controller 1 to the nonvolatile memory 2 (step S1630), and thus the chip becomes busy (step S1640).

Thereafter, the lower page data which is the IDL is read (step S1650). Further, the middle page data which is the IDL is read (step S1660). Then, Vth of program destination of the upper page is determined based on the lower page data and the middle page data (step S1670). Thereafter, the data is written on the upper page is executed using the determined Vth.

Further, in order to improve reliability of the read data of the IDL, the control unit 22 can also execute reading a plurality of times, makes a majority decision of the read results with the page buffer 24 in the chip, and uses the result of the majority decision as subsequent write data. Of course, at the time of a normal reading operation, the control unit 22 can also execute reading a plurality of times, make a majority decision of the read result in the chip, and use the result of the majority decision as read data provided to the outside.

When the data is written on the upper page, the program voltage pulse is applied once or a plurality of times (step S1680). Then, in order to confirm whether the memory cells are moved over the threshold voltage boundary level, data reading of the upper page is executed (step S1690).

Further, it is confirmed whether the number of fail-bits of the data in the upper page is less than the criteria (step S1700). When the number of fail-bits of the data of the upper page is equal to or greater than the criteria (No in step S1700), the processes of steps S1680 to S1700 are repeated.

Conversely, when the number of fail-bits of the data is less than the criteria (Yes in step S1700), the chip becomes ready (step S1710).

Figure 22C:
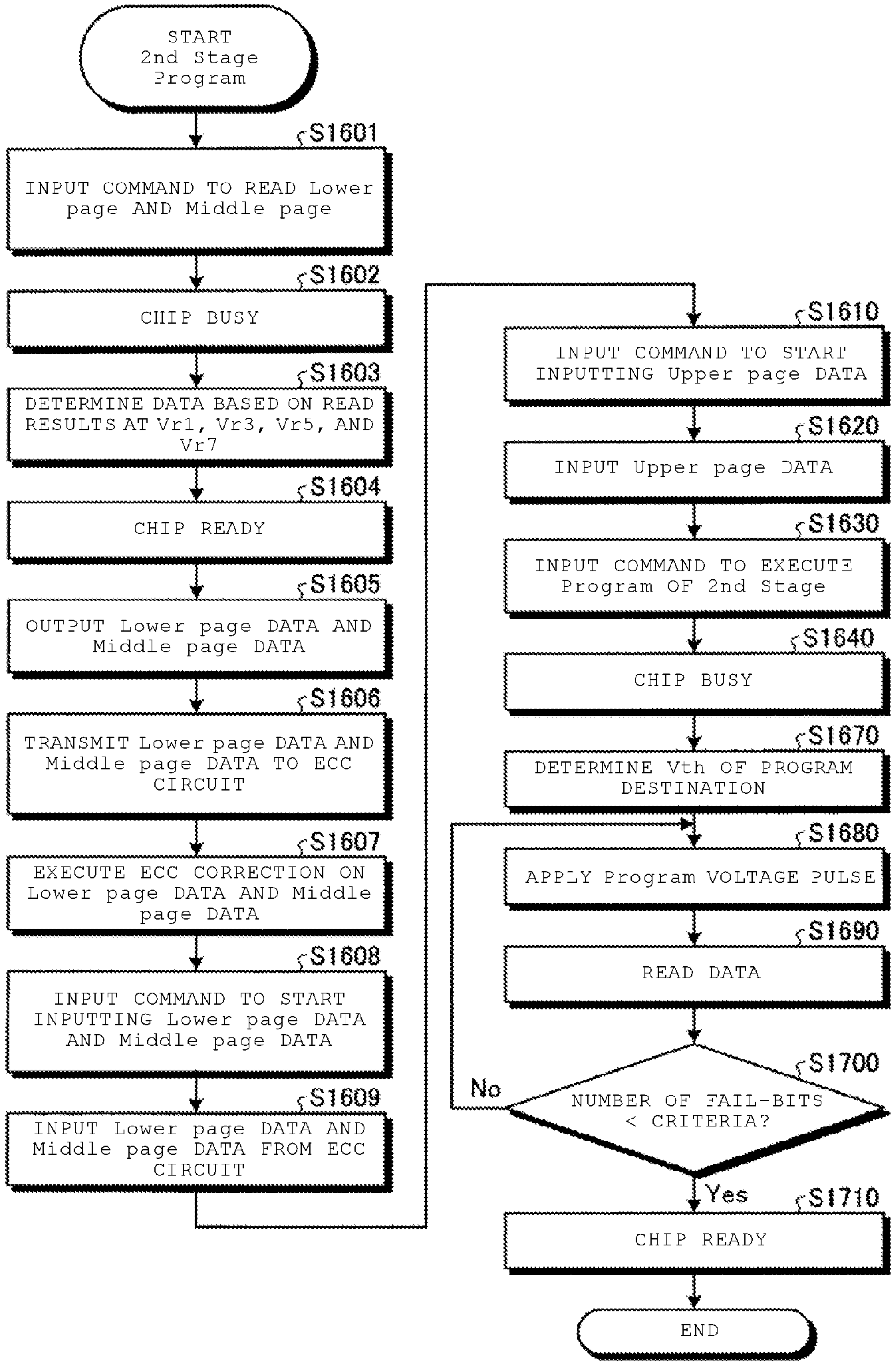
FIG. 22C is a sub-flowchart illustrating a modification example of the write procedure in the second stage according to the fourth embodiment.

Here, a modification example of the write procedure illustrated in FIG. 22B will be described. FIG. 22C is a sub-flowchart illustrating the modification example of the write procedure in the second stage according to the fourth embodiment. In the process procedure illustrated in FIG. 22C, the process procedure of steps S1610 to S1710 is the same as that in FIG. 22B except that the processes of steps S1650 and S1660 described with reference to FIG. 22B are not executed.

In the case of the process procedure illustrated in FIG. 22C, the processes of steps S1601 to S1609 are executed before step S1610. Specifically, a command to read the lower and middle pages is first input from the memory controller 1 to the nonvolatile memory 2 (step S1601), and thus the chip becomes busy (step S1602).

Thereafter, the control unit 22 executes the reading of the lower page data and the middle page data which are the IDL at the threshold voltages of Vr1, Vr3, Vr5, and Vr7. Then, the control unit 22 determines the value of the read data to "0" or "1" based on the read result at the threshold voltages of Vr1, Vr3, Vr5, and Vr7 (step S1603). Thereafter, the chip becomes ready (step S1604).

When the lower page data and the middle page data read by the control unit 22 are output (step S1605), the lower page data and the middle page data are transmitted to the ECC circuit (step S1606). Thus, the ECC circuit 14 executes ECC correction on the lower page data and the middle page data (step S1607).

Then, a command to start inputting the lower page data and the middle page data is input from the memory controller 1 to the nonvolatile memory 2 (step S1608). Thus, the ECC circuit 14 inputs the lower page data and the middle page data to the nonvolatile memory 2 (step S1609).

Thereafter, the processes of steps S1610 to S1710 are executed. In step S1670, Vth of the program destinations of the middle and upper pages is determined based on the lower page data and the middle page data from the ECC circuit 14.

In this way, in the present embodiment, the data of only one page, the upper page, in the program of the second stage is input. However, in the second stage, data corresponding to 3 pages also including the lower and middle pages is necessary at Vth of the program destinations of the memory cells. Therefore, in the program of the second stage, the lower page data and the middle page data are first read as a preprocessing. Then, Vth of the program destination of the upper page is determined by combining the read data and the input upper page data.

Figure 23A:
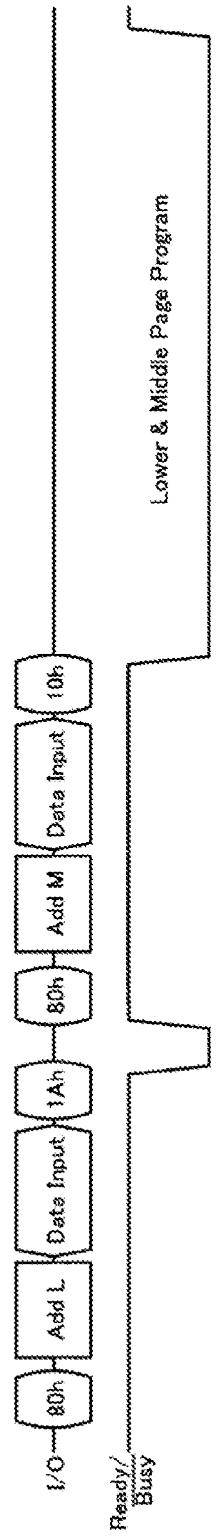
FIGS. 23A and 23B illustrate examples of sequences of external program commands according to the fourth embodiment.
Figure 23B:
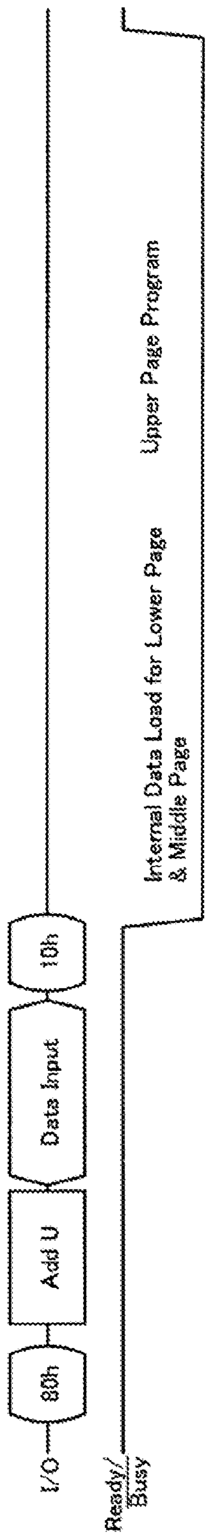

FIGS. 23A and 23B are diagrams illustrating examples of sequences of external program commands according to the fourth embodiment. FIG. 23A illustrates a sequence of external program commands at the first stage according to the fourth embodiment. FIG. 23B illustrates a sequence of an external program command at the second stage according to the fourth embodiment.

As illustrated in FIG. 23A, at the first stage, the program start command (80*h*) is input, the address of a program target block page (the address of the lower page) is subsequently input, and the program data of the lower page is subsequently input. Thereafter, a connection command (1Ah) of the program command is input and the program data of the middle page is presently input in the same sequence. Then, when the program execution command (10*h*) is finally input, the chip become busy and an operation of the program starts inside the memory chip. By inputting these program commands, the lower and middle pages are programmed. Either an input procedure of the program data of the lower page or an input procedure of the program data of the middle page may be earlier.

As illustrated in FIG. 23B, at the second stage, the program start command (80*h*) is input, the address of a program target block page (the address of the upper page) is subsequently input, and the program data of the upper page is subsequently input. Then, when the program execution command (10*h*) is finally input, the chip becomes busy and an operation of the program starts inside the memory chip. By inputting these program commands, the lower and middle pages are read as the IDL and the upper page is programmed.

Here, a page reading process will be described. A page reading method is different according to before the program in regard to the word lines WLi including a reading target page is written on the second stage and after the program is completely written on the second stage.

In the word line WLi before the writing of the second stage, the written data is valid for the lower and middle pages. Therefore, the control unit 22 reads the data from the memory cells when the read page is the lower or middle page. Then, when the read page is the upper page, the control unit 22 forcibly executes control such that all "1s" are output as the read data without executing an operation of reading the memory cells.

On the other hand, in the case of the word lines WLi completed up to the second stage, the control unit 22 reads the memory cells of the read page which is any of the upper, middle, and lower pages. In this case, since a necessary read voltage is different according to which page is read, the control unit 22 executes only reading necessary according to the selected page.

According to the coding illustrated in FIG. 6, the number of boundaries between the threshold voltage states in which the lower page data is changed is only 1, the control unit 22 determines data according to in which range the threshold voltage is located between 2 ranges separated by this boundary.

Since the number of boundaries between the threshold voltage states in which the data of the middle or upper page is changed is 3, the control unit 22 determines data according to in which range the threshold voltage is located among 4 ranges separated by these boundaries.

Figure 24A:
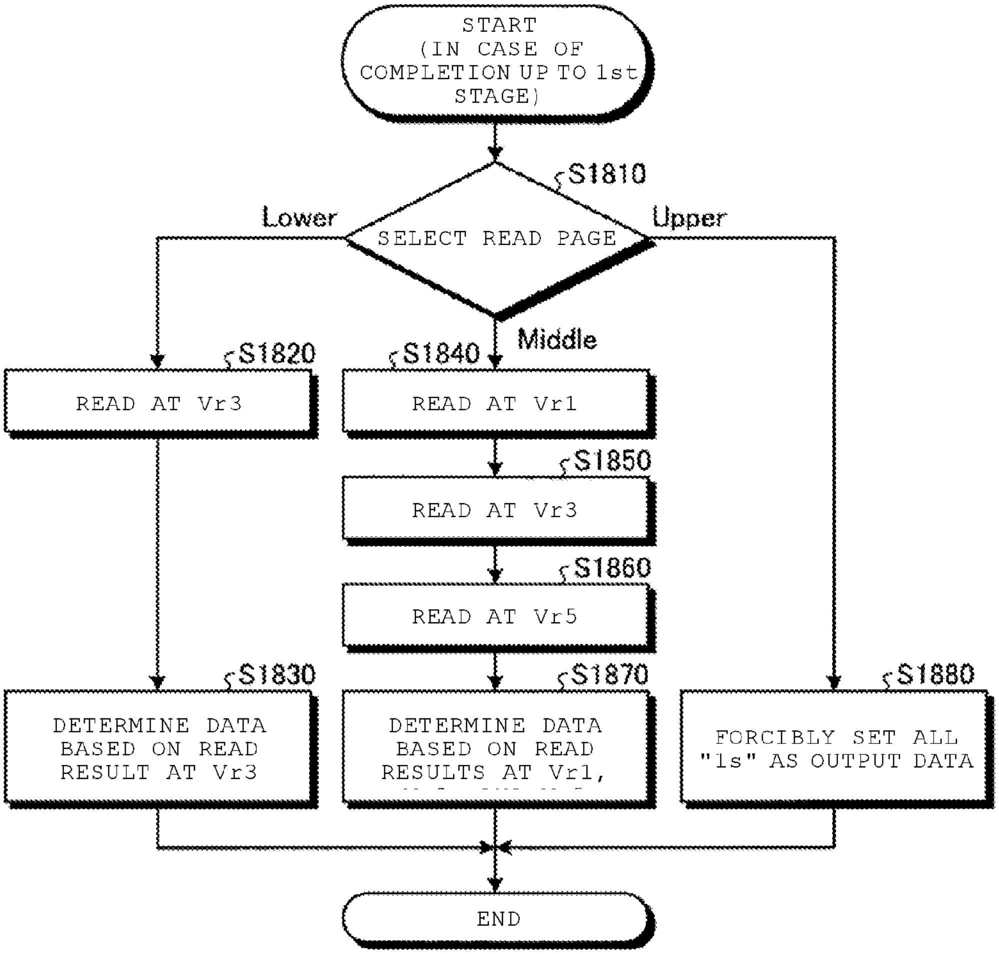
FIG. 24A is a flowchart illustrating a process procedure of page reading in a word line in which program is completed up to the first stage in a storage device according to the fourth embodiment.
Figure 24B:
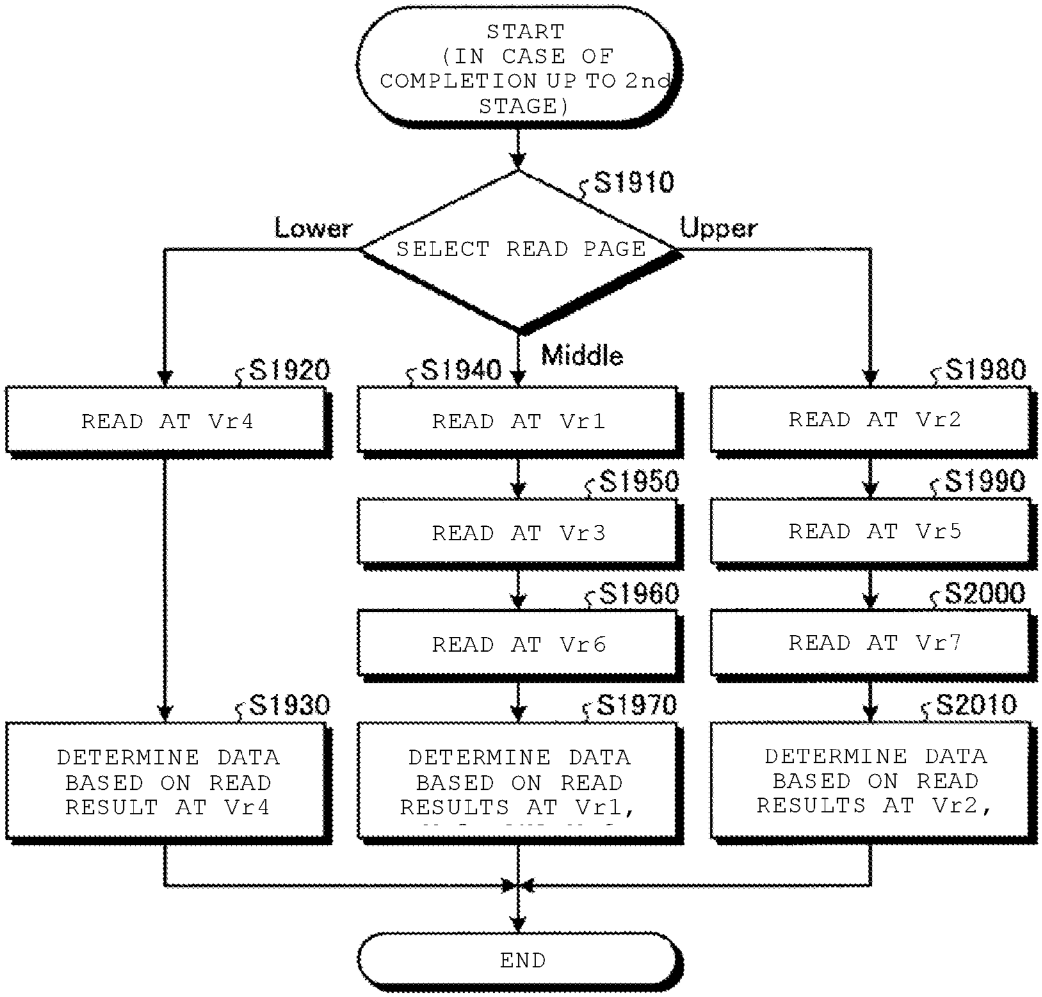
FIG. 24B is a flowchart illustrating a process procedure of page reading in a word line in which program is completed up to the second stage in a storage device according to the fourth embodiment.

Hereinafter, a specific process procedure of page reading will be described. FIG. 24A is a flowchart illustrating a process procedure of page reading in a word line before writing of the second stage in the storage device according to the fourth embodiment. FIG. 24B is a flowchart illustrating a process procedure of page reading in a word line in which program is completed up to the second stage in a storage device according to the fourth embodiment. The same processes as the processes illustrated in FIG. 12A among the processes illustrated in FIG. 24A will not be described. The same processes as the processes illustrated in FIG. 12B among the processes illustrated in FIG. 24B will not be described.

As illustrated in FIG. 24A, in the case of the word line WLi before writing of the second stage, the control unit 22 selects a read page (step S1810). When the read page is the lower page (lower in step S1810), the control unit 22 executes reading at the threshold voltage of Vr3 (step S1820). Then, the control unit 22 determines the value of the read data to "0" or "1" based on a read result at the threshold voltage of Vr3 (step S1830).

When the read page is the middle page (middle in step S1810), the control unit 22 executes reading at the threshold voltages of Vr1, Vr3, and Vr5 (steps S1840, S1850, and S1860). Then, the control unit 22 determines the value of the read data to "0" or "1" based on read results at the threshold voltages of Vr1, Vr3, and Vr5 (step S1870).

When the read page is the upper page (upper in step S1810), the control unit 22 forcibly executes control such that all "1s" are output as the output data of the memory cells (step S1880).

As illustrated in FIG. 24B, in the case of the word line WLi in which the program is completed up to the second stage, the control unit 22 selects a read page (step S1910). When the read page is the lower page (lower in step S1910), the control unit 22 executes reading at the threshold voltage of Vr4 (step S1920). Then, the control unit 22 determines the value of the read data to "0" or "1" based on a read result at the threshold voltage of Vr4 (step S1930).

When the read page is the middle page (middle in step S1910), the control unit 22 executes reading at the threshold voltages of Vr1, Vr3, and Vr6 (steps S1940, S1950, and S1960). Then, the control unit 22 determines the value of the read data to "0" or "1" based on read results at the threshold voltages of Vr1, Vr3, and Vr6 (step S1970).

When the read page is the upper page (upper in step S1910), the control unit 22 executes reading at the threshold voltages of Vr2, Vr5, and Vr7 (steps S1980, S1990, and S2000). Then, the control unit 22 determines the value of the read data to "0" or "1" based on read results at the threshold voltages of Vr2, Vr5, and Vr7 (step S2010).

In this way, in program control of threshold voltages not illustrated in FIG. 21, when the lower page data is read, Vr3 is used as a read level by which 4 levels are separated into two upper levels and two lower levels. When the middle page data is read, the data assignment in which data is not decidable unless one level is specified among 4 levels is achieved. Therefore, it is necessary to read 3 levels of Vr1, Vr3, and Vr5 as read levels.

On the other hand, in the case of the word line WLi in which the program is completed up to the second stage, the memory cells are read when the read page is any of the upper, middle, and lower pages. However, since a necessary read voltage is different according to which page is read, only reading necessary according to the selected page is executed.

The memory controller 1 can manage and identify whether the program in regard to the word lines WLi is completed up to the first stage or the second stage. The memory controller 1 executes the control of the program. Therefore, when the memory controller 1 records a progress status, the memory controller 1 can easily refer to the address of the nonvolatile memory 2 and the state of the program at the address. In this case, when the memory controller 1 executes reading from the nonvolatile memory 2, the memory controller 1 identifies a program state of the word line WLi including a target page address and issues a read command according to the identified state.

Figure 25A:
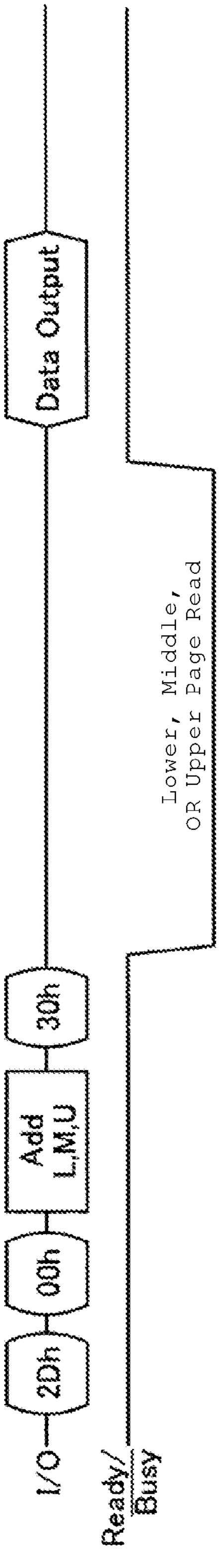
FIGS. 25A and 25B illustrate examples of sequences of an external read command according to the fourth embodiment.
Figure 25B:
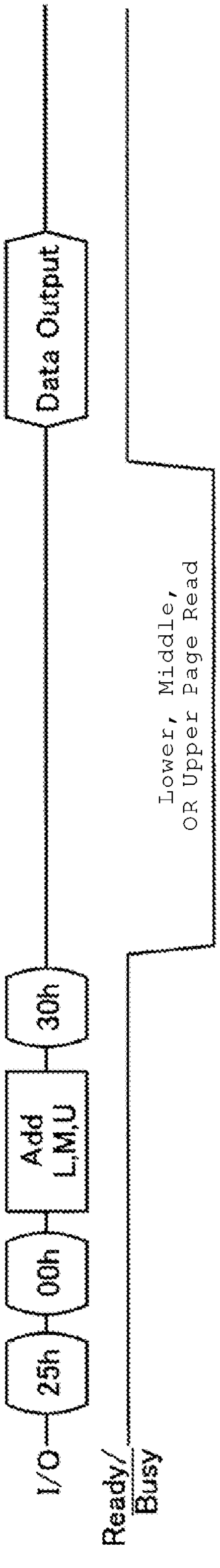

FIGS. 25A and 25B are diagrams illustrating examples of sequences of external program commands according to the fourth embodiment. FIG. 25A illustrates a sequence of external read commands in the word lines WLi in which the program is completed up to the first stage in the storage device according to the fourth embodiment. FIG. 25B illustrates a sequence of external read commands in the word lines WLi in which the program is completed up to the second stage in the storage device according to the fourth embodiment.

As illustrated in FIG. 25A, in the case of the word lines WLi before the writing of the second stage, the command (2Dh) indicating a state before the writing of the second stage is first input as a command to execute a read operation. Thereafter, the read start command (00*h*) is input, and the address of a read target block page (the address of the lower page, the middle page, or the upper page) is subsequently input. Then, when the read execution command (30*h*) is finally input, the chip becomes busy and a reading operation inside the memory chip starts. By inputting these program commands, the data is read from the lower page, the middle page, or the upper page. Thereafter, the chip enters a ready state and the read data is output.

On the other hand, as illustrated in FIG. 25B, in the case of the word lines WLi in which the program is completed up to the second stage, the command (25*h*) indicating a completion state up to the second stage is first input as a command to execute a read operation. Thereafter, the read start command (00*h*) is input, and the address of a read target block page (the address of the lower page, the middle page, or the upper page) is subsequently input. Then, when the read execution command (30*h*) is finally input, the chip become busy and a reading operation inside the memory chip starts. By inputting these program commands, the data is read from the lower page, the middle page, or the upper page. Thereafter, the chip enters a ready state and the read data is output.

The same modifications as the modifications of the second embodiment with respect to the first embodiment may be applied to the present embodiment. That is, even in the present embodiment, the program of the second stage of the word line WLn−1 and the program of the first stage of the word line WLn may be collectively executed.

In the present embodiment, in the kind of 1-3-3 data coding, the restriction that the number of boundaries in the lower page is 1 is unnecessary. Therefore, 1-3-3 data coding other than the 1-3-3 data coding used in the first to third embodiments may be applied. Specific states of the 1-3-3 data coding according to the present embodiment are described in FIGS. 5 to 8, 12 to 15, 18, 20, 22, 24, and 28 to 30 in JP-A-2015-195071.

In this way, in the fourth embodiment, as in the first embodiment, when the nonvolatile memory 2 (a NAND memory of 3 bits/cell having a 3-dimensional structure or a 2-dimensional structure) is programmed, the 1-3-3 data coding is adopted and the stages of the program is set to 2 stages. In this way, since the nonvolatile memory 2 is programmed with 2 stages, the amount of data input at the time of programming the data can be reduced and the amount of a write buffer necessary for the memory controller 1 can be suppressed. A deviation of a bit error ratio between the pages of the nonvolatile memory 2 can be reduced and cost of ECC can be lowered.

Fifth Embodiment

Next, a fifth embodiment will be described with reference to FIGS. 26 to 30. In the fifth embodiment, whether the program in regard to the word lines WLi is completed up to the first stage or the second stage is recorded in the memory cells (referred to herein as "flag cells"), and a read sequence is appropriately controlled based on information recorded on the flag cells at the time of reading data.

In the present embodiment, a case in which the same coding as that described in FIG. 6 in the first embodiment is used is used will be described. In the following description, a memory cell array storing data is referred to as a data storage cell in some cases. Information regarding whether the program is completed up to the first stage or the second stage is referred to as completion information in some cases. In the present embodiment, when the program is completed up to the second stage, data is written in the flag cell. Therefore, this data is completion information indicating that the program is completed up to the second stage. Conversely, when the program is not completed up to the second stage, data is not written in the flag cell. Therefore, this unwritten data is completion information indicating that the program is not completed up to the second stage.

Figure 26:
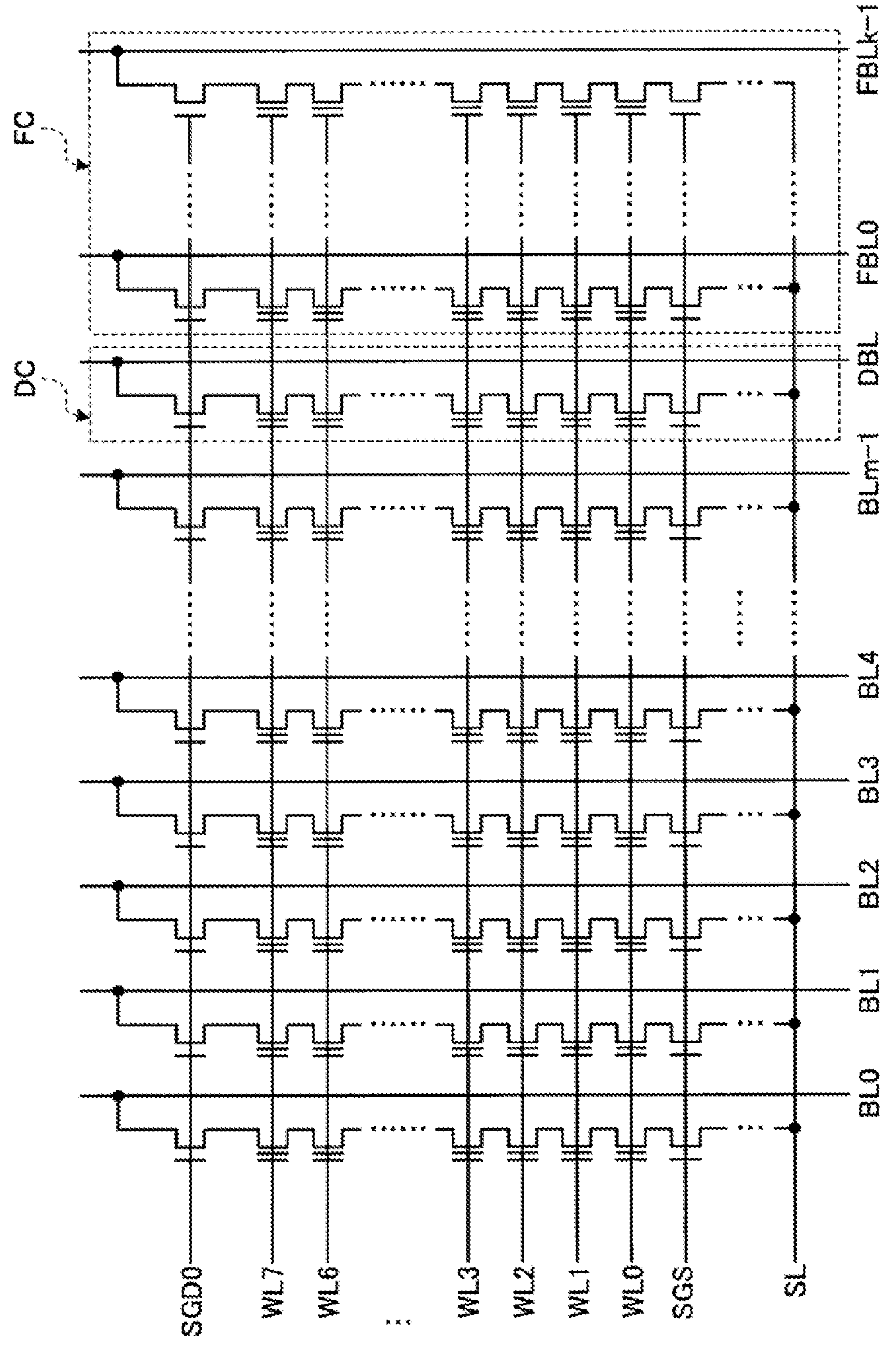
FIG. 26 is a diagram illustrating the configuration of a flag cell.

FIG. 26 is a diagram illustrating the configuration of the flag cell. In the present embodiment, a memory cell array having the same configuration as the memory cell array described in FIG. 3 in the first embodiment is used. In FIG. 26, memory cell transistors MT connected to a select gate line SGD0 are illustrated and memory cell transistors MT connected to select gate lines SGD1 to 3 are not illustrated.

Dummy cells DC and flag cells FC are arranged on the lateral side of the memory cell transistors (data storage cells) MT connected to bit lines BL0 to BLm−1. The dummy cells DC and the flag cells FC have the same configuration as the memory cell transistor MT. Specifically, the dummy cells DC are connected to the select gate line SGD0, word lines WL0 to WL7, a select gate line SGS, the source line SL, a dummy cell bit line DBL, and the like. The flag cells FC are connected to the select gate line SGD0, the word lines WL0 to WL7, the select gate line SGS, the source line SL, flag cell bit lines FBL0 to FBLk−1, and the like. In other words, some of the memory cells in the block BLK are used to store data and the remaining memory cells are used as the dummy cells DC and the flag cells FC.

In the first to fifth embodiments, the memory controller 1 manages and identifies whether the program in regard to the word lines WLi is completed up to the first stage or the second stage. At the time of reading data, the memory controller 1 issues a read command according to a completion state of the program.

On the other hand, in the present embodiment, the control unit 22 records the completion information indicating whether the program is completed up to the first stage or the second stage in the flag cells FC of the nonvolatile memory 2. Then, at the time of reading data, the control unit 22 controls the read sequence based on the completion information recorded in the flag cells FC.

The flag cell FC is installed in units of word lines. That is, some of the plurality of memory cells connected the word lines WLi are used as the flag cells FC. The number of flag cells FC may be 1 for each word line WLi, but it is desirable to use the plurality of flag cells FC in order to improve reliability of data through multiplexing. In order to suppress an influence of deterioration in the reliability caused due to interference between adjacent cells, it is desirable that the data storage cells storing data not be physically adjacent to the flag cells FC. For example, it is desirable that the dummy cells DC or the like not used as data record regions be arranged between the data storage cells and the flag cells FC.

The completion information recorded in the flag cell FC is 2-value information indicating whether the program of the second stage is executed. The control unit 22 writes the completion information indicating that the program of the second stage is completed in the flag cell FC in the same word line WLi at the time of the program of the second stage. The control unit 22 writes the completion information on the flag cells FC equal to or higher than, for example, a D level. A form of a change in the threshold voltage distribution at this time will be described.

Figure 27A:
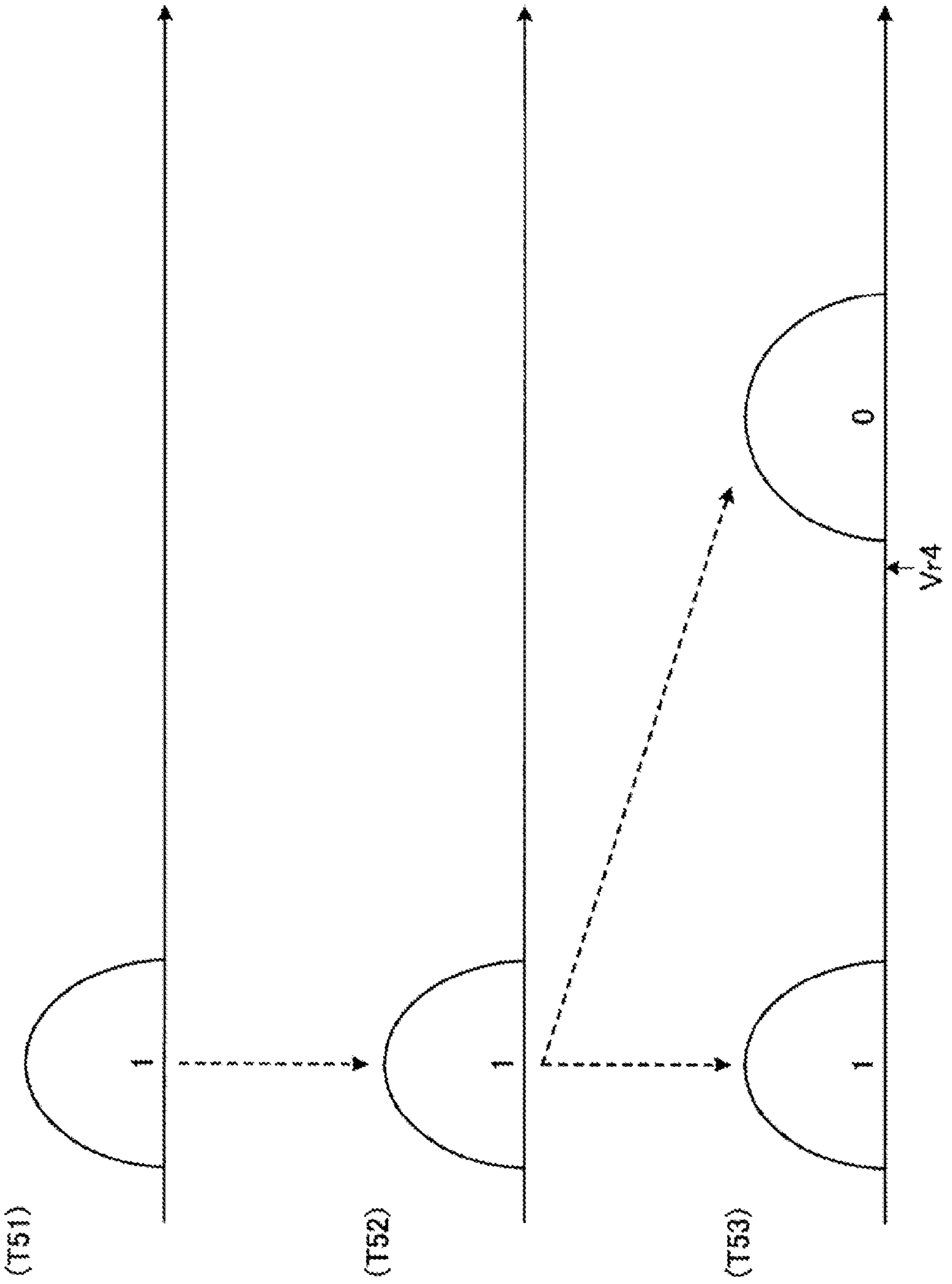
FIG. 27A is a diagram illustrating program to a flag cell according to a fifth embodiment.

FIG. 27A is a diagram illustrating program to the flag cell according to the fifth embodiment. FIG. 27A illustrates a transition method of a Vth state in the flag cell FC executed at the time of the program of the second stage.

(T51) in FIG. 27A illustrates a Vth distribution state in the flag cell FC in the erased state which is the initial state before program. (T52) in FIG. 27A illustrates a Vth distribution state at a time point when the program of the first stage is completed. (T53) in FIG. 27A illustrates a Vth distribution state at a time point when the program of the second stage is completed. When the second stage is completed, the control unit 22 according to the present embodiment executes program on the flag cells FC so that the Vth distribution state of a writing destination is equal to or higher than the region D (equal to or higher than Vr4), as illustrated in (T53) in FIG. 27A.

Writing is executed on the flag cells FC simultaneously with the data cells at the time of the second stage, but transition of the threshold voltage in addition to the flag cells FC is greater than that of the data cells. Therefore, when reliability of the data cells adjacent to the flag cells FC deteriorates, the dummy cells DC are installed between the flag cells FC and the data cells. For the dummy cells DC, writing may be executed from Er to A, B, or C at the time of the second stage, as illustrated in FIG. 27B.

Figure 27B:
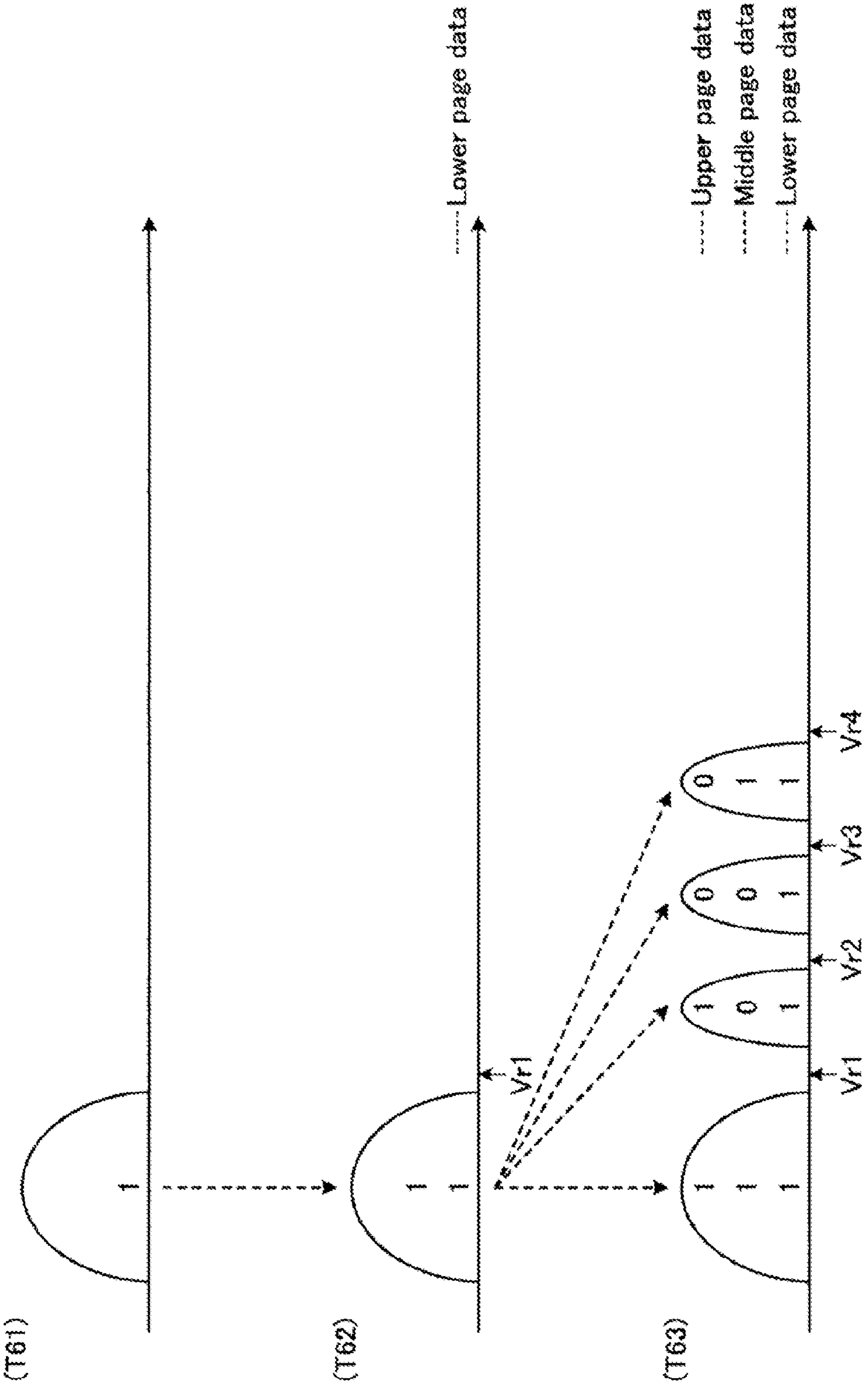
FIG. 27B is a diagram illustrating program to a dummy cell according to the fifth embodiment.

FIG. 27B is a diagram illustrating program to the dummy cell according to the fifth embodiment. FIG. 27B illustrates a transition method of a Vth state in the dummy cell DC executed at the time of program of the second stage.

(T61) in FIG. 27B illustrates a Vth distribution state in the dummy cell DC in the erased state which is the initial state before program. (T62) in FIG. 27B illustrates a Vth distribution state at a time point when the program of the first stage is completed. (T53) in FIG. 27A illustrates a Vth distribution state at a time point when the program of the second stage is completed. When the second stage is completed, the control unit 22 according to the present embodiment executes program on the dummy cells DC so that the Vth distribution state of a writing destination is equal to or lower than the region C (equal to or lower than Vr4), as illustrated in (T63) in FIG. 27B.

Figure 28:
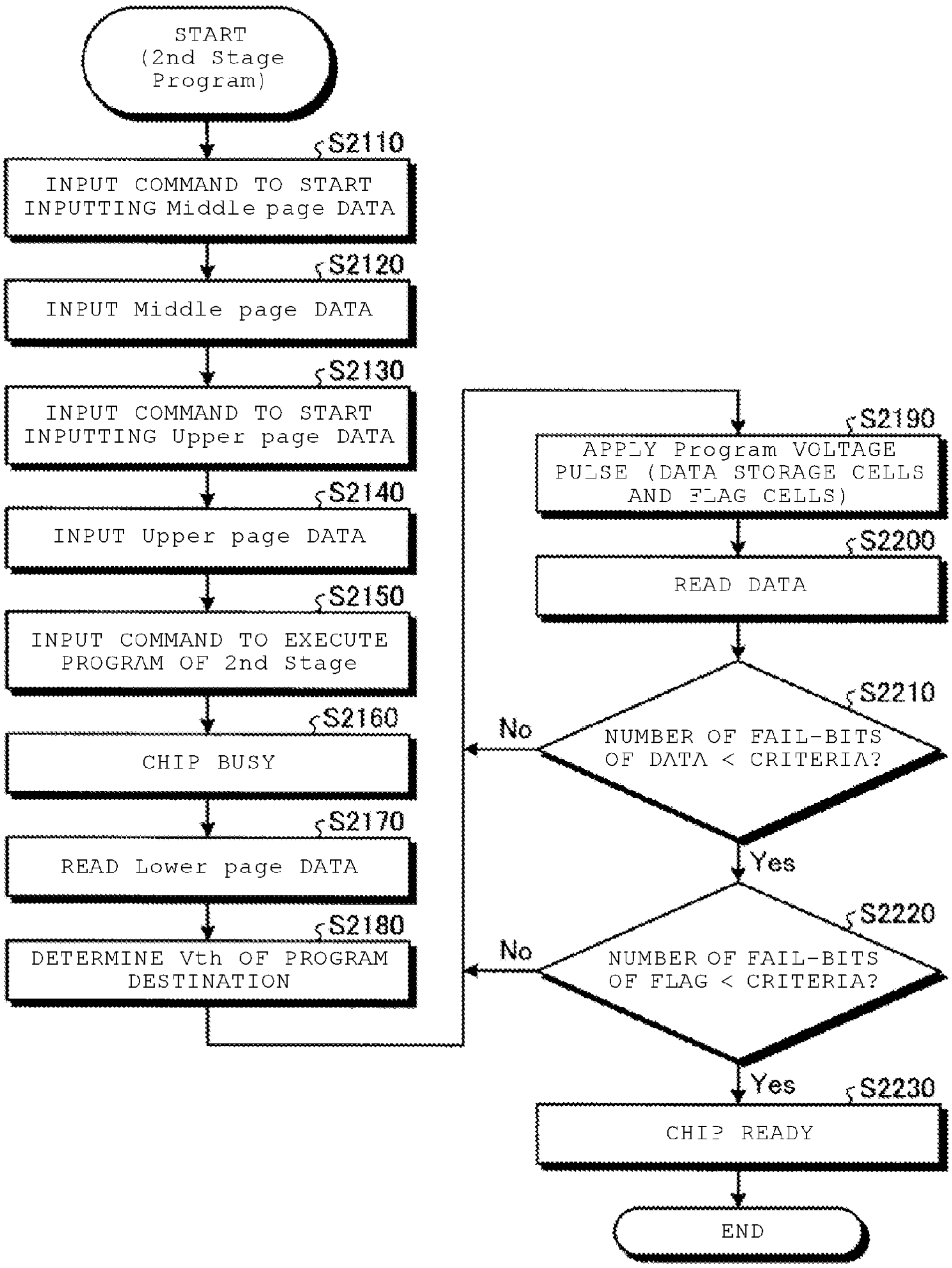
FIG. 28 is a flowchart illustrating a write procedure in a second stage according to the fifth embodiment.

FIG. 28 is a flowchart illustrating a write procedure in the second stage according to the fifth embodiment. The same processes as the processes described in FIG. 9C will not be described. Steps S2110 to S2180 of the second stage according to the fifth embodiment are the same as steps S310 to S380 of the second stage illustrated in FIG. 9C according to the first embodiment.

In the present embodiment, after Vth of program destinations of the middle and upper pages and the flag cells FC is determined (step S2180), writing of the data on the data storage cells (the middle and upper pages) and the flag cells FC is executed using the determined Vth.

In the second stage according to the fifth embodiment, a program voltage pulse is applied once to a plurality of times when the data is written on the middle and upper pages and the flag cells FC (step S2190). Then, to confirm whether the memory cells are moved over the threshold voltage boundary level, reading of the data is executed on the middle and upper pages and the flag cells FC (step S2200).

Further, it is confirmed whether the number of fail-bits of the data in the middle and upper pages is less than the criteria (step S2210). When the number of fail-bits of the data in the middle and upper pages is equal to or greater than the criteria (No in step S2210), the processes of steps S2190 to S2210 are repeated. In this case, the processes of steps S2190 and S2210 on the flag cells FC are not executed.

Further, when the number of fail-bits of the data in the middle and upper pages is less than the criteria (Yes in step S2210), it is confirmed whether the number of fail-bits of the data in the flag cells FC is less than the criteria (step S2220).

When the number of fail-bits of the data in the flag cells FC is equal to or greater than the criteria (No in step S2220), the processes of steps S2190 to S2220 are repeated. In this case, the processes of steps S2190 to S2210 in the middle and upper pages are not executed.

Conversely, when the number of fail-bits of the data in the flag cells FC is less than the criteria (Yes in step S2220), the chip becomes ready (step S2230).

In this way, in step S2190 according to the present embodiment (a step of applying the program voltage pulse), the program voltage pulse is simultaneously applied not only to the data storage cells on which the data is written but also to the flag cells FC. Then, even in subsequent data reading, the data in the data storage cells and the data (the completion information) in the flag cells FC are read to confirm whether the data storage cells and the flag cells FC are programmed.

Thereafter, the data read from the data storage cells and the flag cells FC is compared to the criteria corresponding to an expected value. At this time, the number of failed bits is counted. The data failed in the data storage cells and the data failed in the flag cells FC are separately counted and are each compared to the criteria. When the criteria is not satisfied for either the data failed in the data storage cells or the data failed in the flag cells, the process return to the application order of the program voltage pulse. When the criteria is satisfied for both the data failed in the data storage cells and the data failed in the flag cells, the chip becomes ready and the process ends.

In the page reading according to the first embodiment, the different process procedures are used according to whether the program in regard to the word lines WLi including a reading target page is completed up to the first stage or the second stage. Then, which process procedure is executed is determined based on external read commands. However, in the present embodiment, whether the program is completed up to the first stage or the second stage is determined according to the completion information in the flag cells FC rather than an instruction of a command from the memory controller 1. That is, when a read command is received from the memory controller 1, the control unit 22 first reads the completion information which is data in the flag cells FC. Then, the control unit 22 determines whether the program is completed up to the first stage or the second stage according to whether the flag cells FC are in a state in which writing ends.

In the present embodiment, as described above, a write level on the flag cells FC is assumed to be equal to or higher than the D level. Therefore, reading of the flag cells FC is possible at any read voltage among Vr1, Vr2, Vr3, and Vr4. Accordingly, the control unit 22 can read data from the flag cells FC when the control unit 22 reads the data at the lowest read level of a plurality of read levels necessary in case of completion up to the program of the second stage although a read target page is any of the lower, middle, and upper pages. Then, when the control unit 22 determines that the flag cells FC are in the state in which the writing ends, the control unit 22 determines the program of the second stage to be completed and reads the data at the remaining read levels from the memory cells other than the flag cells FC.

Conversely, when the flag cells FC are determined to be unwritten and the lower page is a read target, the control unit 22 reads the data at Vr1 again. When the middle and upper pages are read targets, the control unit 22 determines subsequent reading not to be necessary and forcibly sets output data as "1".

When the control unit 22 determines whether the flag cells FC are in the state in which the writing ends from the read result (the completion information) of the flag cells FC and the number of flag cells FC is 1, the control unit 22 may determine whether the writing ends for the flag cell FC. The plurality of flag cells FC are installed in some cases to improve reliability of the data of the flag cells FC. In this case, for example, when the completion information indicating that the cells equal to or greater than the number of criteria is written from certain flag cells FC among the plurality of flag cells FC is read, the control unit 22 determines that the flag cells FC are in the state in which the writing ends.

Figure 29:
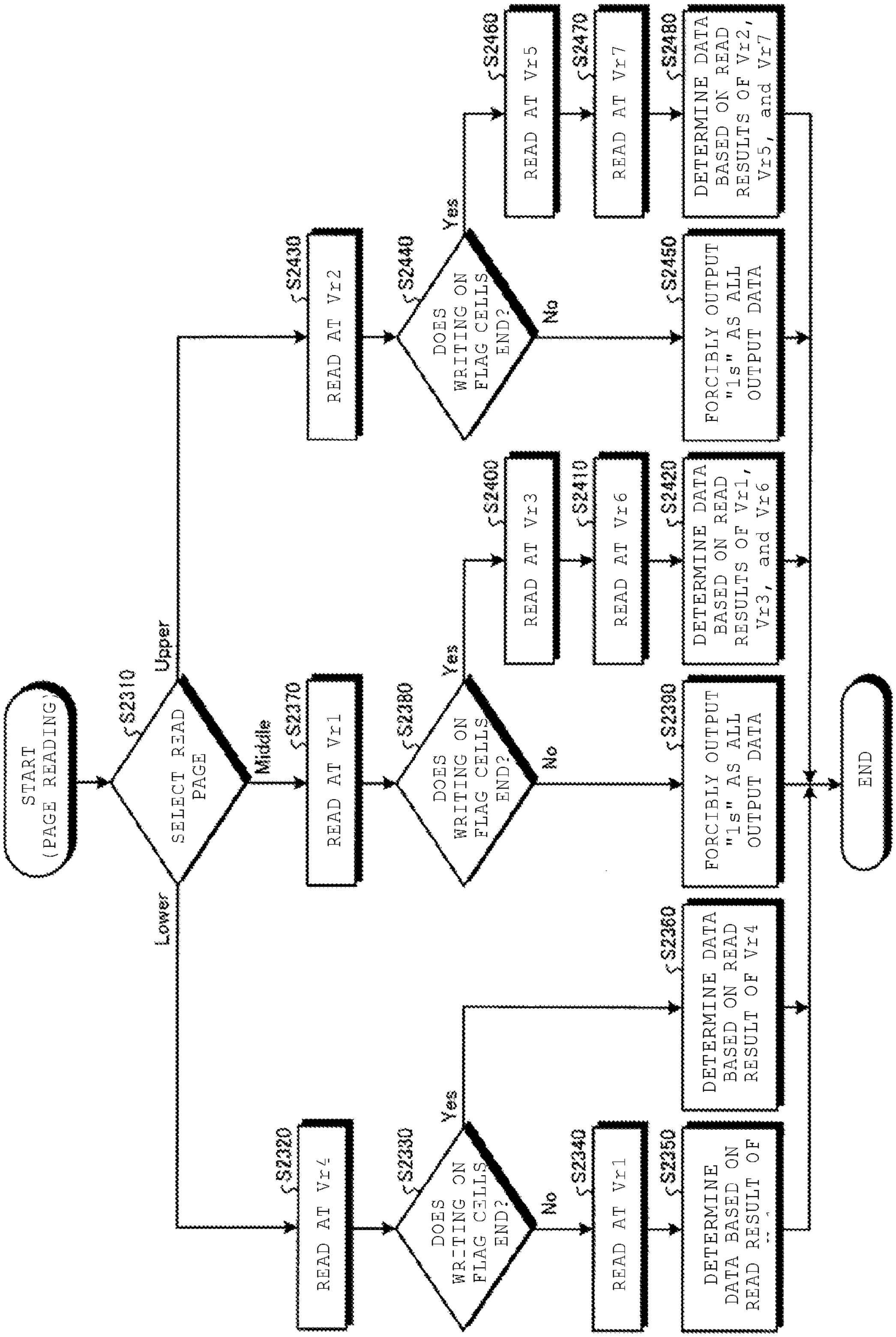
FIG. 29 is a flowchart illustrating a process procedure of page reading according to the fifth embodiment.

Here, a specific process procedure of the page reading will be described. FIG. 29 is a flowchart illustrating the process procedure of the page reading according to the fifth embodiment. The same processes as the processes illustrated in FIG. 12A or 24A among the processes illustrated in FIG. 29 will not be described.

As illustrated in FIG. 29, the control unit 22 selects a read page (S2310). When the read page is the lower page (lower in step S2310), the control unit 22 executes reading at the threshold voltage of Vr4 (step S2320).

Then, the control unit 22 determines whether the completion information is written on the flag cells FC (step S2330). When the completion information is not completely written on the flag cells FC (No in step S2330), the control unit 22 executes reading at the threshold voltage of Vr1 (step S2340). Then, the control unit 22 determines the value of the read data to "0" or "1" based on a read result at the threshold voltage of Vr1 (step S2350).

Conversely, when the completion information is completely written on the flag cells FC (Yes in step S2330), the control unit 22 determines the value of the read data to "0" or "1" based on a read result at the threshold voltage of Vr4 (step S2360).

When the read page is the middle page (middle in step S2310), the control unit 22 executes reading at the threshold voltage of Vr1 (step S2370). Then, the control unit 22 determines whether the completion information is written on the flag cells FC (step S2380). When the completion information is not completely written on the flag cells FC (No in step S2380), the control unit 22 executes control such that "1s" are all forcibly output as output data of the data storage cells (the middle page) (step S2390).

Conversely, when the completion information is completely written on the flag cells FC (Yes in step S2380), the control unit 22 executes reading at the threshold voltages of Vr3 and Vr6 (steps S2400 and S2410). Then, the control unit 22 determines the value of the read data to "0" or "1" based on read results at the threshold voltages of Vr1, Vr3, and Vr6 (step S2420).

When the read page is the upper page (upper in step S2430), the control unit 22 executes reading at the threshold voltage of Vr2 (step S2370). Then, the control unit 22 determines whether the completion information is written on the flag cells FC (step S2440). When the completion information is not completely written on the flag cells FC (No in step S2440), the control unit 22 executes control such that "1s" are all forcibly output as output data of the data storage cells (the upper page) (step S2450).

Conversely, when the completion information is completely written on the flag cells FC (Yes in step S2440), the control unit 22 executes reading at the threshold voltages of Vr5 and Vr7 (steps S2460 and S2470). Then, the control unit 22 determines the value of the read data to "0" or "1" based on read results at the threshold voltages of Vr2, Vr5, and Vr7 (step S2480).

Figure 30:
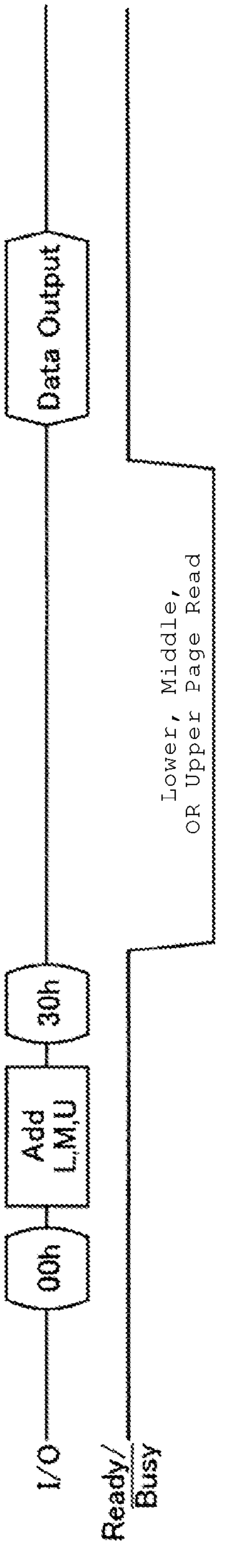
FIG. 30 is a diagram illustrating an example of sequence of an external read command according to the fifth embodiment.

FIG. 30 is a diagram illustrating an example of a sequence of external read commands according to the fifth embodiment. In the present embodiment, only one kind of read command is used. As illustrated in FIG. 30, the read start command (00*h*) is input as a command to execute the read operation, and the address of a read target block page (the address of the lower page, the middle page, or the upper page) is subsequently input. Then, when the read execution command (30*h*) is finally input, the chip becomes busy and a reading operation inside the memory chip starts. By inputting these program commands, the data is read from the lower page, the middle page, or the upper page. Thereafter, the chip enters a ready state and the read data is output.

In this way, in the fifth embodiment, the completion information is stored in the flag cells FC. Therefore, the page data can be read in the same process procedure irrespective of whether the program is completed up to the first stage or the second stage.

Sixth Embodiment

Next, a sixth embodiment will be described with reference to FIGS. 31 to 36. In the sixth embodiment, writing in units of pages at two stages is executed on a nonvolatile memory 2 having a 3-dimensional structure or a 2-dimensional structure, that stores 4 bits/cell (QLC: Quadruple Level Cell).

Figure 31:
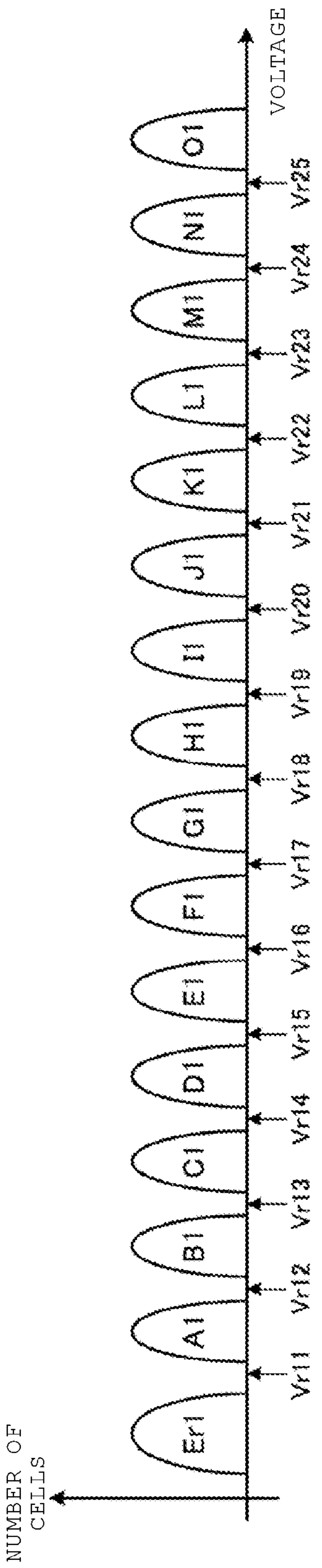
FIG. 31 is a diagram illustrating examples of threshold voltage regions according to a sixth embodiment.

FIG. 31 is a diagram illustrating examples of threshold voltage regions according to a sixth embodiment. FIG. 31 illustrates threshold voltage distribution examples of the nonvolatile memory 2 of 4 bits/cell. In FIG. 31, 16 distributions denoted by Er1, A1, B1, C1, D1, E1, F1, G1, H1, I1, J1, K1, L1, M1, N1, and O1 are threshold voltage distributions in 16 threshold voltage regions. In this way, each memory cell according to the present embodiment is separated by 15 boundaries and has the threshold voltage distributions. The horizontal axis in FIG. 31 represents the threshold voltage and the vertical axis indicates a distribution of the number of memory cells (the number of cells).

In the present embodiment, a region of which a threshold voltage is equal to or lower than Vr11 is referred to as a region Er1, a region of which a threshold voltage is higher than Vr11 and equal to or lower than Vr12 is referred to as a region A1, a region of which a threshold voltage is higher than Vr12 and equal to or lower than Vr13 is referred to as a region B1, and a region of which a threshold voltage is higher than Vr13 and equal to or lower than Vr14 is referred to as a region C1. In the present embodiment, a region of which a threshold voltage is higher than Vr14 and equal to or lower than Vr15 is referred to as a region D1, a region of which a threshold voltage is higher than Vr15 and equal to or lower than Vr16 is referred to as a region E1, a region of which a threshold voltage is higher than Vr16 and equal to or lower than Vr17 is referred to as a region F1, and a region of which a threshold voltage is higher than Vr17 and equal to or lower than Vr18 is referred to as a region G1.

In the present embodiment, a region of which a threshold voltage is lower than Vr18 and equal to or lower than Vr19 is referred to as a region H1, a region of which a threshold voltage is higher than Vr19 and equal to or lower than Vr20 is referred to as a region I1, a region of which a threshold voltage is higher than Vr20 and equal to or lower than Vr21 is referred to as a region J1, and a region of which a threshold voltage is higher than Vr21 and equal to or lower than Vr22 is referred to as a region K1. In the present embodiment, a region of which a threshold voltage is higher than Vr22 and equal to or lower than Vr23 is referred to as a region L1, a region of which a threshold voltage is higher than Vr23 and equal to or lower than Vr24 is referred to as a region M1, a region of which a threshold voltage is higher than Vr24 and equal to or lower than Vr25 is referred to as a region N1, and a region of which a threshold voltage is higher than Vr25 is referred to as a region O1.

The threshold voltage distributions corresponding to the regions Er1, A1, B1, C1, D1, E1, F1, G1, H1, I1, J1, K1, L1, M1, N1, and O1 are referred to as distributions Er1, A1, B1, C1, D1, E1, F1, G1, H1, I1, J1, K1, L1, M1, N1, and O1 (first to sixteen distributions). Vr11 to Vr25 are threshold voltages at the boundaries of the regions.

Figure 32:
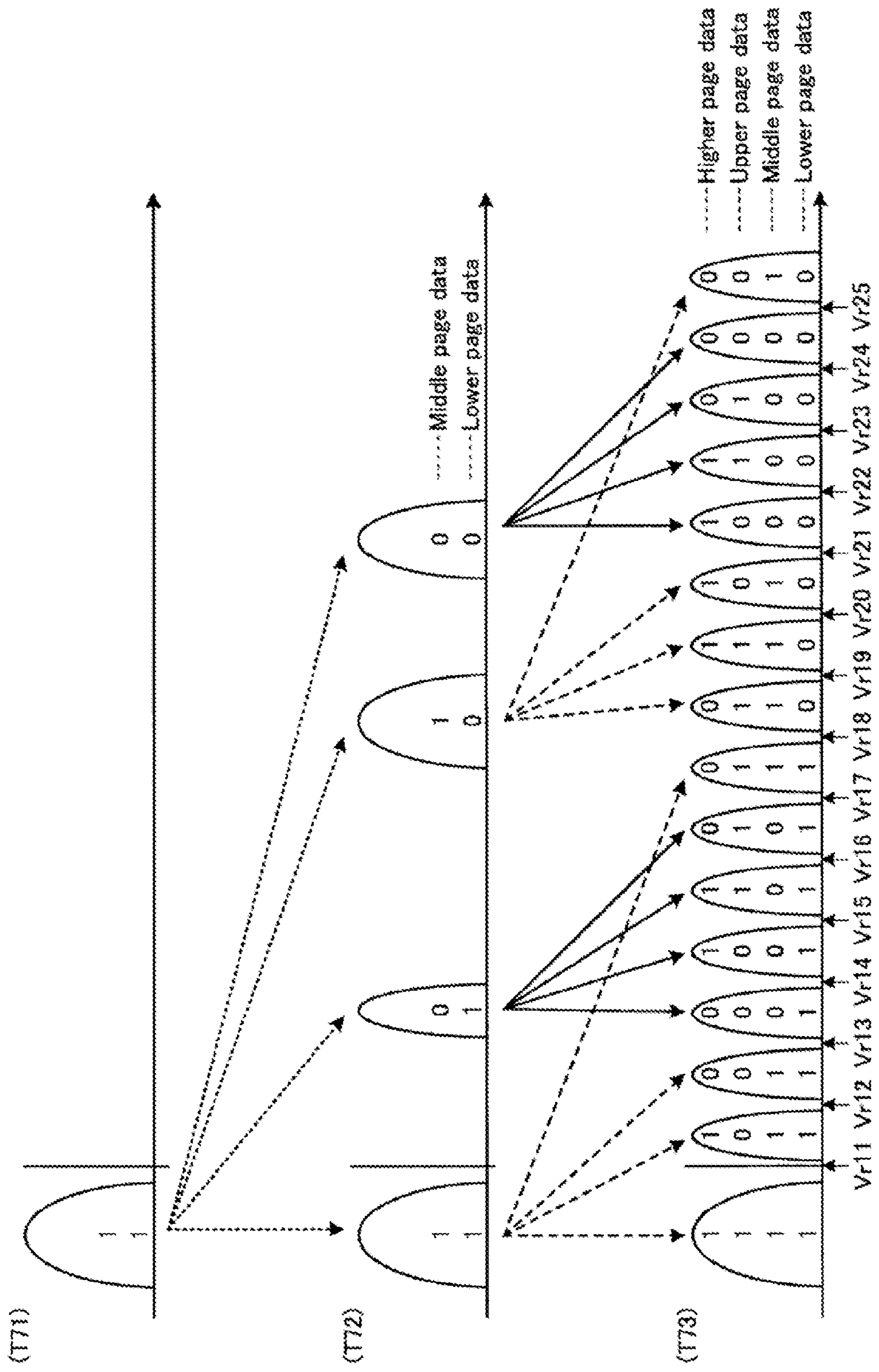
FIG. 32 is a diagram illustrating a first example indicating threshold voltage distributions after program according to the sixth embodiment.
Figure 34:
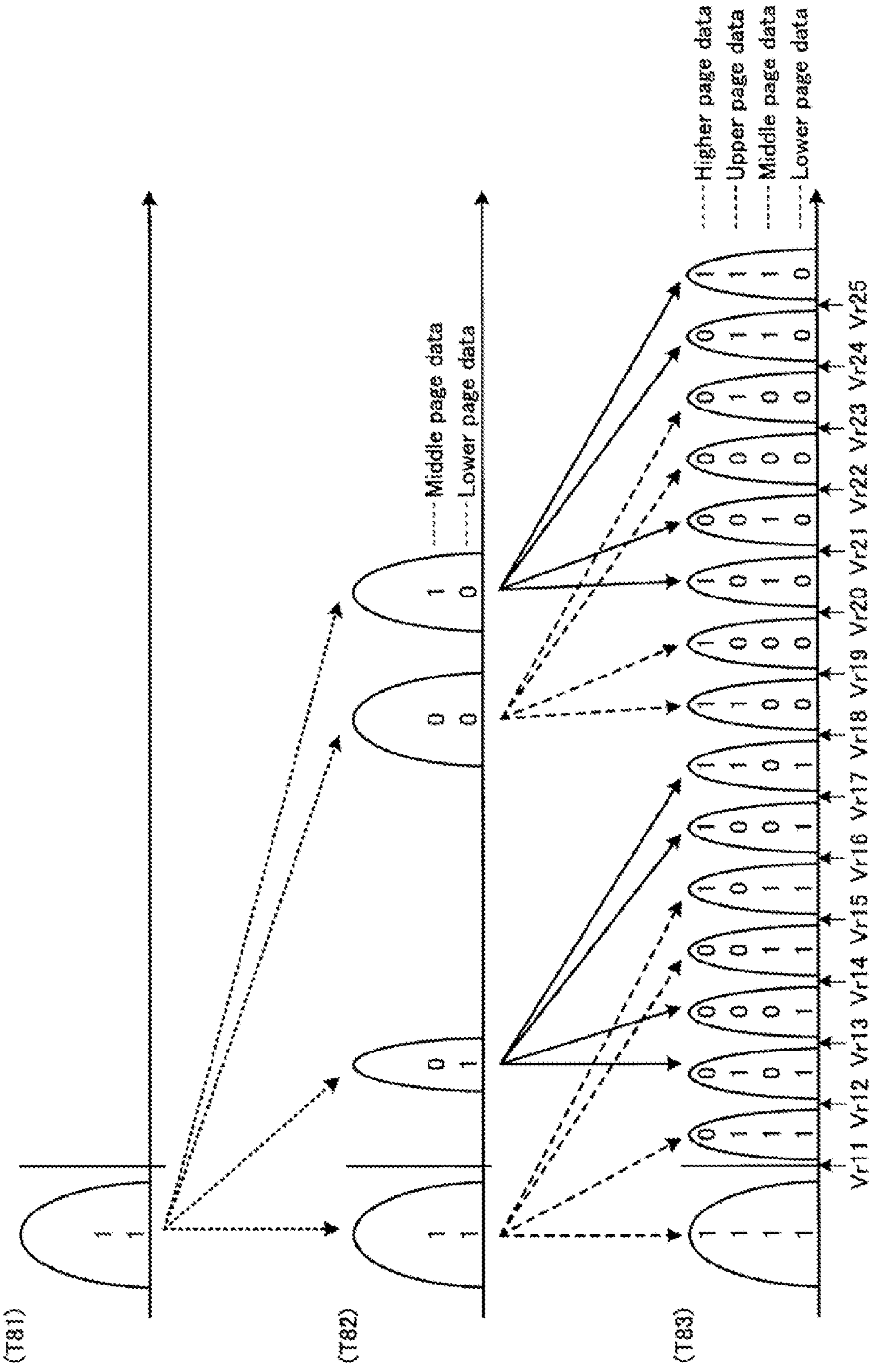
FIG. 34 is a diagram illustrating a second example indicating threshold voltage distributions after program according to the sixth embodiment.
Figure 36:
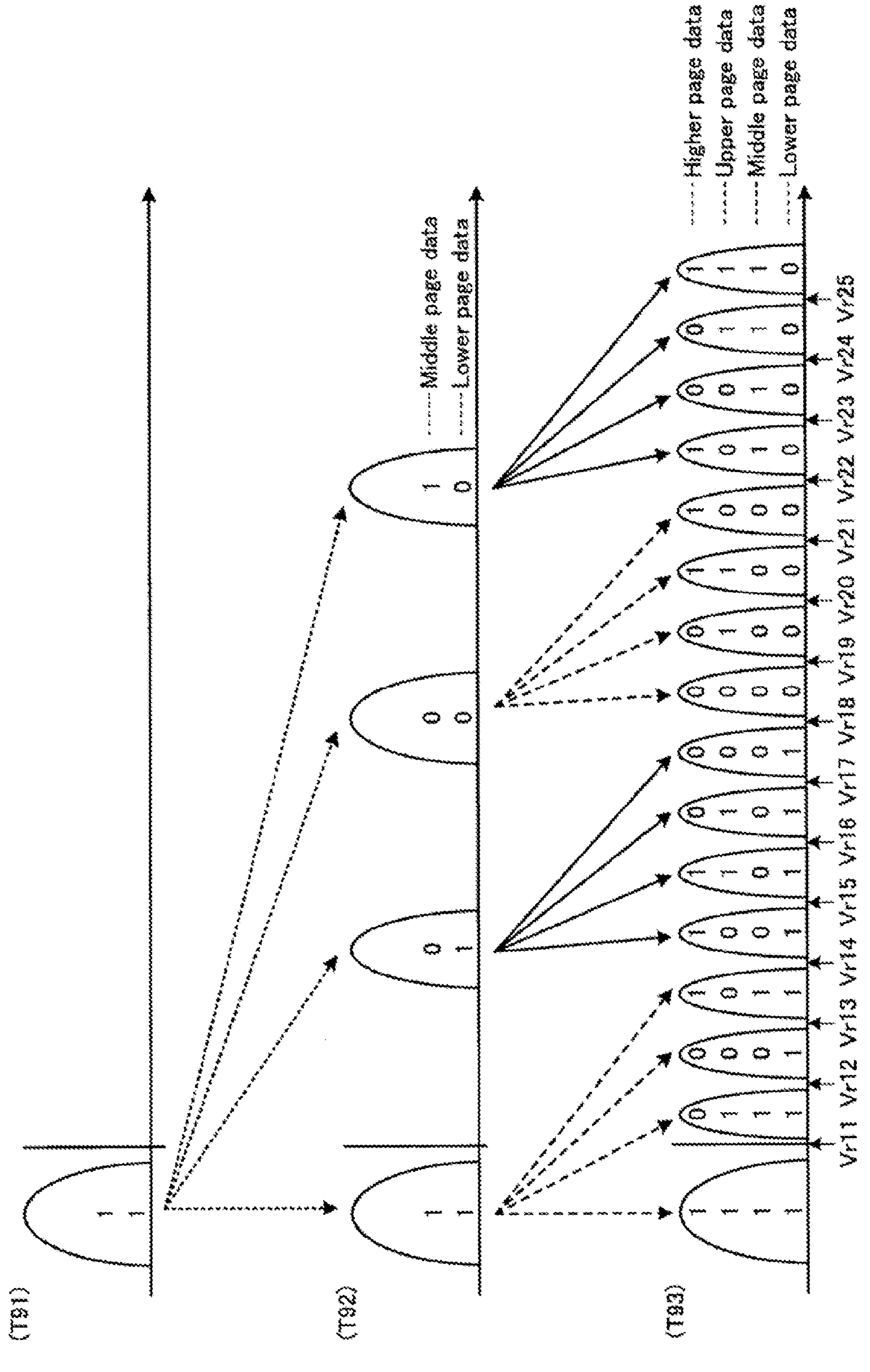
FIG. 36 is a diagram illustrating a third example indicating threshold voltage distributions after program according to the sixth embodiment.

FIGS. 32, 34, and 36 to be described below illustrate threshold voltage distributions after each program stage on the memory cells of 4 bits/cell. The threshold voltage distributions illustrated in FIG. 32 and the data coding illustrated in FIG. 33 correspond to 1-4-5-5 coding. In the 1-4-5-5 coding, the numbers of boundaries for determining bit values are respectively 1, 4, 5, and 5 in the lower, middle, upper, and higher pages.

FIG. 32 is a diagram illustrating a first example of threshold voltage distributions after program according to the sixth embodiment. (T71) in FIG. 32 illustrates threshold voltage distributions in the erased state which is the initial state before program. (T72) in FIG. 32 illustrates threshold voltage distributions after the program of the first stage. (T73) in FIG. 32 illustrates threshold voltage distributions after the program of the second stage.

As illustrated in (T71) in FIG. 32, for all the memory cells of the NAND memory cell array 23, an unwritten state is a distribution Er state. As illustrated in (T72) in FIG. 32, the control unit 22 of the nonvolatile memory 2 remains in the distribution Er in each memory cell or injects charges and moves the memory cells to a distribution higher than the distribution Er according to a bit value written on the lower and middle pages in the program of the first stage. Thus, the memory cells are programmed at 4-value levels in accordance with the lower page data and the middle page data.

As illustrated in (T73) in FIG. 32, for the program of the second stage, two pages of the upper and higher pages are necessary at the time of writing the data. The control unit 22 of the nonvolatile memory 2 executes program so that the threshold voltage distributions after the program of the second stage become 16-value levels in a final state in which the adjacent distributions are separated. In this case, reading of all the page data is possible.

FIG. 33 is a diagram illustrating data coding corresponding to the threshold voltage distributions illustrated in FIG. 32. In the data coding illustrated in FIG. 33, for example, the memory cells in which the threshold voltage is in the Er1 region are in a state in which "1111" are stored as data values of bits corresponding to the upper, middle, lower, and higher pages. The memory cells in which the threshold voltage is in the A1 region are in a state in which "1011" are stored.

The threshold voltage distributions illustrated in FIG. 34 and the data coding illustrated in FIG. 35 correspond to 1-6-4-4 coding. In the 1-6-4-4 coding, the numbers of boundaries for determining bit values are respectively 1, 6, 4, and 4 in the lower, middle, upper, and higher pages.

FIG. 34 is a diagram illustrating a second example indicating threshold voltage distributions after program according to the sixth embodiment. (T81) in FIG. 34 illustrates threshold voltage distributions in the erased state which is the initial state before program. (T82) in FIG. 34 illustrates threshold voltage distributions after the program of the first stage. (T83) in FIG. 34 illustrates threshold voltage distributions after the program of the second stage.

As illustrated in (T81) in FIG. 34, for all the memory cells of the NAND memory cell array 23, an unwritten state is a distribution Er state. As illustrated in (T82) in FIG. 34, the control unit 22 of the nonvolatile memory 2 remains in the distribution Er in each memory cell or injects charges and moves the memory cells to a distribution higher than the distribution Er according to a bit value written on the lower and middle pages in the program of the first stage. Thus, the memory cells are programmed at 4-value levels in accordance with the lower page data and the middle page data.

As illustrated in (T83) in FIG. 34, for the program of the second stage, two pages of the upper and higher pages are necessary at the time of writing the data. The control unit 22 of the nonvolatile memory 2 executes program so that the threshold voltage distributions after the program of the second stage become 16-value levels in a final state in which the adjacent distributions are separated. In this case, reading of all the page data is possible.

FIG. 35 is a diagram illustrating data coding corresponding to the threshold voltage distributions illustrated in FIG. 34. In the data coding illustrated in FIG. 35, for example, the memory cells in which the threshold voltage is in the Er1 region are in a state in which "1111" are stored as data values of bits corresponding to the upper, middle, lower, and higher pages. The memory cells in which the threshold voltage is in the A1 region are in a state in which "0111" are stored.

The threshold voltage distributions illustrated in FIG. 36 and the data coding illustrated in FIG. 37 correspond to 1-2-6-6 coding. In the 1-2-6-6 coding, the numbers of boundaries for determining bit values are respectively 1, 2, 6, and 6 in the lower, middle, upper, and higher pages.

FIG. 36 is a diagram illustrating a third example indicating threshold voltage distributions after program according to the sixth embodiment. (T91) in FIG. 36 illustrates threshold voltage distributions in the erased state which is the initial state before program. (T92) in FIG. 36 illustrates threshold voltage distributions after the program of the first stage. (T93) in FIG. 36 illustrates threshold voltage distributions after the program of the second stage.

As illustrated in (T91) in FIG. 36, for all the memory cells of the NAND memory cell array 23, an unwritten state is a distribution Er state. As illustrated in (T92) in FIG. 36, the control unit 22 of the nonvolatile memory 2 remains in the distribution Er in each memory cell or injects charges and moves the memory cells to a distribution higher than the distribution Er according to a bit value written on the lower and middle pages in the program of the first stage. Thus, the memory cells are programmed at 4-value levels in accordance with the lower page data and the middle page data.

As illustrated in (T93) in FIG. 36, for the program of the second stage, two pages of the upper and higher pages are necessary at the time of writing the data. The control unit 22 of the nonvolatile memory 2 executes program so that the threshold voltage distributions after the program of the second stage become 16-value levels in a final state in which the adjacent distributions are separated. In this case, reading of all the page data is possible.

FIG. 37 is a diagram illustrating data coding corresponding to the threshold voltage distributions illustrated in FIG. 35. In the data coding illustrated in FIG. 37, for example, the memory cells in which the threshold voltage is in the Er1 region are in a state in which "1111" are stored as data values of bits corresponding to the upper, middle, lower, and higher pages. The memory cells in which the threshold voltage is in the B1 region are in a state in which "0011" are stored.

In the present embodiment, program is executed and each piece of page data is read through the same processes as those of the first to fifth embodiments.

In this way, in the sixth embodiment, writing in units of pages at 2 stages is executed in the nonvolatile memory 2 of 4 bits/cell having the 3-dimensional structure or the 2-dimensional structure. Therefore, it is possible to obtain the same advantages as those of the first to fifth embodiments.

The first to sixth embodiments may be combined. For example, at least one of the second to fourth embodiments may be combined with the fourth or fifth embodiment.

In the first to sixth embodiments described above, although the nonvolatile memory 2 is configured using the NAND memory, another type of memory may be used. In the first to fifth embodiments described above, although the nonvolatile memory 2 in which the 1-3-3 coding is applied, the coding applied in the nonvolatile memory 2 is not limited to the 1-3-3 coding. For example, 1-2-4 coding or 2-3-2 coding may be applied in the nonvolatile memory 2.

The read levels (vr1 and Vr4) before the writing of the second stage and after the writing of the second stage described with reference to FIGS. 7, 12, 17, 19, and 29 may be slightly different from read levels (Vr1 and Vr4) after the writing of the second stage (T3). The read levels (Vr1, Vr3, Vr5, and Vr7) before the writing of the second stage and after the writing of the second stage described with reference to FIGS. 21 and 24 may be slightly different from the read levels (Vr1, Vr3, Vr5, and Vr7) after the writing of the second stage (T3).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:

a memory cell array including first memory cells and second memory cells;

a plurality of bit lines, each of which is connected to one of the first memory cells and one of the second memory cells;

a first word line connected to gates of the first memory cells;

a second word line connected to gates of the second memory cells; and a control unit configured to perform an operation to write first, second, and third pages of data in the first memory cells in first and second stages, wherein during the first stage, the control unit applies voltages to the first word line and the bit lines based on the first page of data to maintain threshold voltages for a first group of the first memory cells and shift the threshold voltages for a second group of the first memory cells above a first threshold, and during the second stage, the control unit applies voltages to the first word line and the bit lines based on the second and third pages of data so as to shift the threshold voltages of the first memory cells in the first group to threshold voltages that are in one of first, second, and third threshold voltage ranges and the threshold voltages of the first memory cells in the second group to threshold voltages that are in one of fourth, fifth, sixth, and seventh threshold voltage ranges.

2. The device of claim 1, wherein the first through seventh threshold voltage ranges each span voltages that are greater than a first voltage, and the second through seventh threshold voltage ranges each span voltages that are greater than voltages in a preceding range.

3. The device of claim 2, wherein when reading out data from the first page, the control unit reads out the data using a fourth voltage, the fourth voltage being a boundary voltage between the third threshold voltage range and the fourth threshold voltage range, and determines data of the first page on the basis of the read out data, when reading out data from the second page, the control unit reads out the data using the first voltage, a third voltage and a sixth voltage, the third voltage being a boundary voltage between the second threshold voltage range and the third threshold voltage range, the sixth voltage being a boundary voltage between the fifth threshold voltage range and the sixth threshold voltage range, and determines data of the second page on the basis of the read out data, and when reading out data from the third page, the control unit reads out the data using a second voltage, a fifth voltage and a seventh voltage, the second read voltage being a boundary voltage between the second threshold voltage range and the third threshold voltage range, the fifth voltage being a boundary voltage between the fifth threshold voltage range and the sixth threshold voltage range, the seventh voltage being a boundary voltage between the seventh threshold voltage range and the eighth threshold voltage range, and determines data of the third page on the basis of the read out data.

4. The device of claim 2, wherein the first threshold is equal to the first voltage.

5. The device of claim 2, wherein during the second stage, the control unit applies voltages to the first word line and the bit lines based on the second and third pages of data so as to shift the threshold voltages of the first memory cells in the second group prior to the threshold voltages of the first memory cells in the first group.

6. The device of claim 2, wherein during the first stage, the control unit further applies voltages to the first word line and the bit lines so as to shift the threshold voltages of the first memory cells in the second group above a second threshold that is between the third and fourth threshold voltage ranges.

7. The device of claim 1, wherein the control unit is configured to perform an operation to write fourth, fifth, and sixth pages of data in the second memory cells in third and fourth stages, wherein during the third stage, the control unit applies voltages to the second word line and the bit lines based on the fourth page of data to maintain threshold voltages for a third group of the second memory cells and shift the threshold voltages for a fourth group of the second memory cells above the first threshold, and during the fourth stage, the control unit applies voltages to the second word line and the bit lines based on the fifth and sixth pages of data so as to shift the threshold voltages of the second memory cells in the third group to threshold voltages that are in one of the first, second, and third threshold voltage ranges and the threshold voltages of the second memory cells in the fourth group to threshold voltages that are in one of the fourth, fifth, sixth, and seventh threshold voltage ranges.

8. The device of claim 7, wherein the control unit is configured to perform the first stage and then the third stage prior to the second stage, and the first and second word lines are adjacent word lines.

9. A nonvolatile memory device comprising:

a memory cell array including first memory cells and second memory cells;

a plurality of bit lines, each of which is connected to one of the first memory cells and one of the second memory cells;

a first word line connected to gates of the first memory cells;

a second word line connected to gates of the second memory cells; and a control unit configured to perform an operation to write first, second, and third pages of data in the first memory cells in first and second stages, wherein during the first stage, the control unit applies voltages to the first word line and the bit lines based on the first and second pages of data to maintain threshold voltages for a first group of the first memory cells, shift the threshold voltages for a second group of the first memory cells above a first threshold that is larger than the threshold voltages of the memory cells in the first group, shift the threshold voltages for a third group of the first memory cells above a second threshold that is larger than the threshold voltages of the memory cells in the second group, and shift the threshold voltages for a fourth group of the first memory cells above a third threshold that is larger than the threshold voltages of the memory cells in the third group, and during the second stage, the control unit applies voltages to the first word line and the bit lines based on the third page of data so as to either maintain the threshold voltages of the first memory cells in the first group or shift the threshold voltages of the first memory cells in the first group to threshold voltages that are in a first threshold voltage range, to shift the threshold voltages of the first memory cells in the second group to threshold voltages that are in one of second and third threshold voltage ranges, to shift the threshold voltages of the first memory cells in the third group to threshold voltages that are in one of fourth and fifth threshold voltage ranges, and to shift the threshold voltages of the first memory cells in the fourth group to threshold voltages that are in one of sixth and seventh threshold voltage ranges.

10. The device of claim 9, wherein the first through third threshold voltage ranges each span voltages that are less than voltages spanned by each of the fourth through seventh threshold voltage ranges.

11. The device of claim 10, wherein the second threshold voltage range spans voltages which are less than the voltages spanned by the third threshold voltage range, which are less than the voltages spanned by the first threshold voltage range, which are less than the voltages spanned by the fourth threshold voltage range, which are less than the voltages spanned by the fifth threshold voltage range, which are less than the voltages spanned by the sixth threshold voltage range, which are less than the voltages spanned by the seventh threshold voltage range.

12. The device of claim 9, wherein the control unit is configured to perform an operation to write fourth, fifth, and sixth pages of data in the second memory cells in third and fourth stages, wherein during the third stage, the control unit applies voltages to the second word line and the bit lines based on the fourth and fifth pages of data to maintain threshold voltages for a fifth group of the second memory cells, shift the threshold voltages for a sixth group of the second memory cells above the first threshold, shift the threshold voltages for a seventh group of the second memory cells above the second threshold, and shift the threshold voltages for an eighth group of the second memory cells above the third threshold, and during the fourth stage, the control unit applies voltages to the second word line and the bit lines based on the third page of data so as to either maintain the threshold voltages of the second memory cells in the fifth group or shift the threshold voltages of the second memory cells in the fifth group to threshold voltages that are in the first threshold voltage range, to shift the threshold voltages of the second memory cells in the sixth group to threshold voltages that are in one of the second and third threshold voltage ranges, to shift the threshold voltages of the second memory cells in the seventh group to threshold voltages that are in one of the fourth and fifth threshold voltage ranges, and to shift the threshold voltages of the second memory cells in the eighth group to threshold voltages that are in one of the sixth and seventh threshold voltage ranges.

13. The device of claim 12, wherein the control unit is configured to perform the first stage and then the third stage prior to the second stage.

14. The device of claim 13, wherein the first and second word lines are adjacent word lines.

15. A method of performing an operation to write first, second, and third pages of data in first memory cells of a nonvolatile memory device in first and second stages and to write fourth, fifth, and sixth pages of data in second memory cells of the nonvolatile memory device in third and fourth stages, wherein the nonvolatile memory device includes a memory cell array including the first and second memory cells, a plurality of bit lines, each of which is connected to one of the first memory cells and one of the second memory cells, a first word line connected to gates of the first memory cells, and a second word line connected to gates of the second memory cells, said method comprising:

during the first stage, applying voltages to the first word line and the bit lines based on at least the first page of data;

during the second stage, applying voltages to the first word line and the bit lines based on at least the third page of data;

during the third stage, applying voltages to the second word line and the bit lines based on at least the fourth page of data; and during the second stage, applying voltages to the second word line and the bit lines based on at least the sixth page of data, wherein the first stage is carried out prior to the third stage, and the third stage is carried out prior to the second stage.

16. The method of claim 15, wherein during the first stage, the voltages are applied to the first word line and the bit lines based on the first and second pages of data, and during the third stage, the voltages are applied to the second word line and the bit lines based on the fourth and fifth pages of data.

17. The method of claim 15, wherein during the second stage, the voltages are applied to the first word line and the bit lines based on the second and third pages of data, and during the fourth stage, the voltages are applied to the second word line and the bit lines based on the fifth and sixth pages of data.

18. The method of claim 15, wherein during the first stage, the threshold voltages of the first memory cells are either maintained or shifted into a first threshold voltage range, and during the third stage, the threshold voltages of the second memory cells are either maintained or shifted into the first threshold voltage range.

19. The method of claim 18, wherein during the first stage, the threshold voltages of the first memory cells that are shifted into the first threshold voltage range are first shifted to be higher than a first threshold and then shifted to be higher than a second threshold that is greater than the first threshold, and during the third stage, the threshold voltages of the second memory cells that are shifted into the first threshold voltage range are first shifted to be higher than the first threshold and then shifted to be higher than the second threshold.

20. The method of claim 15, wherein during the first stage, the threshold voltages of the first memory cells are either maintained or shifted into one of first, second, and third threshold voltage ranges, and during the third stage, the threshold voltages of the second memory cells are either maintained or shifted into one of the first, second, and third threshold voltage ranges.

* * * * *